(12) United States Patent
Baek et al.

(10) Patent No.: US 8,889,543 B2
(45) Date of Patent: Nov. 18, 2014

(54) METHOD OF FABRICATING SEMICONDUCTOR DEVICE

(71) Applicants: Jong-Min Baek, Suwon-si (KR); In-Sun Park, Seoul (KR); Jong-Myeong Lee, Seongnam-si (KR); Jong-Won Hong, Hwaseong-si (KR); Hei-Seung Kim, Suwon-si (KR); Jung-Soo Yoon, Hwaseong-si (KR)

(72) Inventors: Jong-Min Baek, Suwon-si (KR); In-Sun Park, Seoul (KR); Jong-Myeong Lee, Seongnam-si (KR); Jong-Won Hong, Hwaseong-si (KR); Hei-Seung Kim, Suwon-si (KR); Jung-Soo Yoon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 13/795,807

(22) Filed: Mar. 12, 2013

(65) Prior Publication Data

US 2013/0267088 A1 Oct. 10, 2013

(30) Foreign Application Priority Data

Apr. 9, 2012 (KR) .................... 10-2012-0036902

(51) Int. Cl.
*H01L 21/4763* (2006.01)
*H01L 21/768* (2006.01)

(52) U.S. Cl.
CPC ................................ *H01L 21/76802* (2013.01)
USPC ........... 438/625; 438/637; 438/670; 438/672; 257/E21.587

(58) Field of Classification Search
CPC .. H01L 21/798; H01L 21/0337; H01L 23/481
USPC ................. 438/625–625, 631–634, 637–640, 438/669–672; 257/E21.587
See application file for complete search history.

(56) References Cited

U.S. PATENT DOCUMENTS

| 5,801,099 | A | 9/1998 | Kim et al. |
|---|---|---|---|
| 6,174,804 | B1 | 1/2001 | Hsu |
| 6,743,683 | B2 | 6/2004 | Barns et al. |
| 7,144,816 | B2 | 12/2006 | Barns et al. |
| 7,208,361 | B2 | 4/2007 | Shah et al. |
| 7,320,915 | B2 | 1/2008 | Lee |
| 2002/0132476 | A1* | 9/2002 | Farrar .......................... 438/670 |
| 2008/0176374 | A1 | 7/2008 | Jon et al. |

FOREIGN PATENT DOCUMENTS

| JP | 09-283523 | 10/1997 |
|---|---|---|
| JP | 2006-190938 | 7/2006 |
| KR | 100179292 | 4/1999 |
| KR | 10-0673206 | 1/2007 |
| KR | 10-0854971 | 8/2008 |
| KR | 1020100007193 A | 1/2010 |

* cited by examiner

*Primary Examiner* — Thanhha Pham
(74) *Attorney, Agent, or Firm* — Volentine & Whitt, PLLC

(57) ABSTRACT

A method of fabricating a semiconductor device includes forming switching devices on a substrate. A lower structure is formed in the substrate having the switching devices. A lower conductive layer is formed on the lower structure. Sacrificial mask patterns are formed on the lower conductive layer. Lower conductive patterns are formed by etching the lower conductive layer using the sacrificial mask patterns as an etch mask. An interlayer insulating layer is formed on the substrate having the lower conductive patterns. Interlayer insulating patterns are formed by planarizing the interlayer insulating layer until the sacrificial mask patterns are exposed. Openings exposing the lower conductive patterns are formed by removing the exposed sacrificial mask patterns. Upper conductive patterns self-aligned with the lower conductive patterns are formed in the openings.

20 Claims, 60 Drawing Sheets

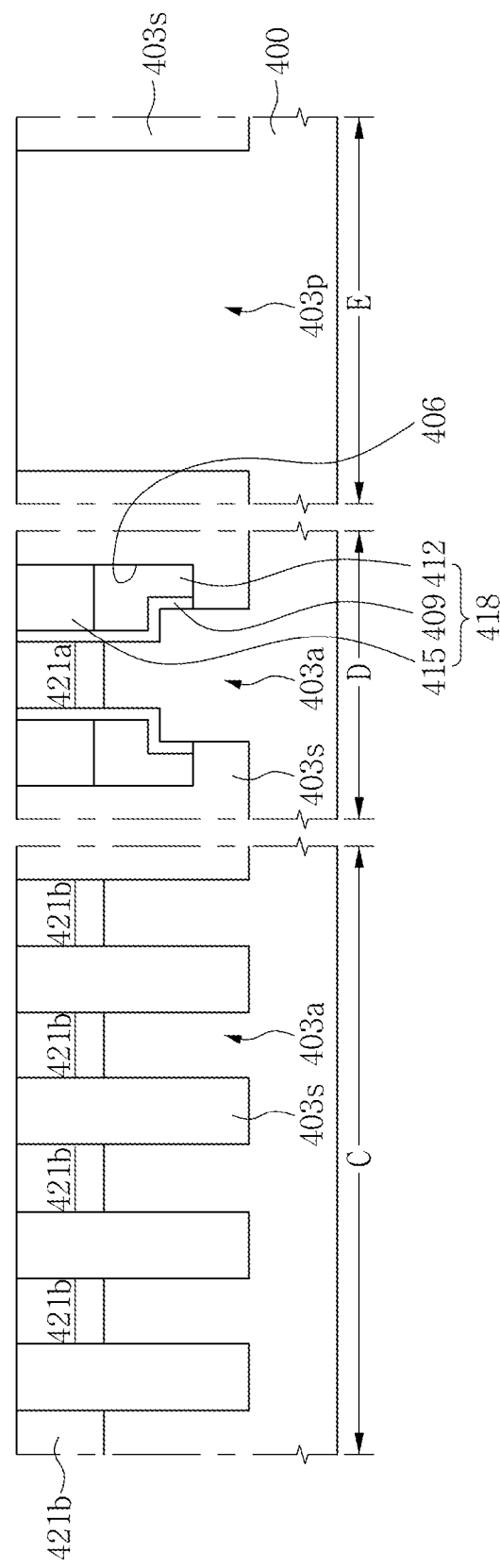

METHOD OF FABRICATING SEMICONDUCTOR DEVICE

PRIORITY STATEMENT

This application claims priority under 35 U.S.C. §119 to Korean Patent Application No. 10-2012-0036902 filed on Apr. 9, 2012, the disclosure of which is hereby incorporated by reference in its entirety.

BACKGROUND

1. Field

The inventive concept relates to an interconnection structure, a semiconductor device having an interconnection structure, methods of fabricating the same, and electronic apparatus and systems comprising the same.

2. Description of Related Art

Semiconductor devices include various types of interconnections such as bit lines (B/L) and word lines (W/L). In order to develop a highly integrated semiconductor device, various methods have been studied to reduce the critical dimensions of the interconnections of the semiconductor device. One of these critical dimensions is the line width of line type of interconnections such as the above-mentioned bit lines (B/L) and word lines (W/L). As the line widths are scaled down, the aspect ratio (A/R) of the interconnections (namely, the ratio of the height to line width of the interconnections) becomes greater, which makes it more difficult to reliably form the interconnections.

SUMMARY

According to one aspect of the inventive concept, there is provided a method of fabricating a semiconductor device that includes forming switching devices on a substrate, forming a lower structure on the substrate having the switching devices, forming a lower conductive layer on the lower structure, forming sacrificial mask patterns on the lower conductive layer, forming lower conductive patterns by etching the lower conductive layer using the sacrificial mask patterns as an etch mask, forming an interlayer insulating layer on the substrate having the lower conductive patterns, forming interlayer insulating patterns by planarizing the interlayer insulating layer until the sacrificial mask patterns are exposed, forming openings exposing the lower conductive patterns by removing the exposed sacrificial mask patterns, and forming upper conductive patterns self-aligned with the lower conductive patterns in the openings.

According to another aspect of the inventive concept, there is provided a method of fabricating a semiconductor device that includes forming a lower insulating layer on a substrate, forming a lower conductive structure layer form on the lower insulating layer, forming sacrificial mask patterns on the lower conductive structure and which have a thickness greater than the thickness of the lower conductive structure, forming lower conductive patterns by etching the lower conductive structure using the sacrificial mask patterns as an etch mask, forming an interlayer insulating layer on the substrate having the lower conductive patterns, forming interlayer insulating patterns by planarizing the interlayer insulating layer to such an extent that upper parts of the sacrificial mask patterns are exposed, forming openings by removing the exposed sacrificial mask patterns, and forming upper conductive patterns in the openings such that the upper conductive patterns are formed as stacked on the lower conductive patterns, respectively, and each of the lower conductive patterns and the upper conductive pattern stacked thereon constitute a respective interconnection structure, and in which the interconnection structures are formed to have a thickness greater than the distance between adjacent ones of the interconnection structures.

According to yet another aspect of the inventive concept, there is provided a method of fabricating a semiconductor device that includes forming a lower conductive structure of at least one layer of material on a substrate, forming a sacrificial layer on the lower conductive structure and patterning the sacrificial layer to form lines of sacrificial mask patterns on the lower structure, dry etching the at least one layer of material using the sacrificial mask patterns as an etch mask to form lower conductive line-shaped patterns, forming an interlayer insulating layer on the substrate having the lower conductive patterns, planarizing the interlayer insulating layer to such an extent that upper parts of the sacrificial mask patterns are exposed and thereby forming line-shaped interlayer insulating patterns from the interlayer insulating layer, and forming upper conductive patterns as stacked on the lower conductive patterns, respectively, using a damascene process that comprises forming line-shaped openings by removing the exposed sacrificial mask patterns and forming conductive material in the openings such that each of the lower conductive patterns and the upper conductive pattern stacked thereon constitute a respective line-shaped interconnection structure, and in which the upper conductive patterns are formed to have a resistivity lower than that of the lower conductive patterns.

BRIEF DESCRIPTION OF THE DRAWINGS

The foregoing and other features and advantages of the inventive concept will be more apparent from the particular description of preferred embodiments of the inventive concept, as illustrated in the accompanying drawings in which like reference characters designate like parts throughout the different views. The drawings are not necessarily to scale, emphasis instead being placed upon illustrating the principles of the inventive concept. In the drawings:

FIGS. 27A to 27K are cross-sectional views showing a third embodiment of a method of fabricating a semiconductor device in accordance with the inventive concept;

DETAILED DESCRIPTION OF THE PREFERRED EMBODIMENTS

Figure 1:
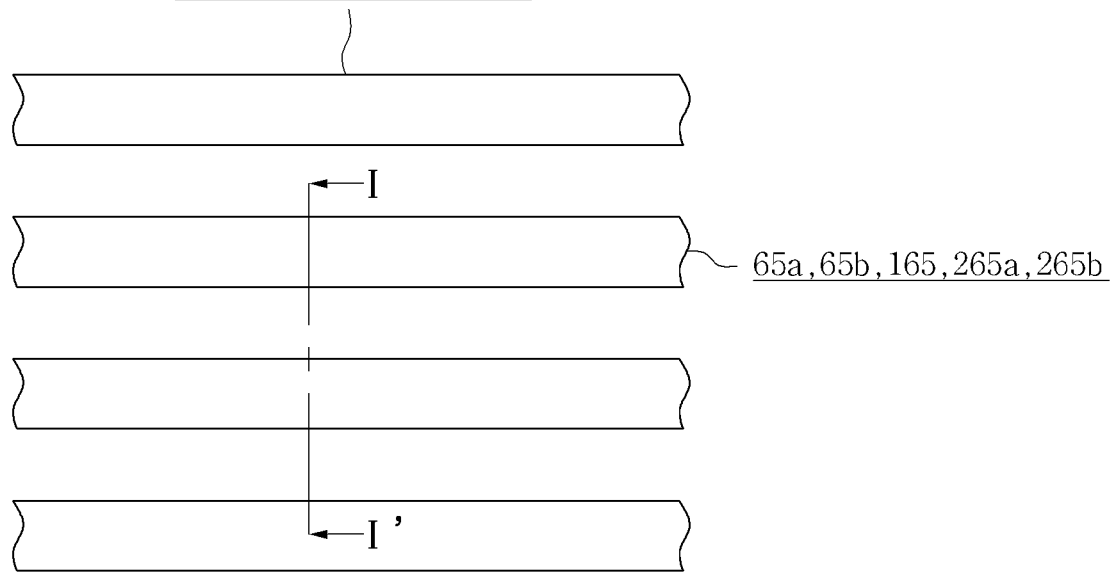
FIG. 1 is a plan view of the layout of a first embodiment of a semiconductor device, that may be exemplified in various ways, in accordance with the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. The drawings can be relied upon, however, to show specific dispositions and connections of elements. Also, the "connections" generally refer to electrical connections given the context of the inventive concept.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, terms such as "upper" or "bottom" as used to describe a surface generally refer not only to the orientation depicted in the drawings but to the fact that the surface is the uppermost or bottommost surface in the orientation depicted, as would be clear from the drawings and context of the written description.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. "Vertical" generally will refer to a direction perpendicular to the plane of the substrate, whereas "horizontal" will generally refer to a direction parallel to the plane of the substrate. The term "width" will generally refer to the shorter of two possible dimensions of an element in the horizontal direction, whereas height or thickness are generally used synonymously to refer to a dimension of a layer or element in the vertical direction. Also, unless otherwise specified, the term "width" will be understood as the maximum width in the case in which the width of an element varies. Finally, the term "pattern" will be understood in general as referring to a feature formed by some patterning process.

First, a semiconductor device in accordance with an embodiment of the inventive concept will be described with reference to FIGS. 1 and 2.

Figure 2:
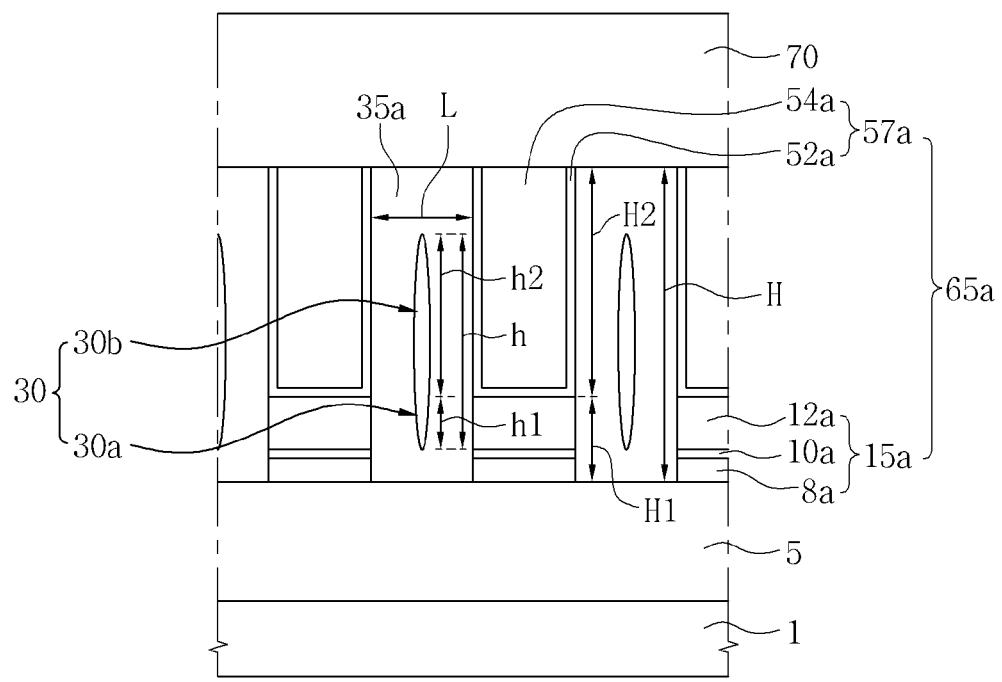
FIG. 2 is a cross-sectional view showing a semiconductor device in accordance with one example of the first embodiment of the inventive concept.

Referring to FIGS. 1 and 2, a substrate 1 may be provided. The substrate 1 may be a semiconductor substrate. For example, the substrate 1 may be a silicon substrate. A lower insulating layer 5 may be formed on the substrate 1. The lower insulating layer 5 may be formed of an insulating material such as silicon oxide. Interconnection structures 65a including sequentially stacked lower conductive patterns 15a and upper conductive patterns 57a may be formed on the lower insulating layer 5. The lower conductive patterns 15a may have a first height H1 (which or thickness in the vertical direction), and the upper conductive patterns 57a may have a second height H2 greater than the first height H1. The height H2 of the upper conductive patterns 57a may be greater than a distance L between the interconnection structures 65a.

Each of the lower conductive patterns 15a may be a single layer or a laminate of multiple layers. Each of the lower conductive patterns 15a may include at least one of polysilicon, a refractory metal, a metal nitride, tungsten, and aluminum. Each of the lower conductive patterns 15a may include a sequentially stacked first lower conductive pattern 8a, buffer conductive pattern 10a, and second lower conductive pattern 12a. For example, the first lower conductive pattern 8a may include a refractory metal or a metal nitride. For example, the first lower conductive pattern 8a may include one of Ta, TaN, WN, and TiN. The second lower conductive pattern 12a may be formed of a metal having lower resistivity, such as tungsten or aluminum, than the first lower conductive pattern 8a. The buffer conductive pattern 10a may be formed of a metal silicide or amorphous silicon. The buffer conductive pattern 10a may be formed of an amorphous structured material.

Each of the upper conductive patterns 57a may include a conductive material having lower resistivity than the lower conductive patterns 15a. For example, the upper conductive patterns 57a may be formed of copper or aluminum. Each of the upper conductive patterns 57a may include a second upper conductive pattern Ma and a first upper conductive pattern 52a covering bottom and side surfaces of the second upper conductive pattern Ma. The first upper conductive pattern 52a may include a refractory metal such as Ta or Ti, or a metal nitride such as TaN or TiN. The second upper conductive pattern Ma may be formed of a metal having lower resistivity, such as copper or aluminum, than the lower conductive patterns 15a.

Interlayer insulating patterns 35a may be formed between the interconnection structures 65a. The interlayer insulating patterns 35a, in a plan view, may have line shapes spaced apart from each other. The interlayer insulating patterns 35a may be formed of silicon oxide or a low-k dielectric material. The low-k dielectric material may be a SiOCH-based insulating material. The aforementioned distance L corresponds to the width of the interlayer insulating patterns 35a (horizontal dimension) and may be smaller than the height H (vertical dimension or thickness) of the interlayer insulating patterns 35a.

In some embodiments, air gaps 30 may be formed in the interlayer insulating patterns 35a. Each of the air gaps 30 may have a line shape, in a plan view. The air gaps 30 may be located at a lower level than upper surfaces of the interconnection structures 65a. The air gaps 30 may be located at a higher level than lower surfaces of the interconnection structures 65a. The height h (maximum vertical dimension) of the air gaps 30 may be smaller than the height H of the interconnection structures 65a. Each of the air gaps 30 may include a first part 30a located between the lower conductive patterns 15a, and a second part 30b located between the upper conductive patterns 57a. The first part 30a of the air gaps 30 may be located at the same level as the lower conductive patterns 15a, and the second part 30b of the air gaps 30 may be located at the same level as the upper conductive patterns 57a. The first part 30a of the air gaps 30 may have a first height h1 (dimension in the vertical direction), and the second part 30b of the air gaps 30 may have a second height h2 greater than the first height h1. The height h of the air gaps 30 may be greater than the width L of the interlayer insulating patterns 35a.

An upper insulating layer 70 may be formed on the substrate having the interlayer insulating patterns 35a and the interconnection structures 65a. The upper insulating layer 70 may be silicon oxide or a low-k dielectric material.

Next, a modified example of the semiconductor device in accordance with the embodiment of the inventive concept will be described with reference to FIGS. 1 and 3.

Figure 3:
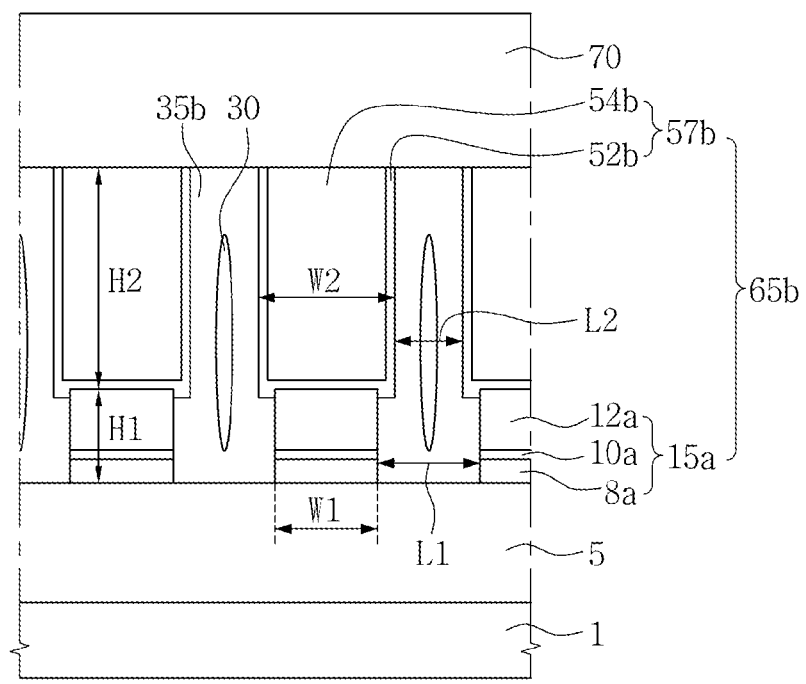
FIG. 3 is a cross-sectional view showing a semiconductor device in accordance with another example of the first of the embodiment of the inventive concept.

Referring to FIGS. 1 and 3, a substrate 1 may be provided. The substrate 1 may be a semiconductor substrate. A lower insulating layer 5 may be formed on the substrate 1.

Interconnection structures 65b including sequentially stacked lower conductive patterns 15a and upper conductive patterns 57b may be formed on the lower insulating layer 5. The upper conductive patterns 57b may have a width W2 greater than a width W1 of the lower conductive patterns 15a. The upper conductive patterns 57b may cover upper surfaces and upper sides of the lower conductive patterns 15a. The upper conductive patterns 57b may have a height H2 greater than the height H1 of the lower conductive patterns 15a. Each of the upper conductive patterns 57b may include a conductive material having lower resistivity than the lower conductive patterns 15a.

Interlayer insulating patterns 35b may be formed between the interconnection structures 65b. The interlayer insulating patterns 35b may have line shapes spaced apart from each other, in a plan view. The interlayer insulating patterns 35b may have a first width L1 in a part located at the same level as the lower conductive patterns 15a, and a second width L2 smaller than the first width L1 in a part located at the same level as the upper conductive patterns 57b.

An upper insulating layer 70 may be formed on the substrate having the interconnection structures 65b and the interlayer insulating patterns 35b.

Next, another example of the semiconductor device in accordance with the embodiment of the inventive concept will be described with reference to FIGS. 1 and 4.

Figure 4:
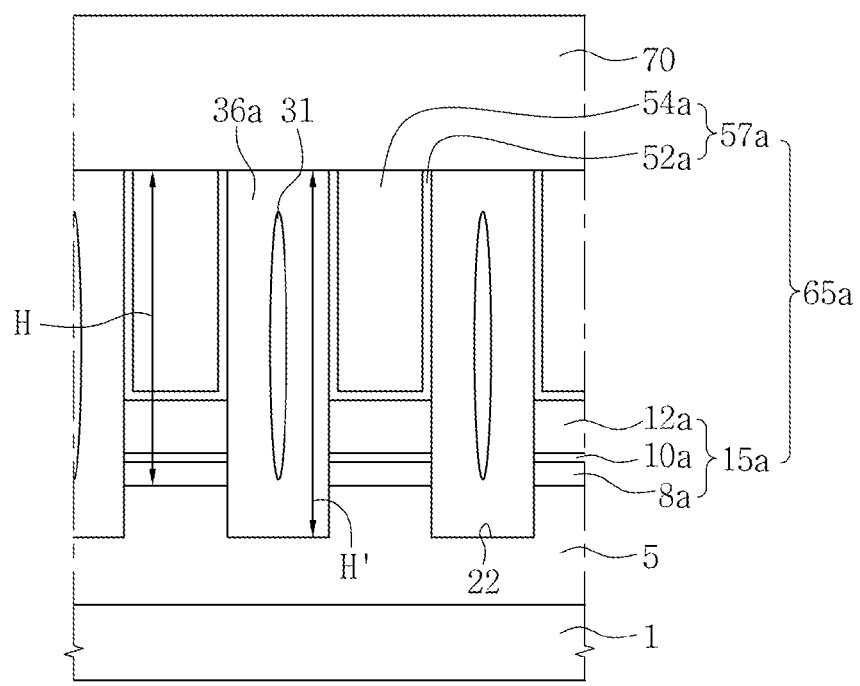
FIG. 4 is a cross-sectional view showing a semiconductor device in accordance with another example of the first embodiment of the inventive concept.

Referring to FIGS. 1 and 4, a substrate 1 may be provided. The substrate 1 may be a semiconductor substrate. A lower insulating layer 5 may be formed on the substrate 1. As described with reference to FIG. 2, interconnection structures 65a including sequentially stacked lower conductive patterns 15a and upper conductive patterns 57a may be formed on the lower insulating layer 5.

Interlayer insulating patterns 36a disposed between the interconnection structures 65a and having portions extending into the lower insulating layer 5 may be formed. The interlayer insulating patterns 36a may have line shapes in a plan view. The interlayer insulating patterns 36a may fill recessed areas 22 formed in the lower insulating layer 5 located at both sides of each of the interconnection structures 65a. Lower surfaces of the interlayer insulating patterns 36a may be located at a lower level than lower surfaces of the lower conductive patterns 15a. The height H' of the interlayer insulating patterns 36a may be greater than the height H of the interconnection structures 65a.

Air gaps 31 may be formed in the interlayer insulating patterns 36a. An upper insulating layer 70 may be formed on the substrate having the interconnection structures 65a and the interlayer insulating patterns 36a.

Next, still another modified embodiment of the semiconductor device in accordance with the embodiment of the inventive concept will be described with reference to FIG. 1 and FIG. 5.

Figure 5:
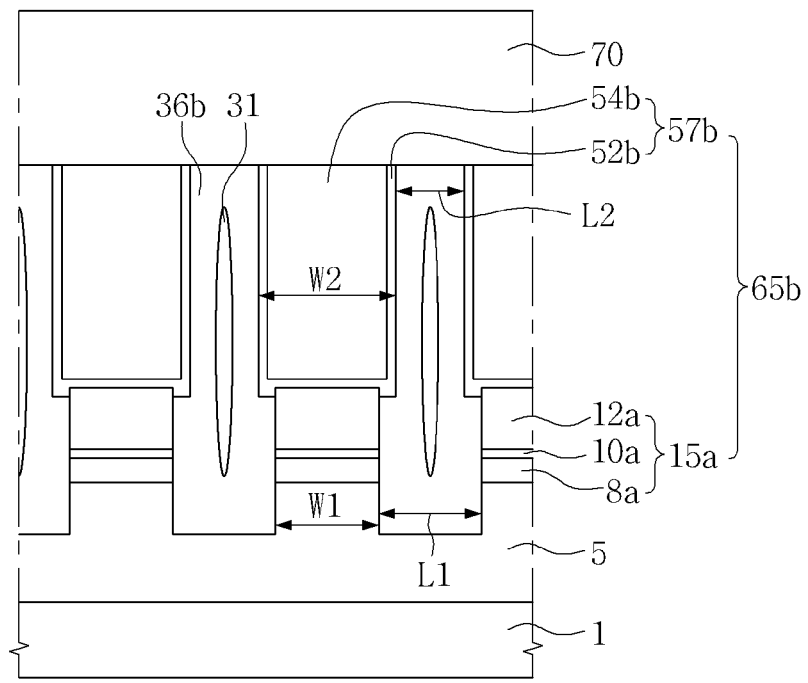
FIG. 5 is a cross-sectional view showing a semiconductor device in accordance with still another example of the first embodiment of the inventive concept.

Referring to FIG. 1 and FIG. 5, a substrate 1 may be provided. The substrate 1 may be a semiconductor substrate. A lower insulating layer 5 may be formed on the substrate 1. As described with reference to FIG. 3, interconnection structures 65b including sequentially stacked lower conductive patterns 15a and upper conductive patterns 57b may be formed on the lower insulating layer 5. The upper conductive patterns 57b may have a width W2 greater than the width W1 of the lower conductive patterns 15a.

Interlayer insulating patterns 36b disposed between the interconnection structures 65b and having portions extending into the lower insulating layer 5 may be formed. The interlayer insulating patterns 36b may have line shapes in a plan view. The interlayer insulating patterns 36b may fill recessed areas 22 formed in the lower insulating layer 5 located at both sides of each of interconnection structures 65b. Lower surfaces of the interlayer insulating patterns 36a may be located at a lower level than lower surfaces of the lower conductive patterns 15a. The interlayer insulating patterns 36b may have a first width L1 in a part located at the same level as the lower conductive patterns 15a, and a second width L2 smaller than the first width L1 in a part located at the same level as the upper conductive patterns 57b.

An upper insulating layer 70 may be formed on the substrate having the interconnection structures 65b and the interlayer insulating patterns 36b.

Next, still another modified example of the semiconductor device in accordance with the embodiment of the inventive concept will be described with reference to FIGS. 1 and 6.

Figure 6:
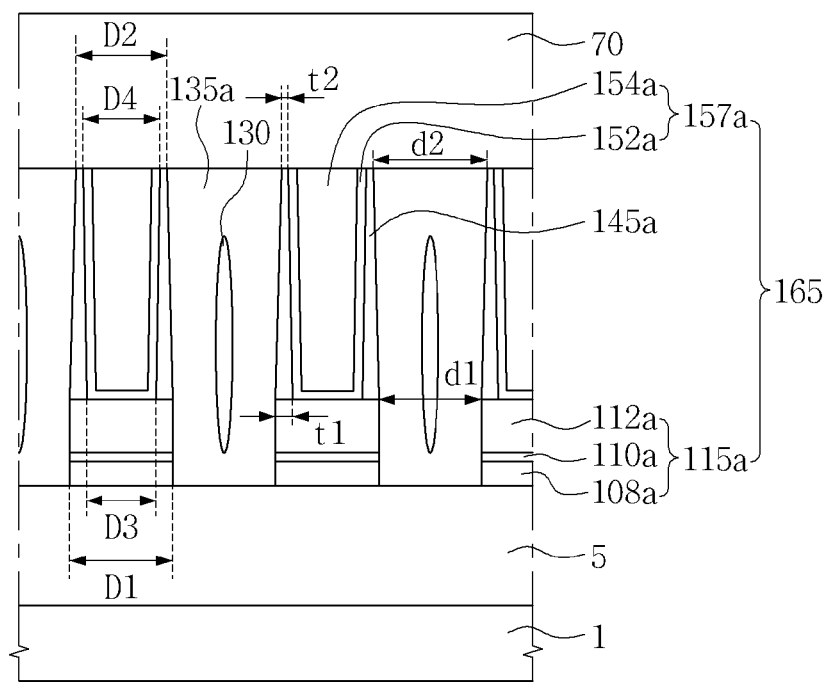
FIG. 6 is a cross-sectional view showing a semiconductor device in accordance with still another example of the first embodiment of the inventive concept.

Referring to FIGS. 1 and 6, a substrate 1 may be provided. The substrate 1 may be a semiconductor substrate. A lower insulating layer 5 may be formed on the substrate 1.

Line shaped interconnection structures 165 spaced apart from each other may be formed on the lower insulating layer 5. Interlayer insulating patterns 135a may be formed between the interconnection structures 165.

Each of the interconnection structures 165 may include a lower conductive pattern 115a, an upper conductive pattern 157a formed on the lower conductive pattern 115a, and a spacer 145a formed on a side surface of the upper conductive pattern 157a. The lower and upper conductive patterns 115a and 157a may be sequentially stacked. The spacer 145a may be formed on an upper surface of the lower conductive pattern 115a and cover a side surface of the upper conductive pattern 157a.

Each of the interconnection structures 165 may have a lower width D1 greater than an upper width D2, in a part in which the upper conductive pattern 157a and the spacer 145a are located. Each of the interconnection structures 165 may have a width gradually increasing toward a lower surface from an upper surface, in the part in which the upper conductive pattern 157a and the spacer 145a are located.

The lower conductive patterns 115a may be a single layer or a laminate of multiple layers. For example, the lower conductive patterns 115a, as was also the case in the example illustrated in FIG. 2, may include a sequentially stacked first lower conductive pattern 108a, buffer conductive pattern 110a, and second lower conductive pattern 112a.

The upper conductive pattern 157a may include a conductive material having lower resistivity than the lower conductive pattern 115a. For example, the upper conductive pattern 157a may be formed of copper or aluminum. The upper conductive pattern 157a may include a second upper conductive pattern 154a and a first upper conductive pattern 152a covering lower surface and side surface of the second upper conductive pattern 154a. The first upper conductive pattern 152a may include a refractory metal such as Ta or Ti, or a metal nitride such as TaN or TiN. The second upper conductive pattern 154a may be formed of a metal having lower resistivity, such as copper or aluminum, than the lower conductive pattern 115a.

The upper conductive pattern 157a may have an upper surface having a greater width than a lower surface. The upper conductive pattern 157a may have an upper width D4 greater than a lower width D3. Alternatively, the upper width of the upper conductive pattern 157a may be substantially the same as the lower width.

The lower conductive pattern 115a may have a width D1 greater than the upper width D4 of the upper conductive pattern 157a.

The spacer 145a may have a lower end width t1 greater than an upper end width t2. The spacer 145a may include a portion in which the width increases toward a lower part from an upper part.

The spacer 145a may be formed of an insulating material. For example, the spacer 145a may be formed of silicon oxide, silicon nitride, or silicon oxynitride.

Alternatively, the spacer 145a may be formed of a conductive material. For example, the spacer 145a may be formed of polysilicon, a metal, or a metal nitride. For example, the spacer 145a may be formed to include one of polysilicon, tantalum, titanium, tantalum nitride, and titanium nitride.

Air gaps 130 may be formed in the interlayer insulating patterns 135a. The air gaps 130 may be located between the interconnection structures 165 and spaced apart from the interconnection structures 165. The interlayer insulating patterns 135a may have a width d2 at an upper surface greater than a width d1 at a part located at the same level as the lower conductive patterns 115a. The width of the interlayer insulating patterns 135a may increase toward an upper part from a lower part, in a portion located at the same level as the upper conductive patterns 57a.

An upper insulating layer 70 may be formed on the substrate having the interconnection structures 165 and the interlayer insulating patterns 135a.

Figure 7:
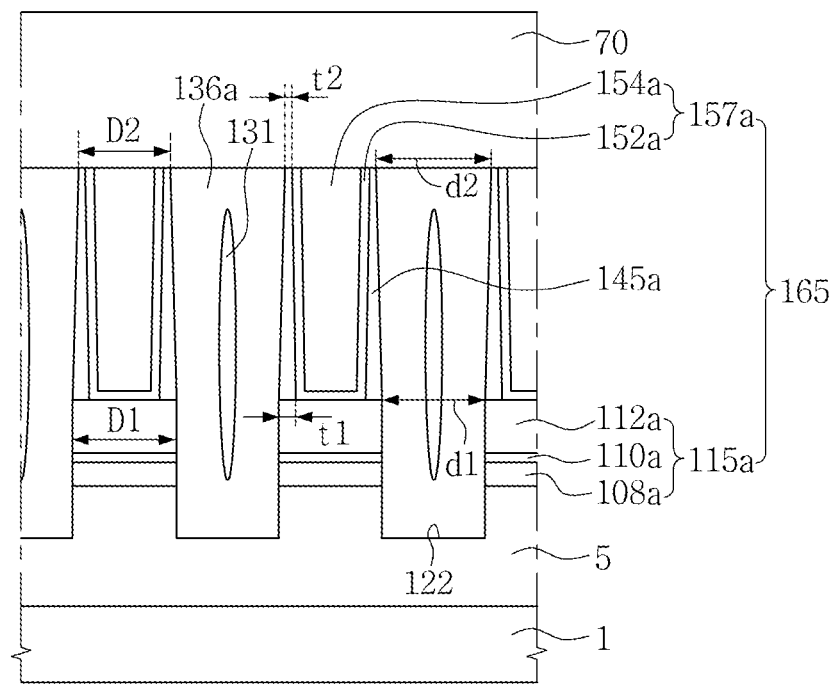
FIG. 7 is a cross-sectional view showing a semiconductor device in accordance with still another example of the first embodiment of the inventive concept.

In the embodiment shown in FIG. 7, the interlayer insulating patterns 136a has portions extending into the lower insulating layer 5. Accordingly, the interlayer insulating patterns 136a may have lower surfaces located at a lower level than the interconnection structures 165.

Next, still another semiconductor device in accordance with an embodiment of the inventive concept will be described with reference to FIGS. 1 and 8.

Figure 8:
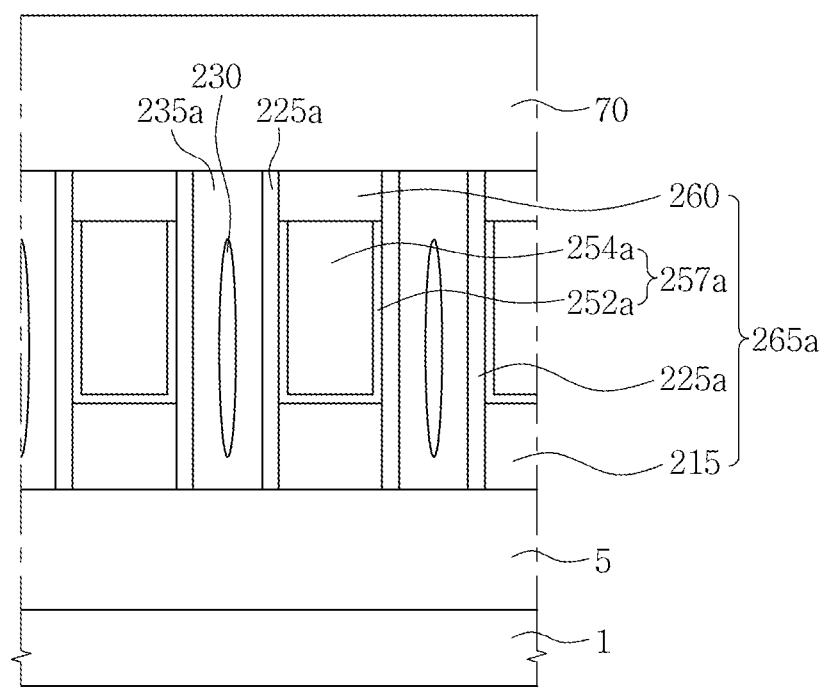
FIG. 8 is a cross-sectional view showing a semiconductor device in accordance with still another example of the first embodiment of the inventive concept.

Referring to FIGS. 1 and 8, a substrate 1 may be provided. A lower insulating layer 5 may be formed on the substrate 1.

Interconnection structures 265a may be formed on the lower insulating layer 5. In a plan view, the interconnection structures 265a may have line shapes spaced apart from each other. Interlayer insulating patterns 235a may be formed between the interconnection structures 265a.

Each of the interconnection structures 265a may include a sequentially stacked lower conductive pattern 215, upper conductive pattern 257a, and capping pattern 260. In addition, each of the interconnection structures 265a may include a spacer 225a formed on side surfaces of the lower conductive pattern 215, the upper conductive pattern 257a, and the capping pattern 260.

The upper conductive pattern 257a may include a conductive material having lower resistivity than the lower conductive pattern 215. For example, the lower conductive pattern

215 may include a refractory metal, a metal nitride, or polysilicon, and the upper conductive pattern 257a may include a metal material having lower resistivity, for example, copper or aluminum, than the lower conductive pattern 215.

The upper conductive pattern 257a may include a second upper conductive pattern 254a and a first upper conductive pattern 252a covering lower and side surfaces of the second upper conductive pattern 254a. The first upper conductive pattern 252a may be a barrier layer formed of a refractory metal or a metal nitride, or the like. The second upper conductive pattern 254a may be formed of low resistivity material such as copper or aluminum, so that total resistance of the interconnection structures 265 can be reduced.

The capping pattern 260 may be formed of an insulating material. For example, the capping pattern 260 may be formed of silicon nitride or silicon oxynitride.

The spacer 225a may be formed of an insulating material. For example, the spacer 225a may be formed of silicon nitride or silicon oxynitride.

In a plan view, the interlayer insulating patterns 235a may have line shapes spaced apart from each other. The interlayer insulating patterns 235a may be formed of a material having etch selectivity with respect to the spacer 225a and the capping pattern 260. For example, the spacer 225a and the capping pattern 260 may be formed of silicon nitride or silicon oxynitride, and the interlayer insulating patterns 235a may be formed of silicon oxide or a low-k dielectric material.

An upper insulating layer 70 covering the interconnection structures 265a and the interlayer insulating patterns 235a may be formed.

Figure 9:
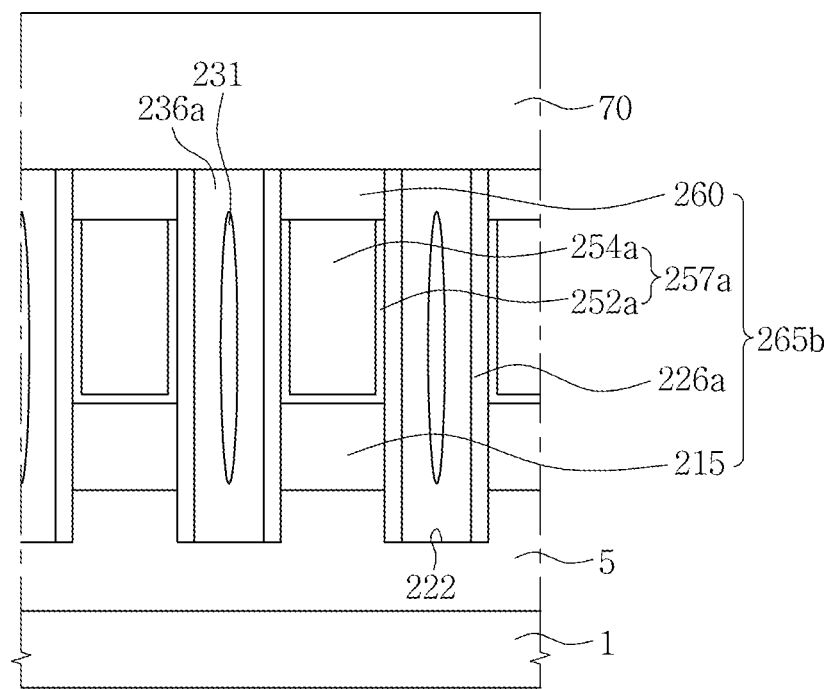
FIG. 9 is a cross-sectional view showing a semiconductor device in accordance with still another example of the first embodiment of the inventive concept.

In the embodiment shown in FIG. 9, the interlayer insulating patterns 236a may be disposed between the interconnection structures 265b and may have portions extending into the lower insulating layer 5. The interlayer insulating patterns 236a may be disposed between the interconnection structures 265b and extend to fill recessed areas 222 of the lower insulating layer 5. The interlayer insulating patterns 236a may have lower surfaces located at a lower level than the interconnection structures 265b.

Spacers 226a may be interposed between sides of the sequentially stacked lower conductive patterns 215, upper conductive patterns 257a, and capping patterns 260, and sides of the interlayer insulating patterns 236a, and extend between the sides of the interlayer insulating patterns 236a and sides of the recessed areas 222 of the lower insulating layer 5. Accordingly, the spacers 226a may cover the sides of the sequentially stacked lower conductive pattern 215, upper conductive pattern 257a, and capping pattern 260, and the sides of the interlayer insulating patterns 236a.

In the interconnection structures 265b including the spacers 226a, lower ends of the spacers 226a may be located at a lower level than the lower conductive patterns 215.

Next, methods of fabricating a semiconductor device in accordance with the inventive concept will be described with further reference to the flowchart of FIG. 10 and FIGS. 11A to 11G, FIGS. 12A and 12B, FIGS. 13A to 13D, FIGS. 14A and 14B, FIGS. 15A to 15H, FIGS. 16A to 16D, FIGS. 17A to 17G, and FIGS. 18A to 18D.

First, a method of fabricating a semiconductor device in accordance with one embodiment of the inventive concept will be described with reference to FIGS. 1, 10, and 11A to 11G.

Figure 10:
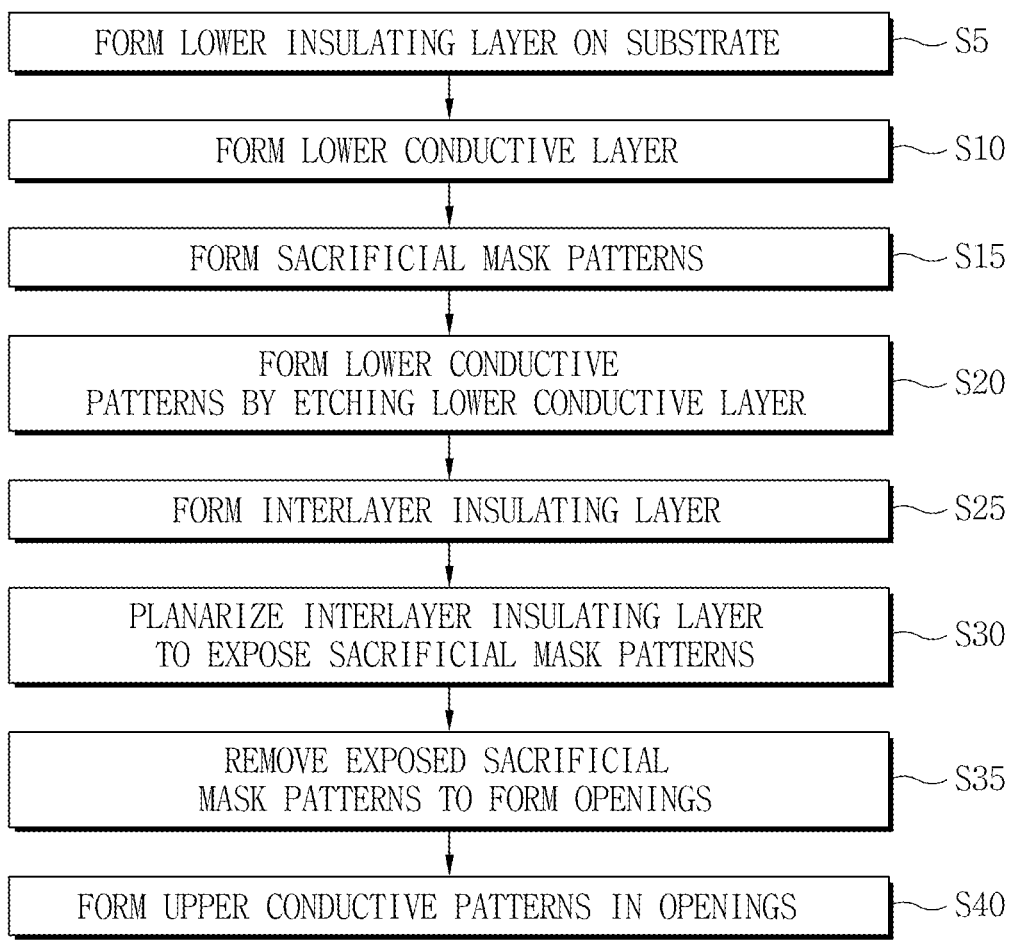
FIG. 10 is a process flowchart showing a method of fabricating a semiconductor device in accordance with the inventive concept.
Figure 11A:
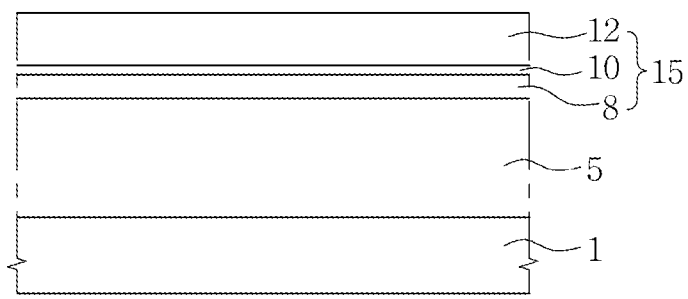
FIGS. 11A to 11G are cross-sectional views, taken in the direction of line I-I' in FIG. 1, showing an example of the method of fabricating a semiconductor device in accordance with the inventive concept.

Referring to FIGS. 1, 10, and 11A, a substrate 1 may be provided. The substrate 1 may be a semiconductor substrate. The substrate 1 may be a silicon substrate. A lower insulating layer 5 may be formed on the substrate 1 (S5). The lower insulating layer 5 may be formed of an insulating material such as silicon oxide.

A lower conductive layer 15 may be formed on the lower insulating layer 5 (S10). The lower conductive layer 15 may be formed of a material layer which can be etched by a dry etching process. The lower conductive layer 15 may be formed of a single layer or multiple layers. The lower conductive layer 15 may include a sequentially stacked first lower conductive layer 8, buffer conductive layer 10, and second lower conductive layer 12. The first lower conductive layer 8 may be a barrier layer which functions as a barrier to prevent diffusion of the second lower conductive layer 12. For example, the first lower conductive layer 8 may include a refractory metal or a metal nitride. For example, the first lower conductive layer 8 may be formed to include one of Ta, TaN, WN, and TiN. The second lower conductive layer 12 may be formed of a metal, such as tungsten or aluminum, having lower resistivity than the first lower conductive layer 8. The buffer conductive layer 10 may be formed of a metal silicide or amorphous silicon. The buffer conductive layer 10 may be formed of a material having an amorphous structure. The buffer conductive layer 10 may be formed of a material having an amorphous structure so that the resistance of the second lower conductive layer 12 can be reduced. For example, the second lower conductive layer 12 may have lower resistivity when the second lower conductive layer 12 is formed to contact the buffer conductive layer 10 having an amorphous structure, than when the second lower conductive layer 12 is formed to contact the first lower conductive layer 8 having a crystalline structure. For example, the second lower conductive layer 12 may have a larger grain size when the second lower conductive layer 12 is formed to contact the amorphous-structured buffer conductive layer 10, than when the second lower conductive layer 12 is formed to contact the crystalline-structured first lower conductive layer 8. For example, tungsten may have relatively lower resistivity when having a relatively larger grain-sized crystalline structure. The second lower conductive layer 12 may be formed of amorphous-structured tungsten silicide or amorphous-structured silicon.

Figure 11B:
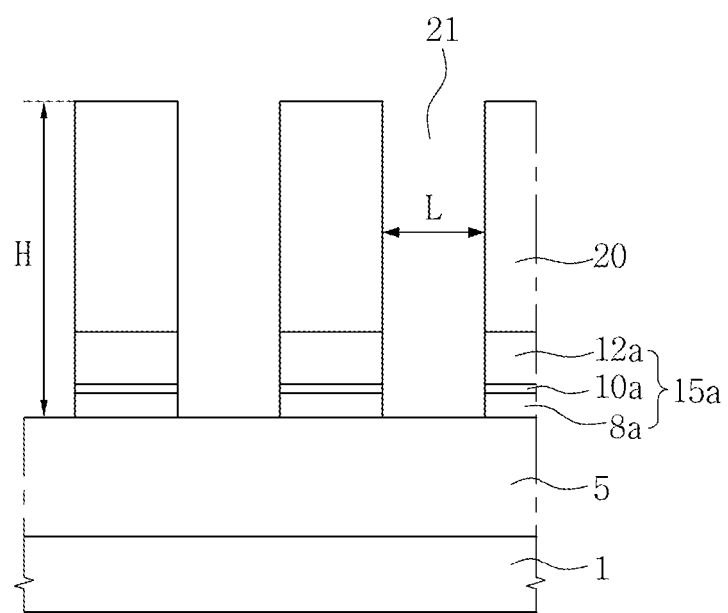

Referring to FIGS. 1, 10, and 11B, sacrificial mask patterns 20 may be formed on the lower conductive layer 15 (S15). The sacrificial mask patterns 20 may have line shapes spaced apart from each other. The sacrificial mask patterns 20 may be formed of silicon nitride.

The lower conductive layer 15 may be etched, using the sacrificial mask patterns 20 as an etch mask, to form lower conductive patterns 15a (S20). The lower conductive patterns 15a may be formed under the sacrificial mask patterns 20 and have sides vertically aligned with sides of the sacrificial mask patterns 20. The lower conductive patterns 15a may have line shapes spaced apart from each other. Each of the lower conductive patterns 15a may include a sequentially stacked first lower conductive pattern 8a, buffer conductive pattern 10a, and second lower conductive pattern 12a. Spaces 21 between the sacrificial mask patterns 20 and between the lower conductive patterns 15a may have a height H greater than a width L.

Figure 11C:
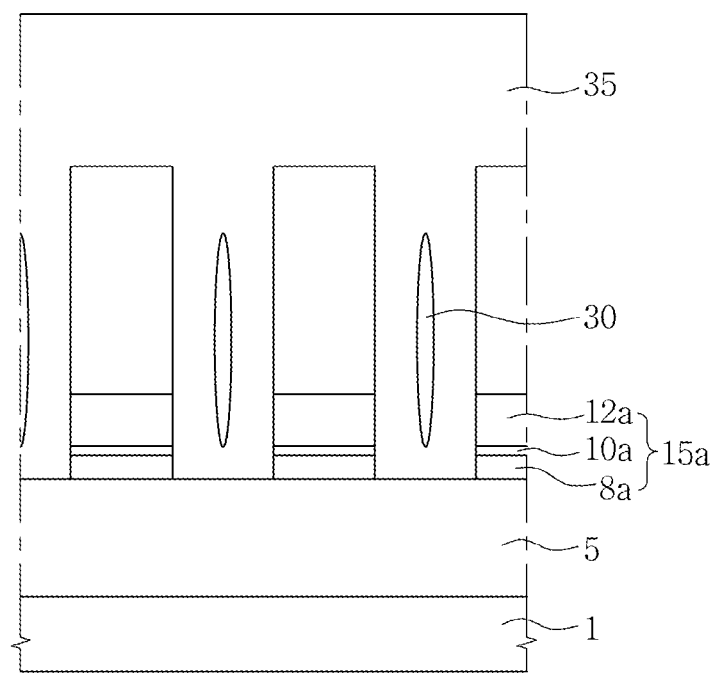

Referring to FIGS. 1, 10, and 11C, an interlayer insulating layer 35 may be formed (S25). The interlayer insulating layer 35 may be formed on the substrate having the lower conductive patterns 15a. The interlayer insulating layer 35 may be formed by a chemical vapor deposition (CVD) method, an atomic layer deposition (ALD) method, or a spin-on method.

The interlayer insulating layer 35 may be formed of a different material from the sacrificial mask patterns 20. The interlayer insulating layer 35 may be formed of a material having etch selectivity with respect to the sacrificial mask patterns 20. For example, the sacrificial mask patterns 20 may be formed of silicon nitride, and the interlayer insulating layer 35 may be formed of silicon oxide or a low-k dielectric material. The low-k dielectric material may be a SiOCH-based insulating material.

The interlayer insulating layer 35 may have an air gap 30 disposed between sides of the sacrificial mask patterns 20. The air gap 30 may include a portion disposed between the sacrificial mask patterns 20 and a portion disposed between the lower conductive patterns 15a. The air gap 30 may be located at a lower level than upper surfaces of the sacrificial mask patterns 20 and spaced apart from the lower conductive patterns 15a and the sacrificial mask patterns 20. In a plan view, the air gap 30 may have a line shape.

Figure 11D:
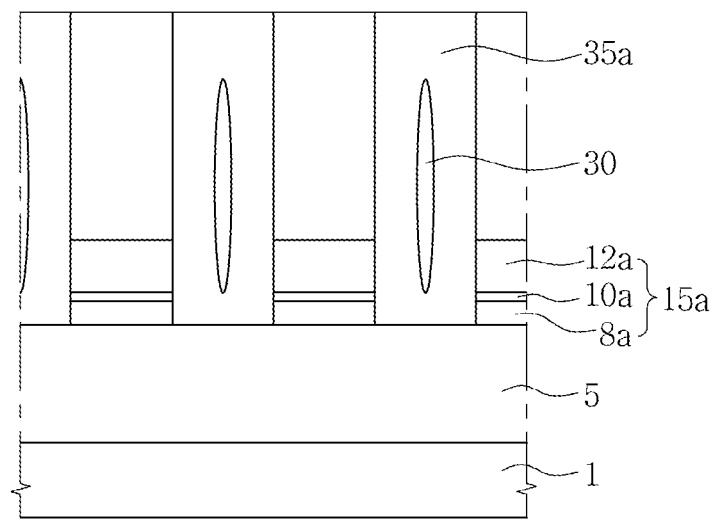

Referring to FIGS. 1, 10, and 11D, the interlayer insulating layer 35 may be planarized to expose the sacrificial mask patterns 20 (S30). The planarizing of the interlayer insulating layer 35 may form interlayer insulating patterns 35a. The planarization may be performed by a chemical mechanical planarization (CMP) process and/or an etch-back process. The air gap 30 may remain as disposed in the interlayer insulating patterns 35a.

Figure 11E:
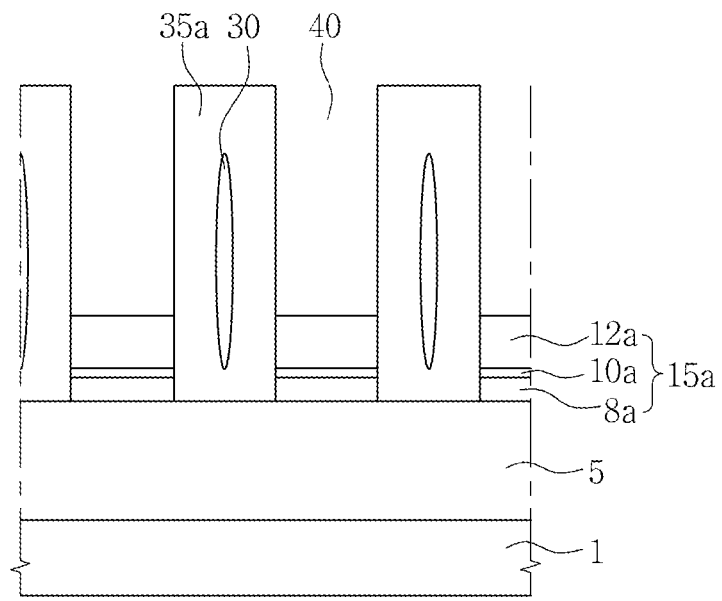

Referring to FIGS. 1, 10, and 11E, the exposed sacrificial mask patterns 20 may be removed to form openings 40 exposing the lower conductive patterns 15a (S35). The removal of the exposed sacrificial mask patterns 20 may include etching the exposed sacrificial mask patterns 20 by a wet etch process or a dry etch process. The openings 40 may have line shapes spaced apart from each other. The openings 40 may be trenches spaced apart from each other.

Figure 11F:
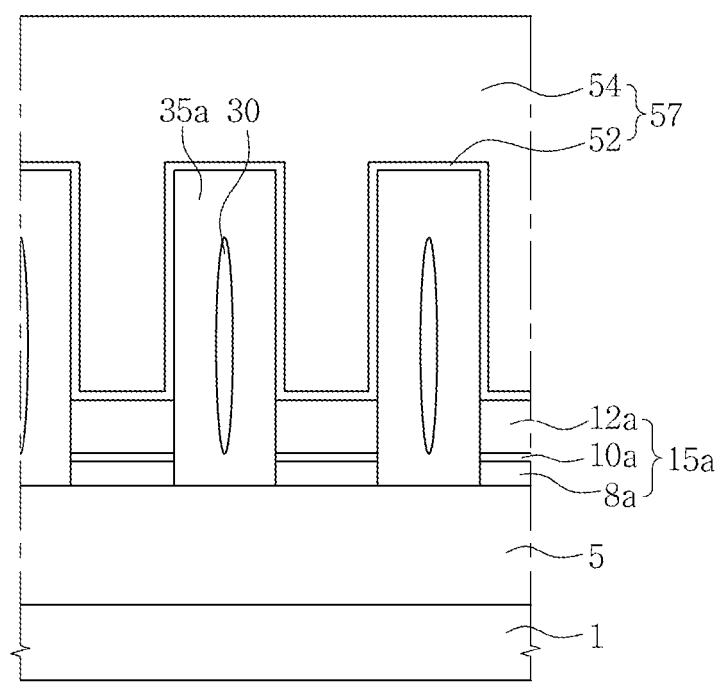

Referring to FIGS. 1, 10, and 11F, an upper conductive layer 57 may be formed on the substrate having the openings 40. The upper conductive layer 57 may include a metal having lower resistivity than the lower conductive patterns 15a. The upper conductive layer 57 may include a first upper conductive layer 52, and a second upper conductive layer 54 formed on the first upper conductive layer 52. The first upper conductive layer 52 may be conformally formed on the substrate having the openings 40. The first upper conductive layer 52 may cover bottoms and sidewalls of the openings 40. The second upper conductive layer 54 may be formed to fill the openings, on the first upper conductive layer.

The first upper conductive layer 52 may be a barrier layer which functions to prevent diffusion of the second upper conductive layer 54, or to prevent reaction between the second upper conductive layer 54 and the lower conductive patterns 15a. Alternatively, the first upper conductive layer 52 may be a seed layer to form the second upper conductive layer 54. For example, the first upper conductive layer 52 may be formed as a seed layer or a diffusion barrier layer, such as tantalum. The second upper conductive layer 54 may be formed of a conductive material having lower resistivity, such as copper or aluminum, than the lower conductive patterns 15a.

Figure 11G:
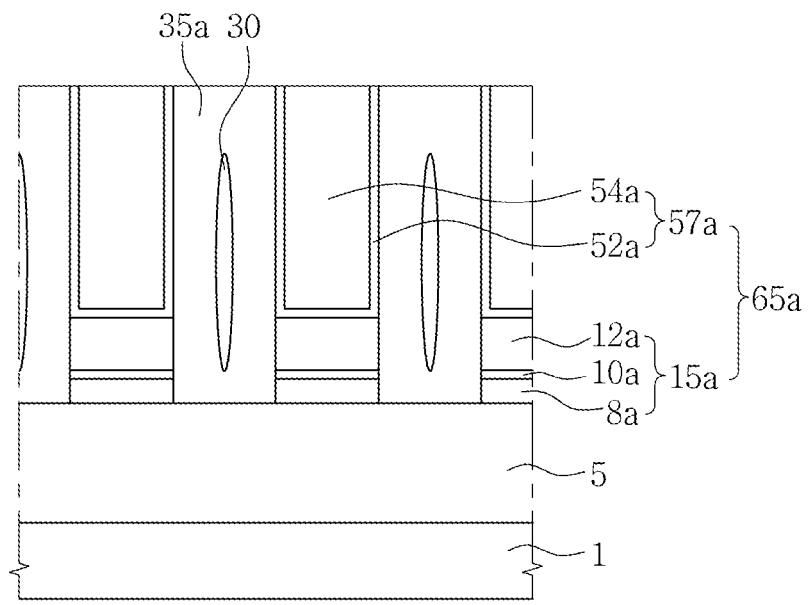

Referring to FIGS. 1, 10, and 11G, the upper conductive layer 57 may be planarized until upper surfaces of the interlayer insulating patterns 35a are exposed, to form upper conductive patterns 57a confined within the openings 40. The upper conductive patterns 57a may be formed, after forming the lower conductive patterns 15a, without using a photolithography process. In this embodiment, the upper conductive patterns 57a are formed by a damascene process using the sacrificial mask patterns 20 which have been used for forming the lower conductive patterns 15a. That is, the upper conductive patterns 57a are not formed using a photolithography process after the lower conductive patterns 15a are formed.

The upper conductive patterns 57a may be self-aligned on the lower conductive patterns 15a. Each of the upper conductive patterns 57a may include a second upper conductive pattern 54a, and a first upper conductive pattern 52a covering the lower and side surfaces of the second upper conductive pattern 54a. The sequentially stacked lower conductive patterns 15a and upper conductive patterns 57a may constitute interconnection structures 65a.

The interconnection structures 65a may have line shapes spaced apart from each other. The air gap 30 may be located between the interconnection structures 65a. The air gaps 30 may have a first part located at the same level as the lower conductive patterns 15a, and a second part located at the same level as the upper conductive patterns 57a. The air gap 30 may be spaced apart from the interconnection structures 65a, and located at a lower level than upper surfaces of the interconnection structures 65a. Thanks to the formation of the air gap 30, parasitic capacitance generated between the interconnection structures 65a may be reduced. Accordingly, signal transmission speed of the interconnection structures 65a can be improved.

Next, referring again to FIG. 2, an upper insulating layer 70 may be formed on the substrate having the interconnection structures 65a. The upper insulating layer 70 may be formed of silicon oxide or a low-k dielectric material.

The height H of the interconnection structures 65a may be greater than the distance L between the interconnection structures 65a. The lower conductive patterns 15a may have a first height H1, and the upper conductive patterns 57a may have a second height H2 greater than the first height H1. The second height H2 of the upper conductive patterns 57a may be greater than the distance L between the interconnection structures 65a.

Next, another method of fabricating a semiconductor device in accordance with the inventive concept will be described with reference to FIGS. 1, 10, 12A, and 12B.

Figure 12A:
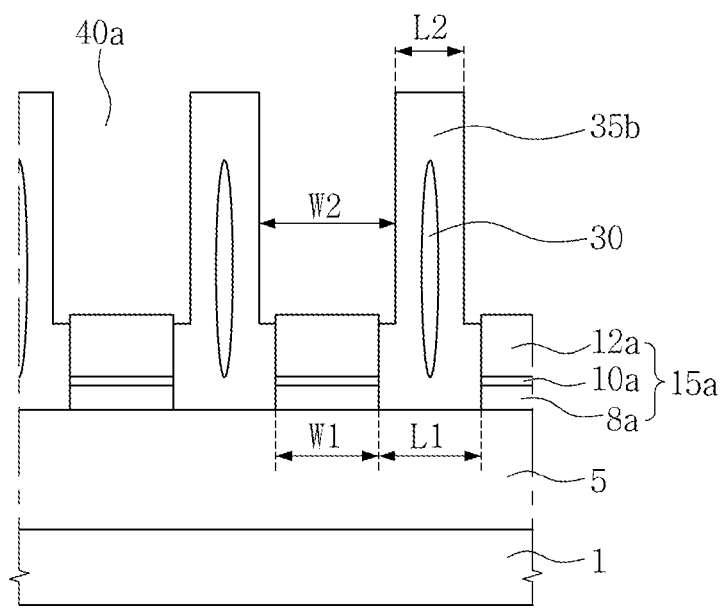
FIGS. 12A and 12B are cross-sectional views, taken in the direction of line I-I' in FIG. 1, showing another an example of the method of fabricating a semiconductor device in accordance with the inventive concept.

Referring to FIGS. 1, 10, and 12A, and as was described with reference to FIGS. 10 and 11A to 11E, a lower insulating layer may be formed on a substrate (S5), a lower conductive layer may be formed (S10), sacrificial mask patterns may be formed (S15), lower conductive patterns 15a may be formed by etching the lower conductive layer (S20), an interlayer insulating layer (S25) may be formed, the sacrificial mask patterns may be exposed by planarizing the interlayer insulating layer (S30), and openings may be formed by removing the sacrificial mask patterns (S35). The planarizing of the interlayer insulating layer may result in the forming of interlayer insulating patterns 35a.

Widths of the openings may be enlarged by isotropically etching the interlayer insulating patterns 35a to form interlayer insulating patterns 35b. Accordingly, the enlarged openings 40a may have a width W2 greater than a width W1 of the lower conductive patterns 15a and hence, the interlayer insulating patterns 35b may have different upper and lower widths. For example, the interlayer insulating patterns 35b may have a first width L1 in a part located at the same level as the lower conductive patterns 15a, and a second width L2 smaller than the first width L1 in a part located at the same level as the enlarged openings 40a.

The enlarged openings 40a may expose upper surfaces of the lower conductive patterns 15a, and expose upper parts of the side surfaces of the lower conductive patterns 15a. In other words, the enlarged openings 40a may expose upper and side surfaces of upper ends of the lower conductive patterns 15a.

Air gaps 30 may be formed in the interlayer insulating patterns 35a. In addition, the air gaps 30 may include a first part located between the enlarged openings 40a, and a second part located between the lower conductive patterns 15a.

Figure 12B:
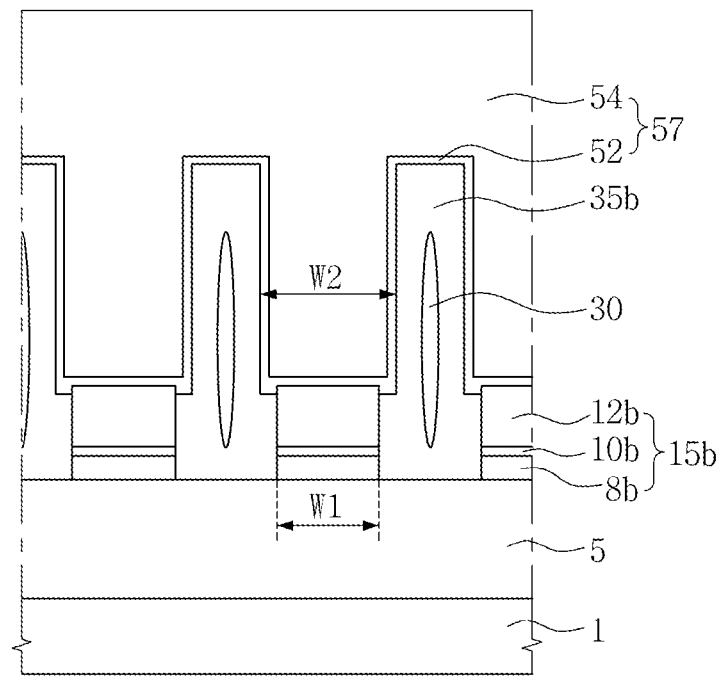

Referring to FIGS. 1 and 12B, an upper conductive layer 57 may be formed on the substrate having the enlarged openings 40a. The formation of the upper conductive layers 57 may include conformally forming a first upper conductive layer 52 on the substrate having the enlarged openings 40a, and forming a second upper conductive layer 54 filling the enlarged openings 40a on the first upper conductive layer 52.

Next, referring again to FIG. 3, the upper conductive layer 57 may be planarized until the interlayer insulating patterns 35a are exposed, to form upper conductive patterns 57b. The upper conductive patterns 57b may be formed to have a width W2 greater than a width W1 of the lower conductive patterns 15a. The upper conductive patterns 57b may be in direct contact with upper surfaces and upper side surfaces of the lower conductive patterns 15a. Accordingly, contact resistance between the upper conductive patterns 57b and the lower conductive patterns 15a may be reduced.

The upper and lower conductive patterns 57b and 15a may constitute interconnection structures 65b. An upper insulating layer 70 may be formed on the substrate having the interconnection structures 65b.

Next, another method of fabricating a semiconductor device in accordance with the inventive concept will be described with reference to FIGS. 1, 10, and 13A to 13D.

Figure 13A:
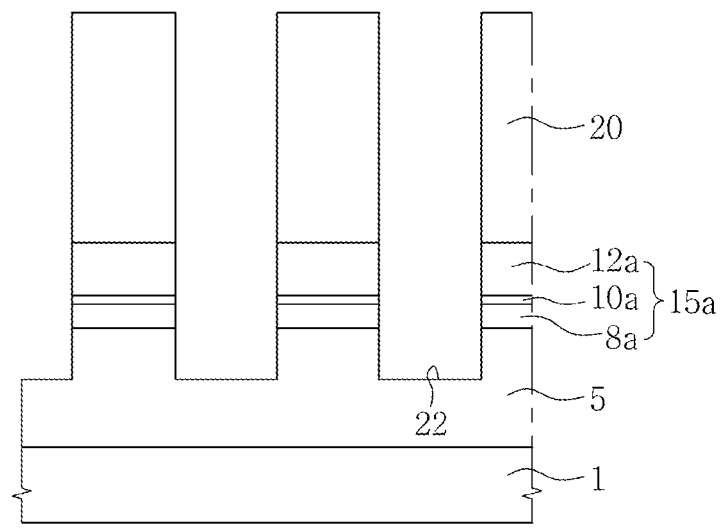
FIGS. 13A to 13D are cross-sectional views, taken in the direction of line I-I' in FIG. 1, showing another an example of the method of fabricating a semiconductor device in accordance with the inventive concept.

Referring to FIGS. 1, 10, and 13A, a lower insulating layer 5 may be formed on a substrate 1 (S5). A lower conductive layer may be formed on the lower insulating layer 5 (S10). Sacrificial mask patterns 20 may be formed on the lower conductive layer (S15). Lower conductive patterns 15a may be formed by etching the lower conductive layer using the sacrificial mask patterns 20 as an etch mask (S20). Furthermore, recessed areas 22 may be formed in the lower insulating layer 5 by partially etching the lower insulating layer 5 using the sacrificial mask patterns 20 as an etch mask.

Figure 13B:
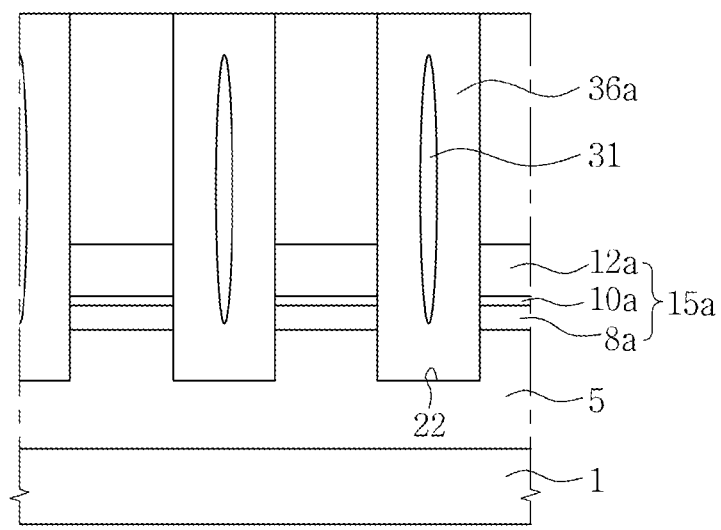

Referring to FIGS. 1, 10, and 13B, an interlayer insulating layer may be formed on the substrate having the recessed areas 22 (S25). Next, the interlayer insulating layer may be planarized until the sacrificial mask patterns 20 are exposed (S30). The planarizing of the interlayer insulating layer may thus form interlayer insulating patterns 36a.

Air gaps 31 may be formed in the interlayer insulating patterns 36a. The air gaps 31 may include a part located between the sacrificial mask patterns 20, and a part located between the lower conductive patterns 15a. The heights of the air gaps 31 may be affected by depths of the recessed areas 22 of the lower insulating layer 5. Accordingly, the deeper the recessed areas 22 become, the longer the air gaps 31 may become in the vertical direction to reduce parasitic capacitance.

Figure 13C:
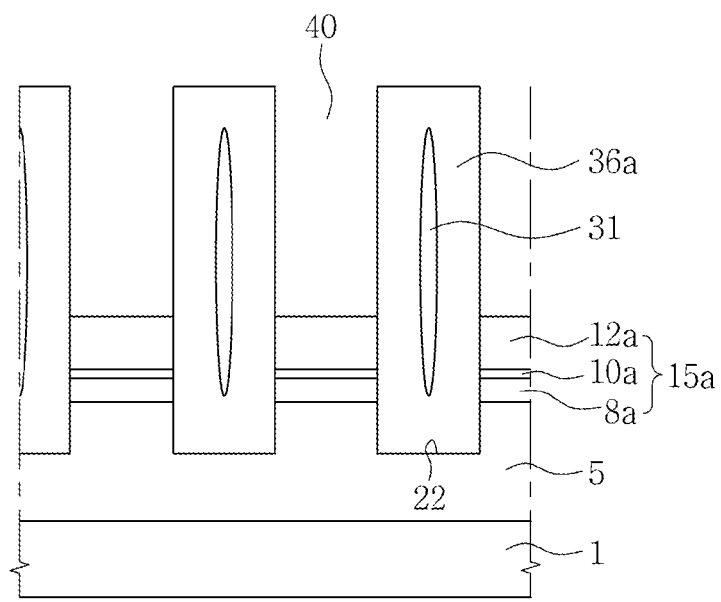

Referring to FIGS. 1, 10, and 13C, openings 40 may be formed by selectively removing the exposed sacrificial mask patterns 20 (S35). The openings 40 may expose the lower conductive patterns 15a.

Figure 13D:
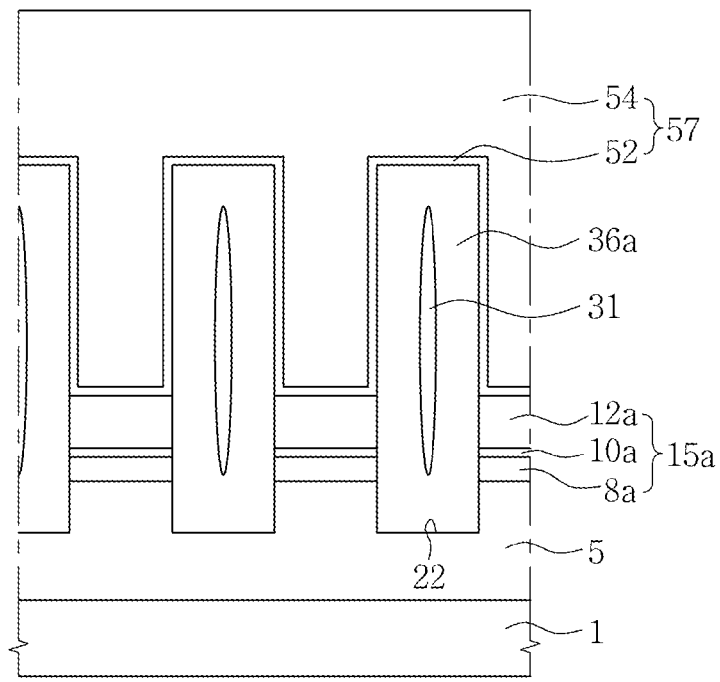

Referring to FIGS. 1, 10, and 13D, and as was described with reference to FIG. 11F, an upper conductive layer 57 may be formed on the substrate having the openings 40.

Referring again to FIG. 4, the upper conductive layer 57 may be planarized to form upper conductive patterns 57a confined to within the openings 40. Then, an upper insulating layer 70 may be formed on the substrate having the upper conductive patterns 57a.

Next, another method of fabricating a semiconductor device in accordance with the inventive concept will be described with reference to FIGS. 1, 10, 14A, and 14B.

Figure 14A:
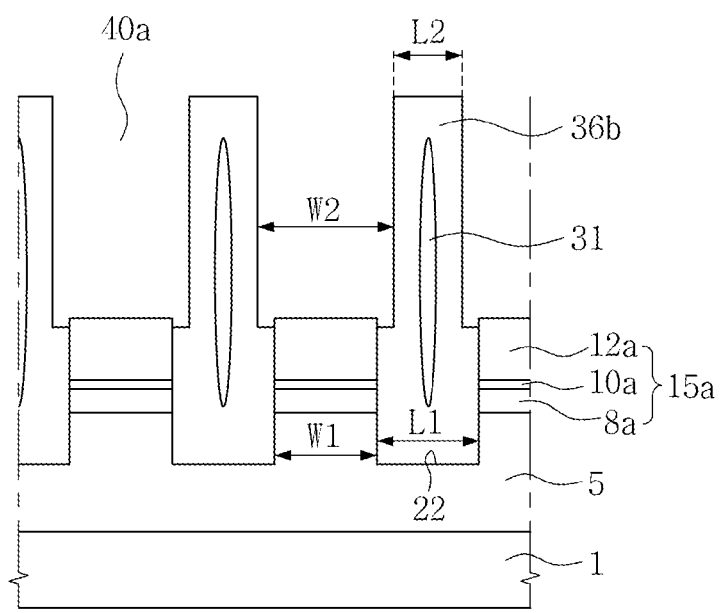
FIGS. 14A and 14B are cross-sectional views, taken in the direction of line I-I' in FIG. 1, showing another example of the method of fabricating a semiconductor device in accordance with the inventive concept.

Referring to FIGS. 1, 10, and 14A, and as was described with reference to FIG. 13C, a substrate having openings 40 disposed between the lower insulating patterns 36a may be provided. Then, the widths of the openings 40 may be enlarged. For example, as described with reference to FIG. 12A, enlarged openings 40a may be formed by isotropically etching the interlayer insulating patterns 36a. The forming of the enlarged openings 40a simultaneously produces interlayer insulating patterns 36b in which upper parts have smaller widths than lower parts.

As described with reference to FIG. 13C, air gaps 31 may be formed in the interlayer insulating patterns 36b. In addition, the air gaps 31 may be disposed between the enlarged openings 40a.

Figure 14B:
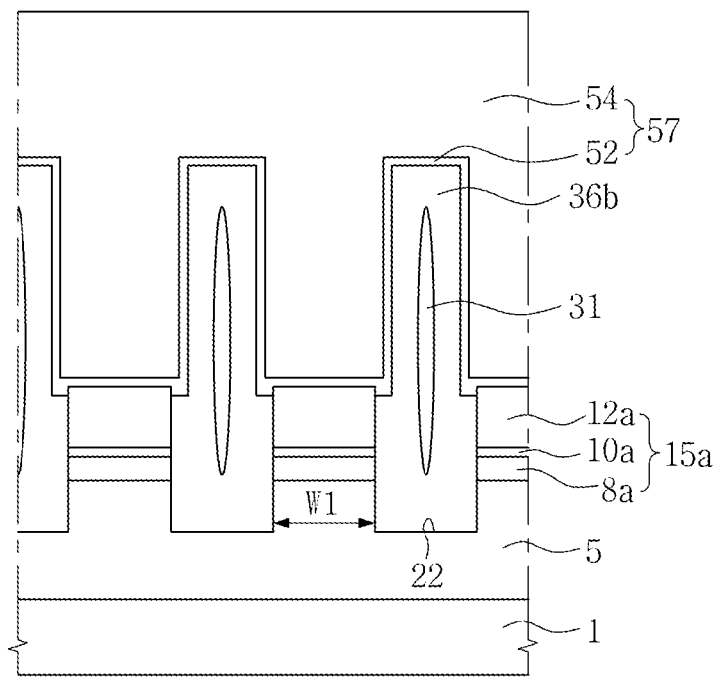

Referring to FIGS. 1, 10, and 14B, an upper conductive layer 57 may be formed on the substrate having the enlarged openings 40a.

Then, and as was described with reference to FIG. 5, the upper conductive layer 57 may be planarized until the interlayer insulating patterns 36b are exposed, to form upper conductive patterns 57a in the enlarged openings 40a (S40).

Next, another method of fabricating a semiconductor device in accordance with the inventive concept will be described with reference to FIGS. 1, 10, 15A to 15H.

Figure 15A:
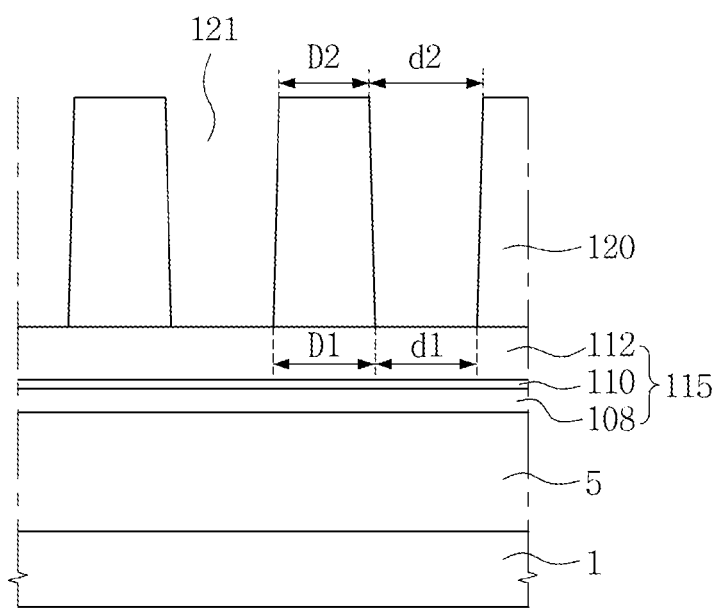
FIGS. 15A to 15H are cross-sectional views, taken in the direction of line I-I' in FIG. 1, showing another example of the method of fabricating a semiconductor device in accordance with the inventive concept.

Referring to FIGS. 1, 10, and 15A, a substrate 1 may be provided. The substrate 1 may be a semiconductor substrate. A lower insulating layer 5 may be formed on the substrate 1 (S5). The lower insulating layer 5 may be formed of an insulating material such as silicon oxide.

A lower conductive layer 115 may be formed on the lower insulating layer 5 (S10). The lower conductive layer 115 may be a laminate, i.e., a multi-layered structure. For example, the lower conductive layer 115, as described in FIG. 11A, may include a sequentially stacked first lower conductive layer 108, buffer conductive layer 110, and second lower conductive layer 112.

Sacrificial mask patterns 120 may be formed on the lower conductive layer 115 (S 15). The formation of the sacrificial mask patterns 120 may include forming a sacrificial material layer on the lower conductive layer 115, and patterning the sacrificial material layer.

The sacrificial mask patterns 120, in a plan view, may have line shapes spaced apart from each other. Each of the sacrificial mask patterns 120 may have a lower width D1 smaller than its upper width D2. In contrast, each of the sacrificial mask patterns 120 may have a lower width greater than its upper width. Each of the sacrificial mask patterns 120 may have a width gradually increasing toward a lower surface from an upper surface. Each of the sacrificial mask patterns 120 may have an inclined side to have a lower part having a greater width than an upper part. A space 121 between the sacrificial mask patterns 120 may have a lower width d1 smaller than an upper width d2.

Figure 15B:
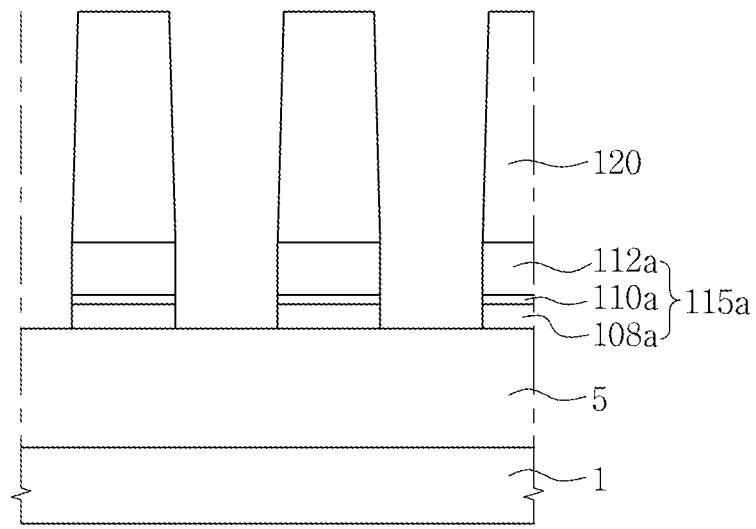

Referring to FIGS. 1, 10, and 15B, the lower conductive layer 115 may be etched using the sacrificial mask patterns 120 as an etch mask, to form lower conductive patterns 115a (S20). The lower conductive patterns 115a may have a greater width than upper surfaces of the sacrificial mask patterns 120. Each of the lower conductive patterns 115a may have a sequentially stacked first lower conductive pattern 108a, buffer conductive pattern 110a, and second lower conductive pattern 112a.

Figure 15C:
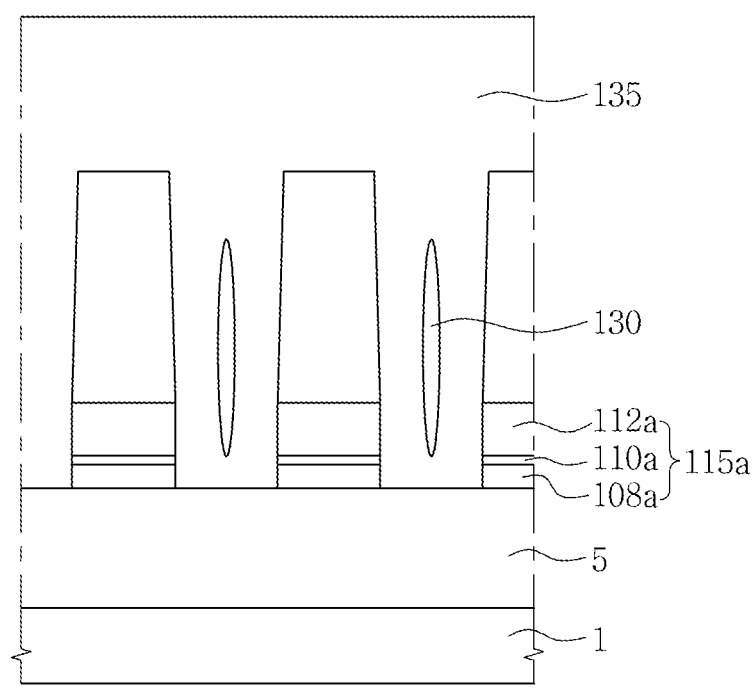

Referring to FIGS. 1, 10, and 15C, an interlayer insulating layer 135 may be formed on the substrate having the lower conductive patterns 115a (S25). The interlayer insulating layer 135 may be formed of silicon oxide or a low-k dielectric material.

The interlayer insulating layer 135 may have air gaps 130. The air gaps 130, in a plan view, may have line shapes spaced apart from each other. The air gaps 130 may be disposed between the sacrificial mask patterns 20 and between the lower conductive patterns 115a. The air gaps 130 may be located at a lower level than upper surfaces of the sacrificial mask patterns 120.

Figure 15D:
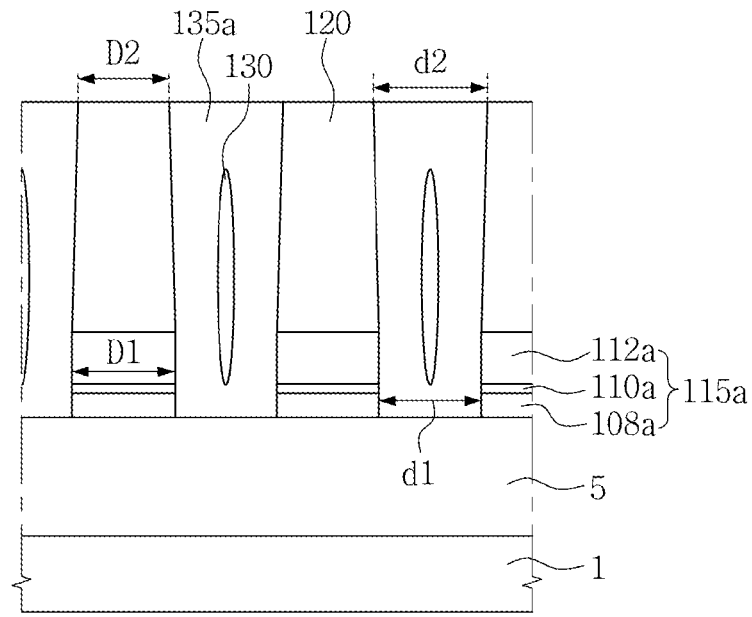

Referring to FIGS. 1, 10, and 15D, the interlayer insulating layer 135 may be planarized until the sacrificial mask patterns 120 are exposed (S30). The planarized interlayer insulating layer may constitute interlayer insulating patterns 135a (S30). The air gaps 130 may be located in the interlayer insulating patterns 135a.

The interlayer insulating patterns 135a may be line shapes spaced apart from each other. The interlayer insulating patterns 135a may have an upper width d2 greater than a lower width d1. For example, each of the interlayer insulating patterns 135a may have a width d2 in a portion located at the same level as upper surfaces of the sacrificial mask patterns 120, greater than a width d1 in a portion located at the same level as lower surfaces of the sacrificial mask patterns 120. Portions of the interlayer insulating patterns 135a located at the same level as the sacrificial mask patterns 120 may have inclined sides so that the widths of the interlayer insulating patterns 135a gradually decrease toward the lower part from the upper part.

Figure 15E:
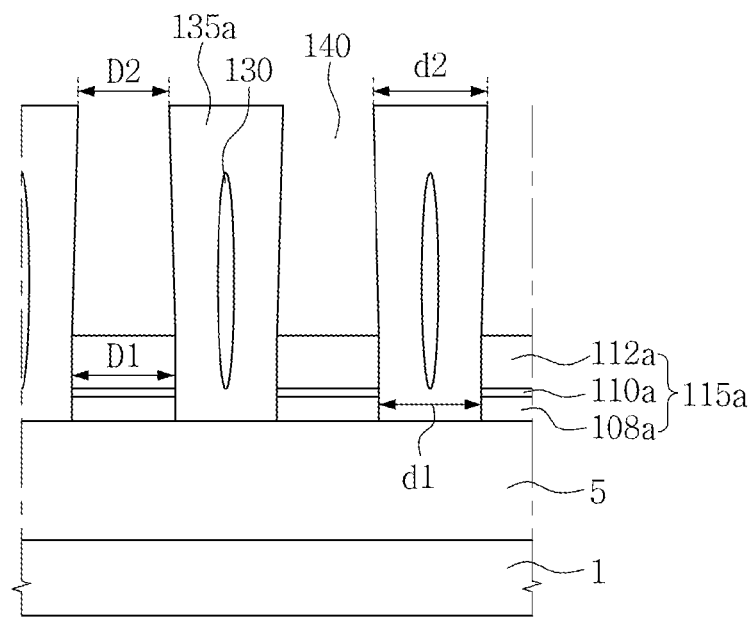

Referring to FIGS. 1, 10, and 15E, openings 140 may be formed by removing the exposed sacrificial mask patterns 120 (S35). The openings 140 may have the same shapes as the sacrificial mask patterns 120. For example, each of the openings 140 may have a lower width D1 greater than an upper width D2. Each of the openings 140 may have a width increasing toward a lower part from an upper part.

Figure 15F:
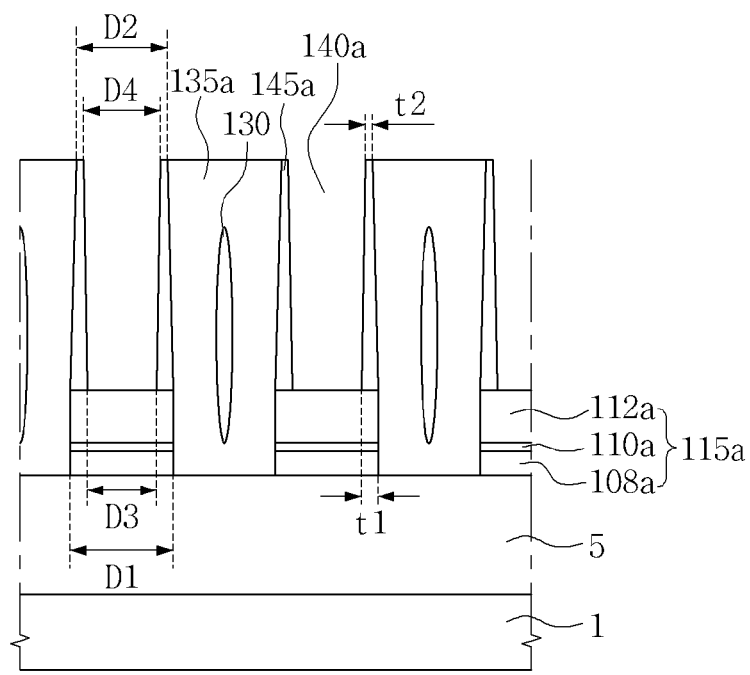

Referring to FIGS. 1 and 15F, a spacer layer may be formed on the substrate having the openings 140. The spacer layer may be thicker on sides of the upper parts of the interlayer insulating patterns 135a than on sides of the lower parts of the interlayer insulating patterns 135a.

Spacers 145a may be formed by isotropically etching the spacer layer. Each of the spacers 145a may have a lower end width t1 greater than an upper end width t2. Each of the spacers 145a may have a width continuously increasing toward a lower part from an upper part.

The openings 140 become modified openings 140a due to the spacers 145a.

Each of the modified openings 140a may have a lower width D3 smaller than an upper width D4. Alternatively, each of the modified openings 140a may have a lower width D3 that is substantially the same as the upper width D4.

The spacers 145a may be formed of an insulating material. For example, the spacers 145a may be formed of silicon oxide, silicon nitride, or silicon oxynitride. Alternatively, the spacers 145a may be formed of a conductive material. For example, the spacers 145a may be formed of a metal or a metal nitride. For example, the spacers 145a may be formed of tantalum, titanium, tantalum nitride, or titanium nitride.

Figure 15G:
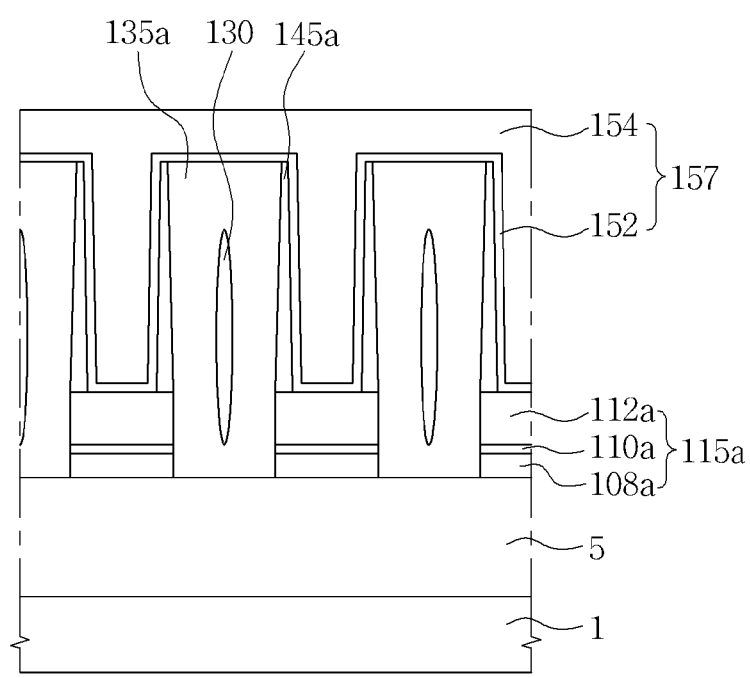

Referring to FIGS. 1 and 15G, an upper conductive layer 157 may be formed on the substrate having the spacers 145a. The upper conductive layer 157 may be formed of a single layer or multiple layers. When the upper conductive layer 157 is formed of multiple layers, the forming of the upper conductive layer 157 may include conformally forming a first upper conductive layer 152 on the substrate having the spacers 145a, and forming a second upper conductive layer 154 filling the modified openings 140a on the first upper conductive layer 152. The upper conductive layer 157 may be formed to include one of aluminum, aluminum composite, tungsten, and copper. For example, the forming of the upper conductive layer 157 may include forming a barrier layer 152 such as a tantalum layer, and forming a copper layer 154 having lower resistivity than the lower conductive patterns 115 on the barrier layer 152.

The upper conductive layer 157 may be formed using one of a physical vapor deposition (PVD) method, a CVD method, and an electroplating method. When the upper conductive layer 157 is formed by the PVD method, for example, a sputtering deposition method, the upper conductive layer 157 may fill the modified openings 140a in which the spacers 145a are formed, without defect. For example, because the widths of the openings 140a modified by the spacers 145a are formed gradually increase toward an upper part, the upper conductive layer 157 may fill the modified openings 140a, without defects occurring, using a sputtering deposition method. Here, defects may be undesired voids formed because the upper conductive layer 157 does not fill some part of the modified openings 140a.

Figure 15H:
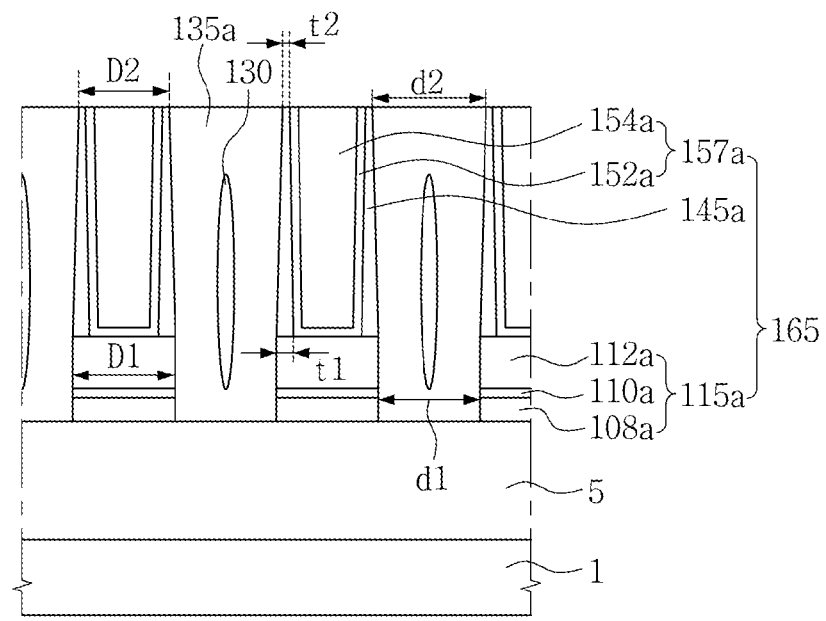

Referring to FIGS. 1, 10, and 15H, upper conductive patterns 157a confined within the openings 140a may be formed by planarizing the upper conductive layer 157 until the interlayer insulating patterns 135a are exposed (S40). Each of the upper conductive patterns 157a may include a second upper conductive pattern 154a, and a first upper conductive pattern 152a covering bottom and side surfaces of the second upper conductive pattern 154a.

The lower conductive patterns 115a, the upper conductive patterns 157a formed on the lower conductive patterns 115a, and the spacers 145a formed on the side surfaces of the upper conductive patterns 157a may constitute interconnection structures 165.

Referring again to FIG. 6, an upper insulating layer 70 may be formed on the substrate having the interconnection structures 165.

Next, another method of fabricating a semiconductor device in accordance with the inventive concept will be described with reference to FIGS. 1, 10, and 16A to 16C.

Figure 16A:
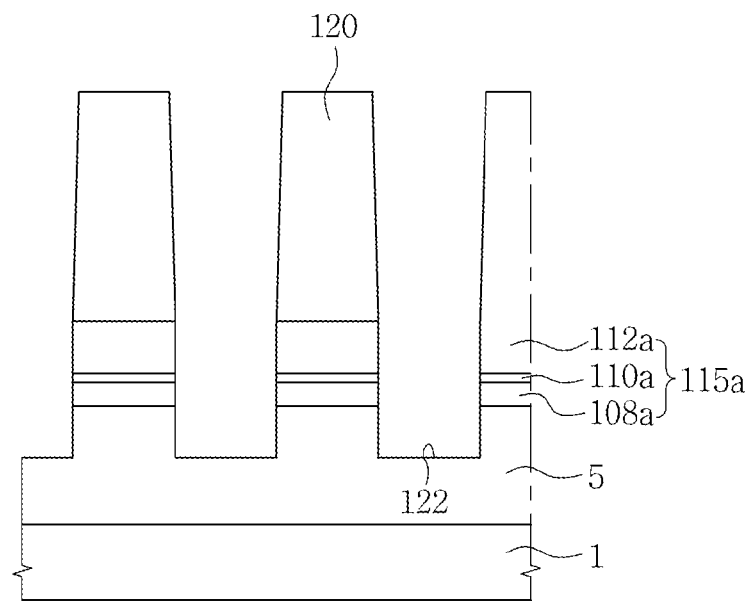
FIGS. 16A to 16D are cross-sectional views, taken in the direction of line I-I' in FIG. 1, showing another an example of the method of fabricating a semiconductor device in accordance with the inventive concept.

Referring to FIGS. 1, 10, and 16A, a lower insulating layer 5 may be formed on a substrate 1 (S5). A lower conductive layer may be formed on the lower insulating layer 5 (S10). Sacrificial mask patterns 120 may be formed on the lower conductive layer (S15). The sacrificial mask patterns 120, as described with reference to FIG. 15A, may have inclined sides so that the widths of the sacrificial mask patterns 120 increase toward lower parts from upper parts.

The lower conductive layer may be etched using the sacrificial mask patterns 120 as an etch mask, to form lower conductive patterns 115a (S20). Furthermore, the lower insulating layer 5 may be partially etched using the sacrificial mask patterns 120 as an etch mask, to form recessed areas 122 in the lower insulating layers 5.

Figure 16B:
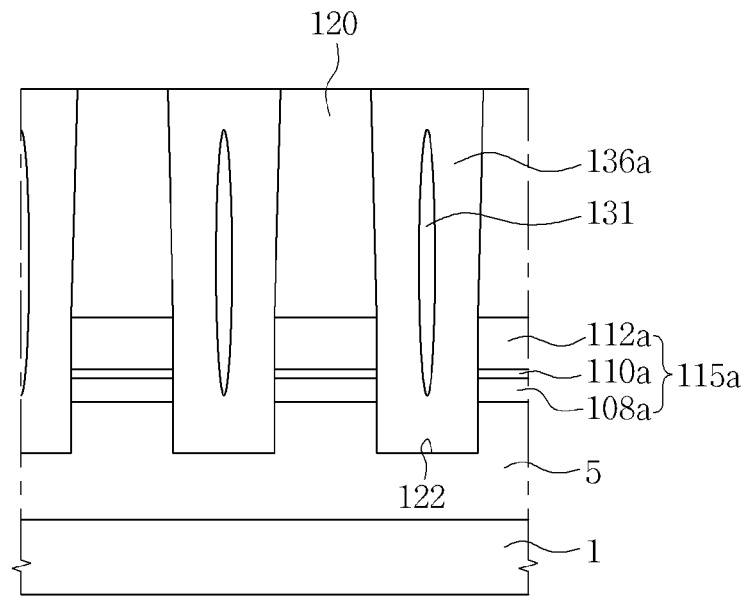

Referring to FIGS. 1, 10, and 16B, an interlayer insulating layer may be formed on the substrate having the recessed areas 122 (S25). Then, the interlayer insulating layer may be planarized until the sacrificial mask patterns 120 are exposed, to form interlayer insulating patterns 136a (S30).

In some embodiments, air gaps 131 may be formed in the interlayer insulating patterns 136a. The air gaps 131 may include a portion disposed between the sacrificial mask patterns 120 and a portion disposed between the lower conductive patterns 115a.

Figure 16C:
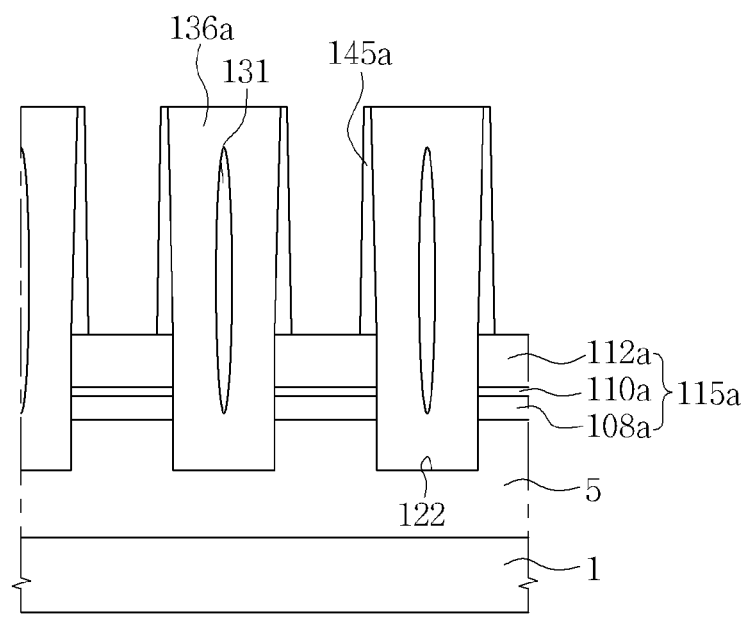

Referring to FIGS. 1 and 16C, the exposed sacrificial mask patterns 120 may be selectively removed to form openings (S35). The openings may narrow toward an upper part from a lower part.

Next, spacers 145a, as described with reference to FIG. 15F, may be formed on sidewalls of the openings. Widths of the spacers 145a may increase toward a lower part from an upper part.

Figure 16D:
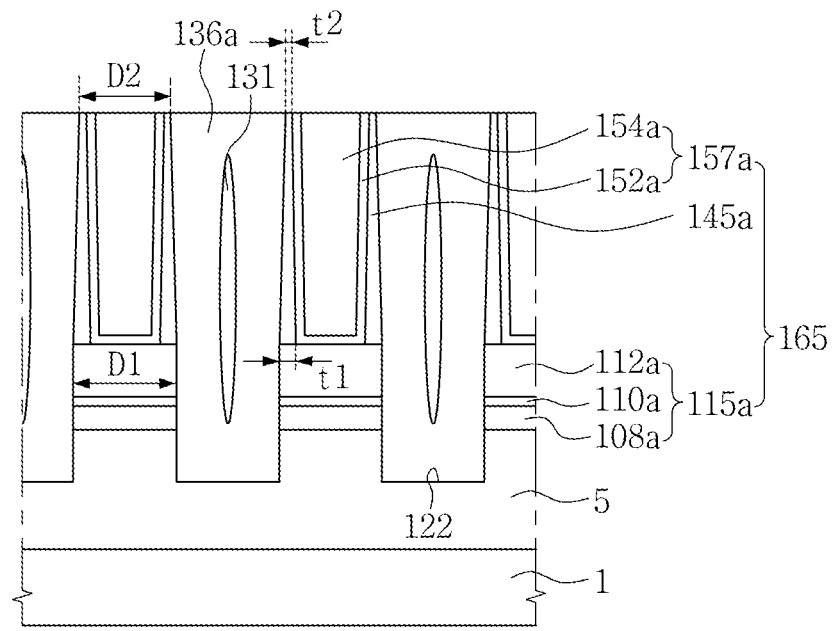

Referring to FIGS. 1, 10, and 16D, an upper conductive layer may be formed on the substrate having the spacers 145a. The upper conductive layer is substantially the same material as the upper conductive layer 57 described with reference to FIG. 13D. Upper conductive patterns 157a confined within the openings may be formed by planarizing the upper conductive layer until the interlayer insulating patterns 136a are exposed.

Next, another method of fabricating a semiconductor device in accordance with the inventive concept will be described with reference to FIGS. 1, 10, and 17A to 17G.

Figure 17A:
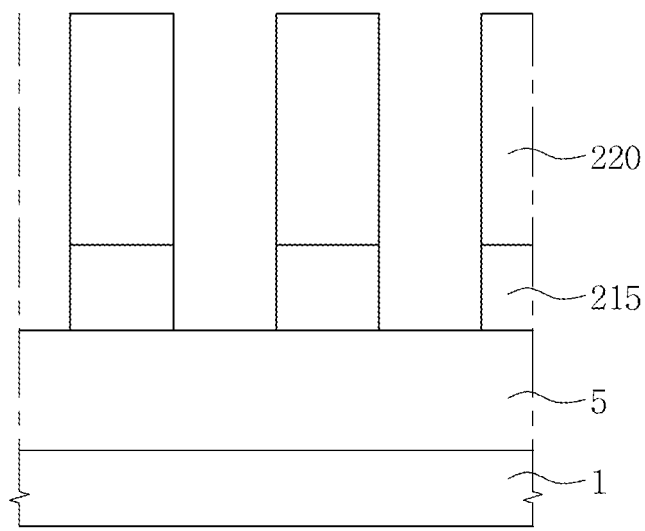
FIGS. 17A to 17G are cross-sectional views, taken in the direction of line I-I' in FIG. 1, showing another an example of the method of fabricating a semiconductor device in accordance with the inventive concept.

Referring to FIGS. 1, 10, and 17A, a lower insulating layer 5 may be formed on a substrate 1 (S5). A lower conductive layer may be formed on the lower insulating layer 5 (S10). Sacrificial mask patterns 220 may be formed on the lower conductive layer (S15). The sacrificial mask patterns 220, in a plan view, may have line shapes spaced apart from each other. The lower conductive layer may be etched using the sacrificial mask patterns 220 as an etch mask, to form lower conductive patterns 215.

Figure 17B:
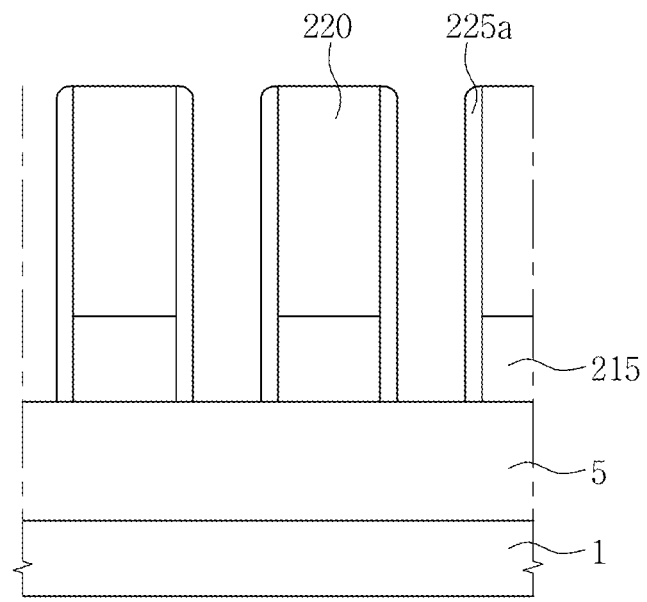

Referring to FIGS. 1, and 17B, spacers 225a may be formed on sides of the lower conductive patterns 215 and sacrificial mask patterns 220. The formation of the spacers 225a may include forming a spacer layer on the substrate having the sacrificial mask patterns 220 and the lower conductive patterns 215, and isotropically etching the spacer layer.

The spacers 225a may be formed of an insulating material. The spacers 225a may be formed of an insulating material having etch selectivity with respect to the sacrificial mask patterns 220. For example, when the sacrificial mask patterns 220 are formed of an amorphous carbon layer or a stacked amorphous carbon layer and silicon layer, the spacers 225a may be formed of silicon nitride.

Figure 17C:
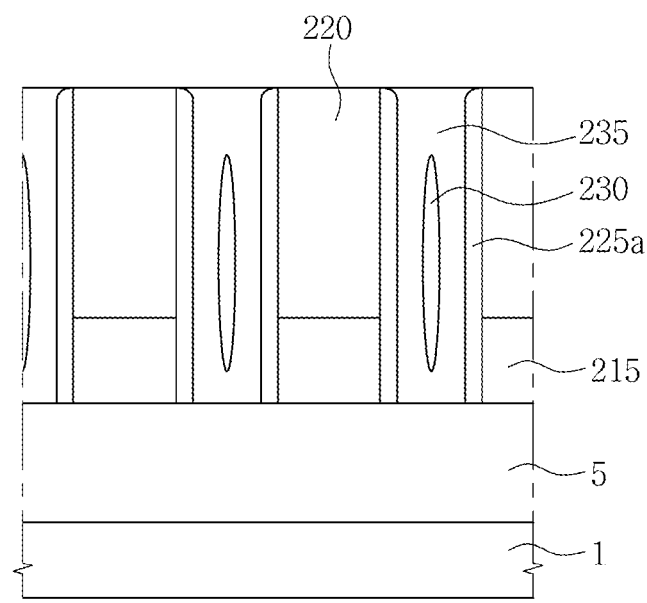

Referring to FIGS. 1, 10, and 17C, an interlayer insulating layer may be formed on the substrate having the spacers 225a. The interlayer insulating layer may include air gaps 230 disposed between sides of the lower conductive patterns 215 and between sides of the sacrificial mask patterns 220. The air gaps 230 may be located at a lower level than upper surfaces of the sacrificial mask patterns 220 and spaced apart from the spacers 225a. The interlayer insulating layer may be formed of a material having etch selectivity with respect to the spacers 225a and sacrificial mask patterns 220. For example, the spacers 225a may be formed of silicon nitride, the sacrificial mask patterns 220 may be formed of an amorphous carbon layer, and the interlayer insulating layer may be formed of silicon oxide or a low-k dielectric material.

Next, interlayer insulating patterns 235 may be formed by planarizing the interlayer insulating layer until the sacrificial mask patterns 220 are exposed (S30). The air gaps 230 may be located inside the interlayer insulating patterns 235.

Figure 17D:
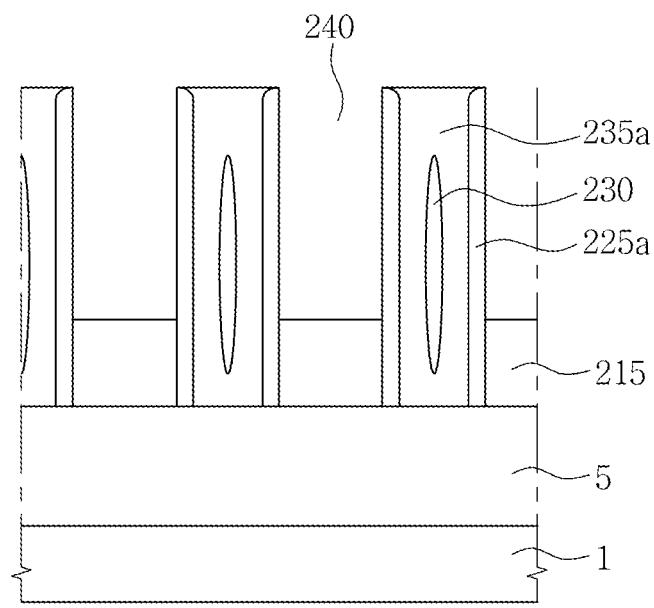

Referring to FIGS. 1, 10 and 17D, openings 240 may be formed by selectively etching and removing the exposed sacrificial mask patterns 220 (S35).

Figure 17E:
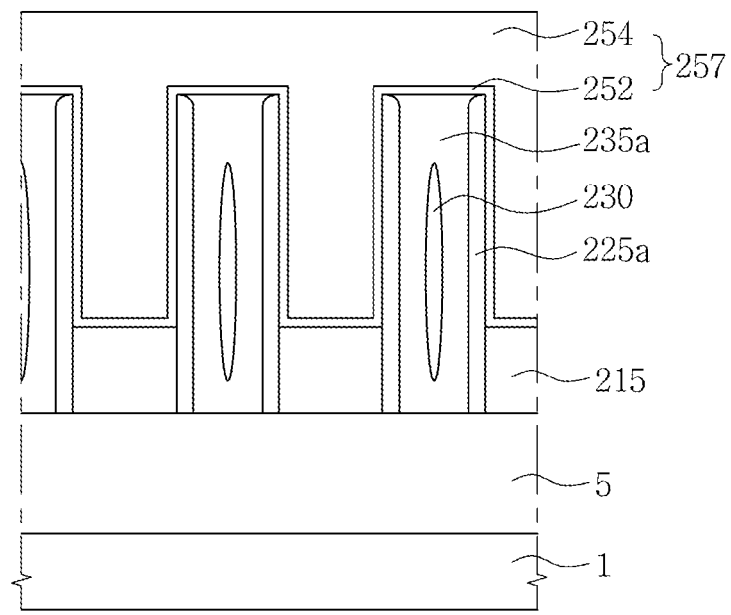

Referring to FIGS. 1 and 17E, an upper conductive layer 257 may be formed on the substrate having the openings 240. The formation of the upper conductive layer 257 may include conformally forming a first upper conductive layer 252 on the substrate having the openings 240, and forming a second upper conductive layer 254 filling the openings 240 on the first upper conductive layer 252.

The upper conductive layer 257 may include a conductive material having lower resistivity than the lower conductive patterns 215. For example, the lower conductive patterns 215 may include a refractory metal, silicon nitride, or polysilicon, and the upper conductive layer 257 may include a metal, such as copper or aluminum, having lower resistivity than the lower conductive layer 215.

Figure 17F:
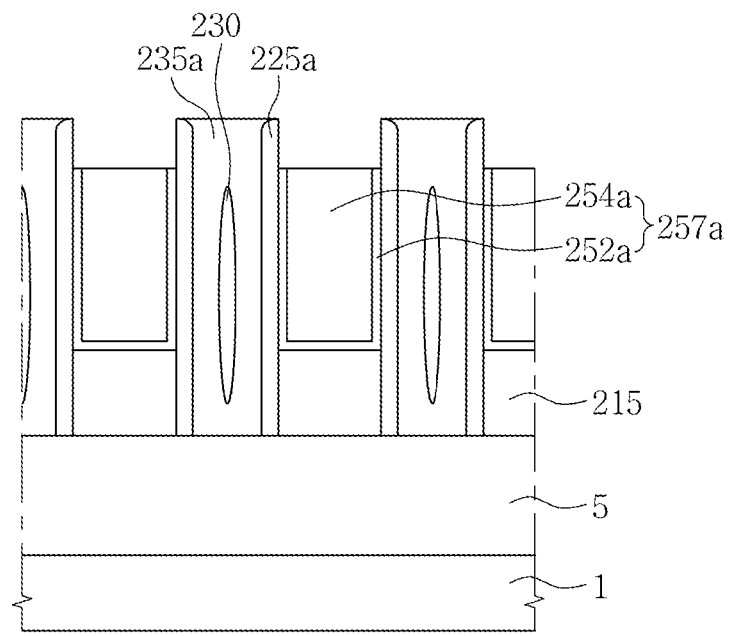

Referring to FIGS. 1, 10, and 17F, upper conductive patterns 257a may be formed in the openings 240 (S40). The upper conductive patterns 257a may be formed to partially fill the openings 240. The upper conductive patterns 257a may be located at a lower level than upper surfaces of the interlayer insulating patterns 235.

The formation of the upper conductive patterns 257a may include planarizing the upper conductive layer 257 until the interlayer insulating patterns 235 are exposed, and partially etching the planarized upper conductive layer 257. The planarization may be performed by a CMP process and/or an etchback process. For example, the formation of the upper conductive patterns 257a may include planarizing the upper conductive layer 257 using the CMP process until the interlayer insulating patterns 235 are exposed, and partially etching the planarized upper conductive layer 257 using the etchback process. Alternatively, the formation of the upper conductive patterns 257a may include etching the upper conductive layer 257 using the etchback process so that upper surfaces of the interlayer insulating patterns 235 are exposed and the upper conductive layer 257 partially fill the openings 240.

Figure 17G:
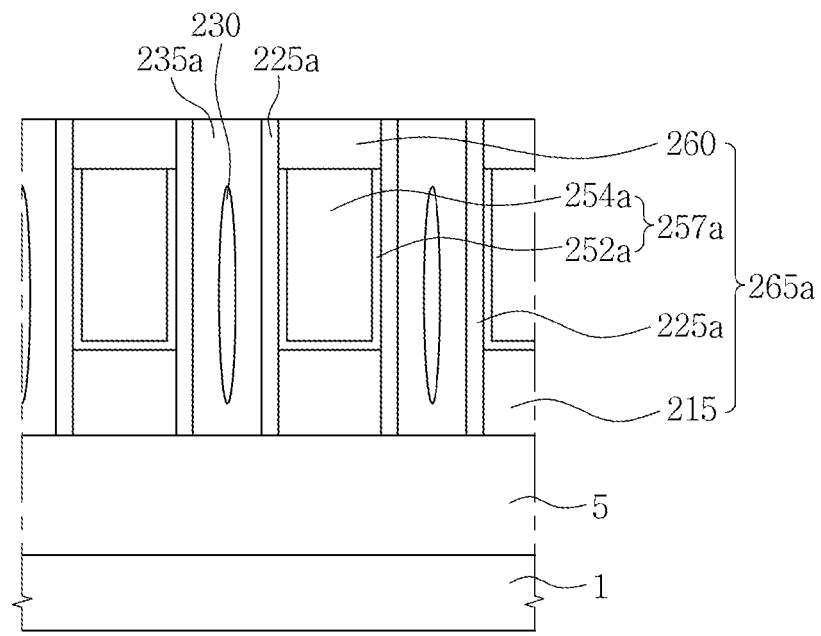

Referring to FIGS. 1 and 17G, capping patterns 260 filling the rest of the openings 240 may be formed on the upper conductive patterns 257a. The capping patterns 260 may be formed of an insulating material. The capping patterns 260 may be formed of an insulating material having etch selectivity with respect to the interlayer insulating patterns 235. For example, the capping patterns 260 may be formed of silicon nitride.

The lower conductive patterns 215, the upper conductive patterns 257a, and the capping patterns 260 may be sequentially stacked. The spacers 225a may cover sides of the lower conductive patterns 215, upper conductive patterns 257a, and capping patterns 260. The lower conductive patterns 215, the upper conductive patterns 257a, the capping patterns 260, and the spacers 225a may configure interconnection structures 265a.

Next, another method of fabricating a semiconductor device in accordance with the inventive concept will be described with reference to FIGS. 1, 10, and 18A to 18D.

Figure 18A:
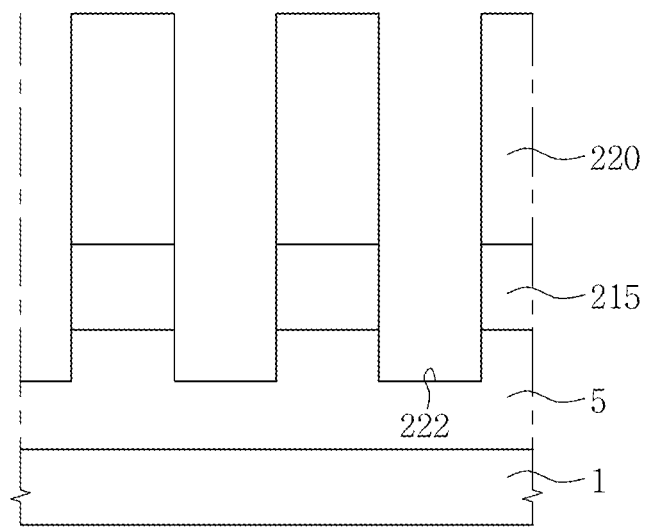
FIGS. 18A to 18E are cross-sectional views, taken in the direction of line I-I' in FIG. 1, showing another example of the method of fabricating a semiconductor device in accordance with the inventive concept.

Referring to FIGS. 1, 10, and 18A, a lower insulating layer 5 may be formed on a substrate 1 (S5). A lower conductive layer may be formed on the lower insulating layer 5 (S10). Sacrificial mask patterns 220 may be formed on the lower conductive layer (S15). The lower conductive layer may be etched using the sacrificial mask patterns 220 as an etch mask, to form lower conductive patterns 215 (S20). Further, the lower insulating layer 5 may be partially etched using the sacrificial mask patterns 220 as an etch mask, to form recessed areas 222 in the lower insulating layers 5. The sacrificial mask patterns 220, in a plan view, may have line shapes spaced apart from each other.

Figure 18B:
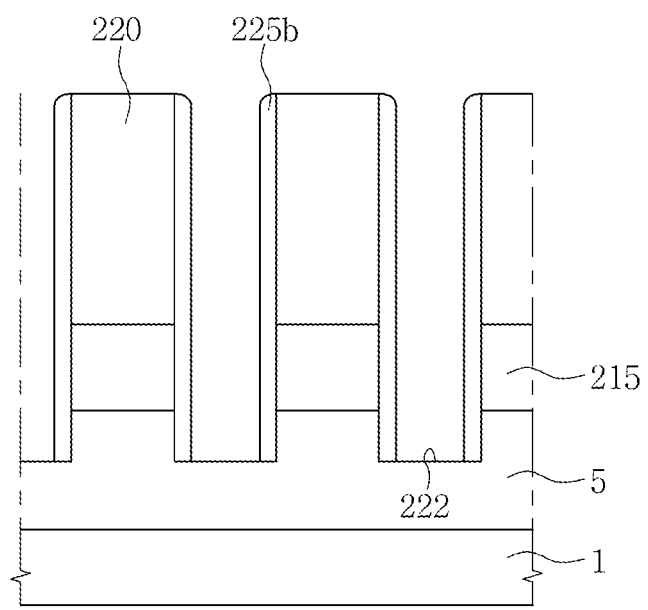

Referring to FIGS. 1, 10, and 18B, spacers 225b which cover sides of the sacrificial mask patterns 220, sides of the lower conductive patterns 215, and sides of the recessed areas 222, may be formed. The formation of the spacers 225b may include forming a spacer layer on the substrate having the recessed areas 222, and isotropically etching the spacer layer. The spacers 225b may be formed of a material having etch selectivity with respect to the sacrificial mask patterns 220. The lower ends of the spacers 225b may be located at a lower level than the lower conductive patterns 215.

Figure 18C:
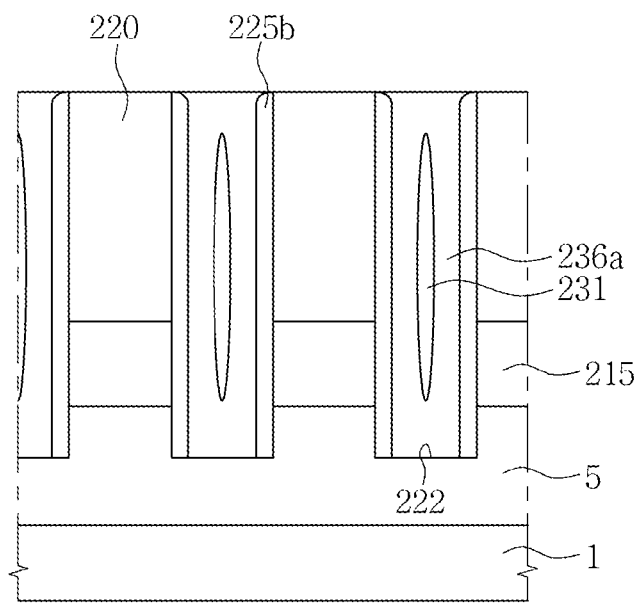

Referring to FIGS. 1, 10, and 18C, an interlayer insulating layer may be formed on the substrate having the spacers 225b (S25). Air gaps 231 spaced apart from the spacers 225b and located at a lower level than upper surfaces of the sacrificial mask patterns 220, may be formed in the interlayer insulating layer. The interlayer insulating layer may be planarized until the sacrificial mask patterns 220 are exposed, to form interlayer insulating patterns 236a (S30).

Figure 18D:
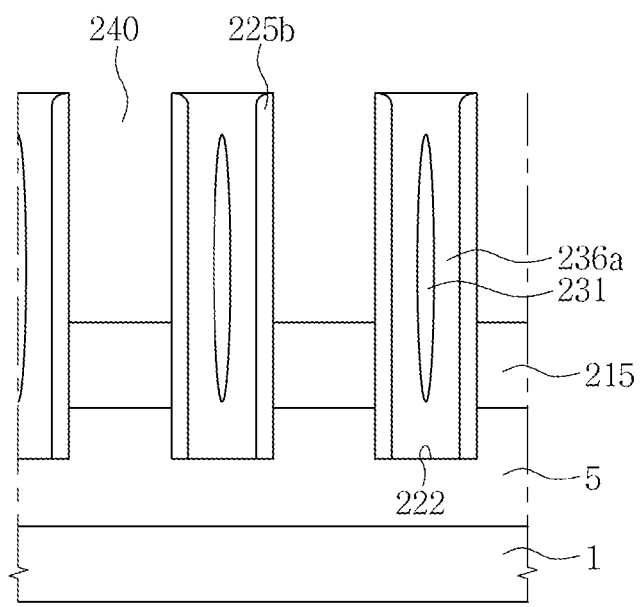

Referring to FIGS. 1, 10, and 18D, the exposed sacrificial mask patterns 120 may be selectively etched and removed to form openings 240 (S35).

Figure 18E:
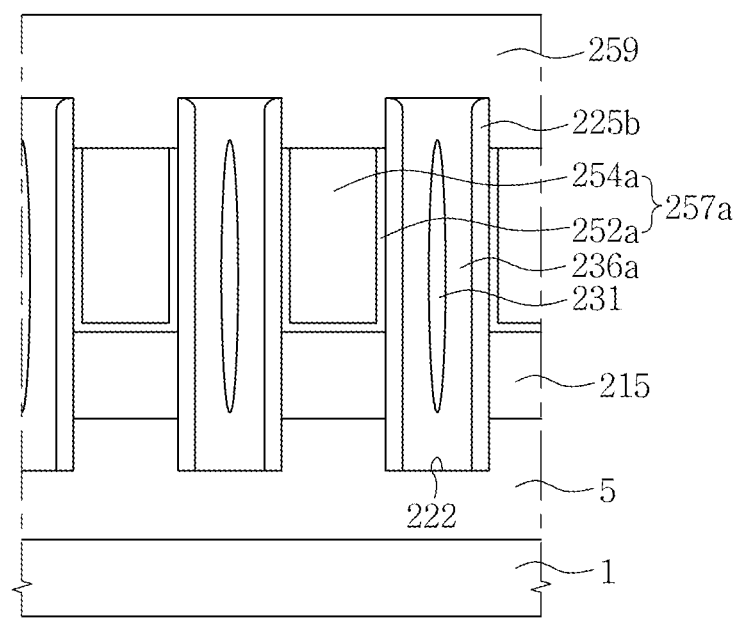

Referring to FIGS. 1, 10, and 18E, as shown in FIGS. 17E and 17F, upper conductive patterns 257a partially filling the openings 240 may be formed (S40). A capping layer 259 may be formed on the substrate having the upper conductive patterns 257a. The capping layer 259 may be formed of a material having etch selectivity with respect to the interlayer insulating patterns 236. For example, the capping layer 259 may be formed of silicon nitride.

Referring again to FIG. 9, the capping layer 259 may be planarized until the interlayer insulating patterns 236 are exposed, to form capping patterns filling the rest of the openings 240 on the upper conductive patterns 257a.

Next, examples of another embodiment of a semiconductor device in accordance with the inventive concept will be described with reference to FIGS. 19 to 22. In each of FIGS. 20 to 22, the portion denoted by character A is a cross section taken along line II-II' in FIG. 19, and the portion denoted by character B is a cross section taken along line III-III' in FIG. 19.

Figure 19:
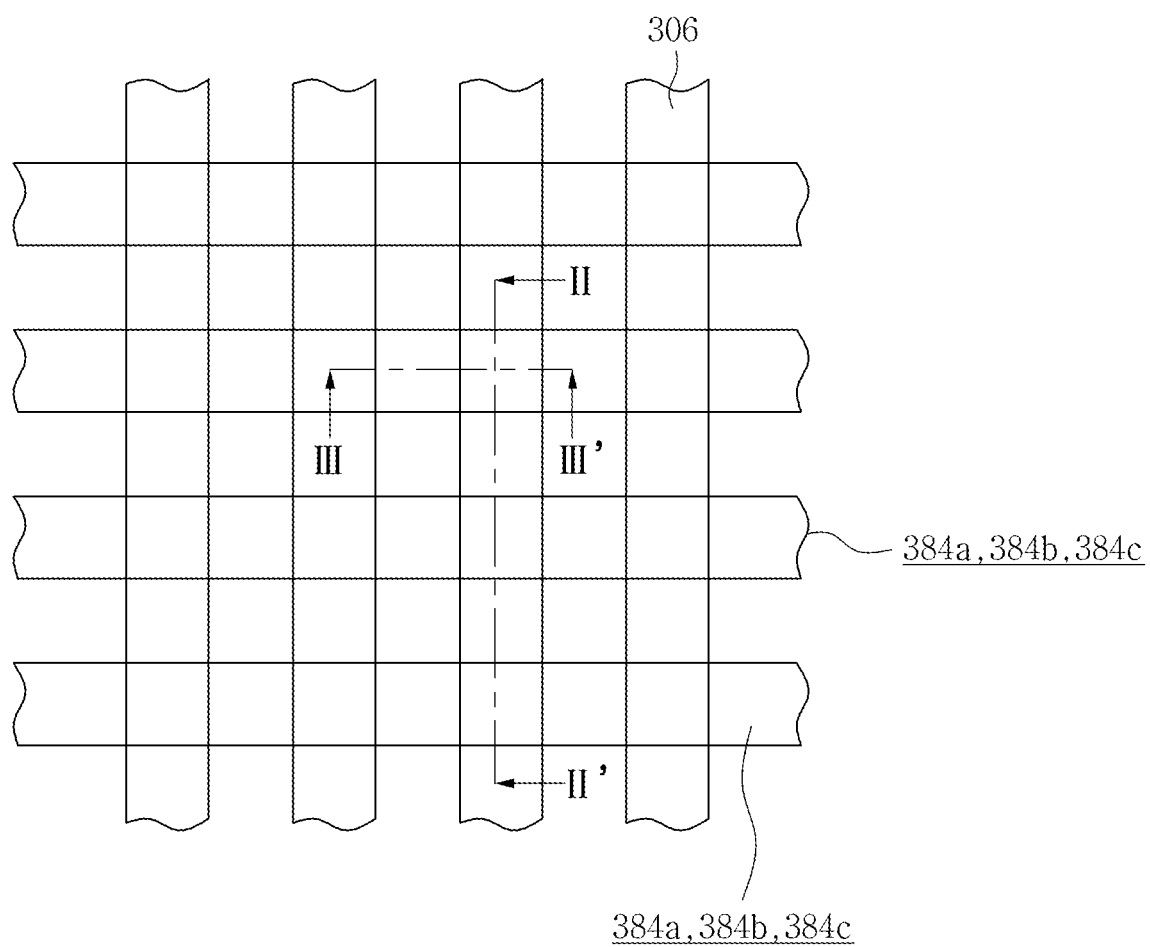
FIG. 19 is a plan view of the layout of a second embodiment of a semiconductor device, that may be exemplified in various ways, in accordance with the inventive concept.
Figure 20:
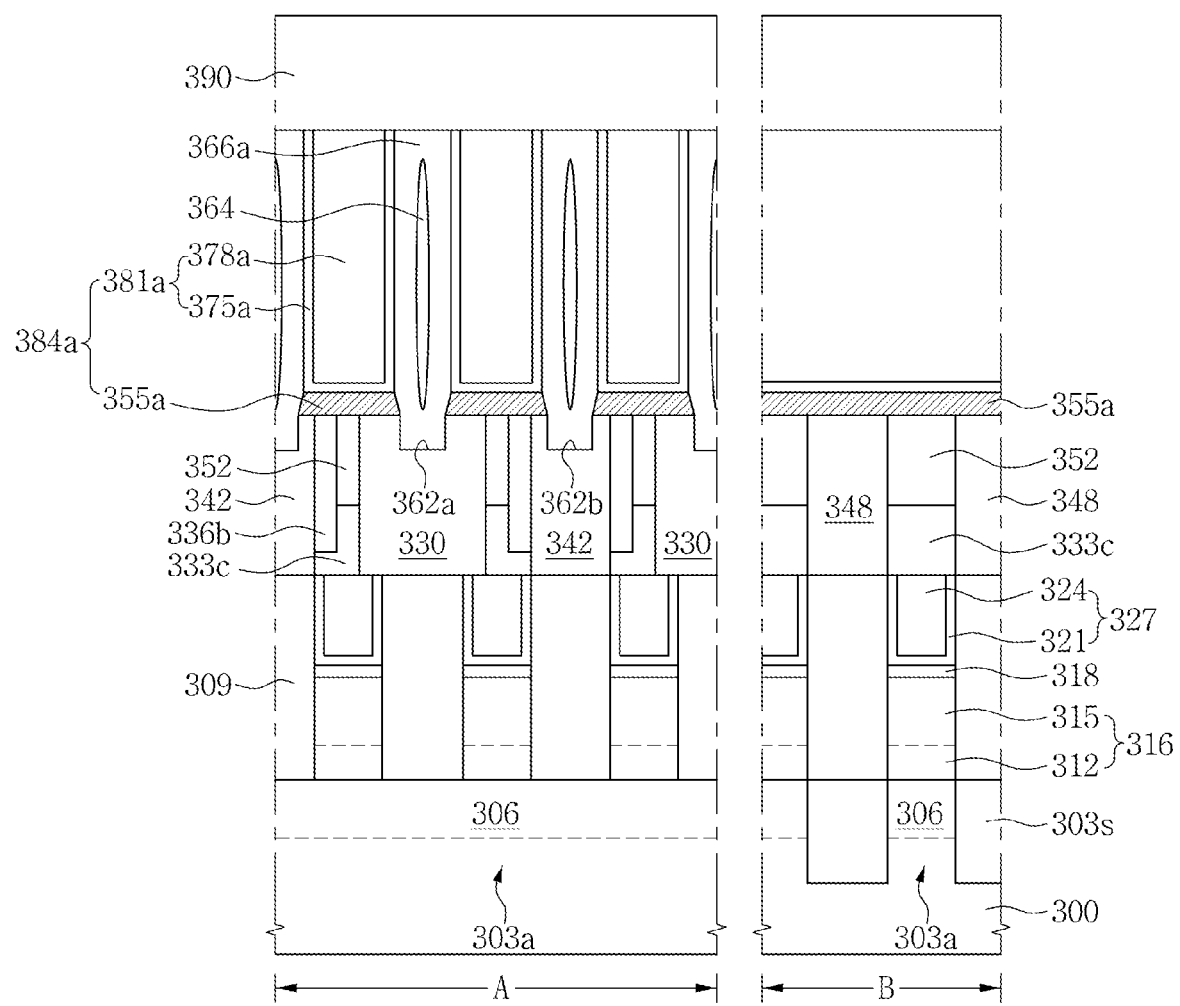
FIG. 20 is a cross-sectional view showing a semiconductor device in accordance with the second embodiment of the inventive concept.

First, referring to FIGS. 19 and 20, a substrate 300 may be provided. The substrate 300 may be a semiconductor substrate. Device isolation regions 303s defining active regions 303a may be formed in the substrate 300. The active regions 303a may have line shapes, in a plan view.

Word lines 306 may be formed in the active regions 303a. Semiconductor patterns 316 may be formed on the word lines 306. An upper semiconductor region 315 and a lower semiconductor region 312 which constitute a diode may be formed in the semiconductor patterns 316. The upper semiconductor region 315 may be a p-type semiconductor region, and the lower semiconductor region 312 may be an n-type semiconductor region. Conductive contact structures 327 may be formed on the semiconductor patterns 316. A metal-semiconductor composite such as a metal silicide layer 318 may be interposed between the contact structures 327 and the semiconductor patterns 316. An interlayer insulating layer 309 may be formed to surround sides of the semiconductor patterns 316 and contact structures 327.

Sequentially stacked lower electrodes 333c and information storage patterns 352 may be formed on the contact structures 327. The lower electrodes 333c may be electrically connected to the contact structures 327. The lower electrodes 333c may include one of Ti, TiN, TiAlN, TiCN, TiSiN, TiON, Ta, TaN, TaAlN, TaCN, TaSiN, C, CN, CoSi, CoSiN, W, WN, WSi, WSiN, and Ni. The information storage patterns 352 may include a phase change material. For example, the information storage patterns 352 may include GeSbTe, GeTeAs, SnTeSn, GeTe, SbTe, SeTeSn, GeTeSe, SbSeBi, GeBiTe, GeTeTi, InSe, GaTeSe, or InSbTe. Alternatively, the information storage patterns 352 may include a layer selected from the group consisting of a GeSbTe layer, a GeTeAs layer, an SnTeSn layer, a GeTe layer, an SbTe layer, an SeTeSn layer, a GeTeSe layer, an SbSeBi layer, a GeBiTe layer, a GeTeTi layer, an InSe layer, a GaTeSe layer, and an InSbTe layer, and one element selected from a group consisting of C, N, Si, O, and N.

Insulating molding patterns 330, 342, and 348 may be formed on sides of the lower electrodes 333c and information storage patterns 352. The molding patterns may include first to third molding patterns 330, 342, and 348 confining the lower electrodes 333c and the information storage patterns 352. For example, the first and second molding patterns 330 and 342 may be provided to face each other across the lower electrodes 333c and the information storage patterns 352, and the third molding patterns 348 may be located between the first and second molding patterns 330 and 342. In addition, the third molding patterns 348 may be spaced apart from each other. Accordingly, the lower electrodes 333c and the information storage patterns 352 may be surrounded by the first to third molding patterns 330, 342, and 348. An insulating pattern 336b interposed between the second molding pattern 342 and the information storage pattern 352 may be formed.

Sequentially stacked lower conductive patterns 355a and upper conductive patterns 381a may be formed on the information storage patterns 352. The lower and upper conductive patterns 355a and 381a may constitute interconnection structures 384a. The interconnection structures 384a, in a plan view, may have line shapes. In the interconnection structures 384a, the lower conductive patterns 355a may serve as upper electrodes, and the upper conductive patterns 381a may serve as bit lines. The lower conductive patterns 355a may have a side more gently sloped than a side of the upper conductive patterns 381a. The lower conductive patterns 355a may include one of Ti, TiN, TiAlN, TiCN, TiSiN, TiON, Ta, TaN, TaAlN, TaCN, TaSiN, C, CN, CoSi, CoSiN, W, WN, WSi, WSiN, and Ni. The upper conductive patterns 381a may include a conductive material having lower resistivity than the lower conductive patterns 355a. For example, the upper conductive patterns 381a may include aluminum or copper.

Each of the upper conductive patterns 381a may include a second upper conductive pattern 378a, and a first upper conductive pattern 375a covering side and bottom surfaces of the second upper conductive pattern 378a. The second upper conductive pattern 378a may be formed of a material having lower resistivity, such as copper or aluminum, than the lower conductive patterns 355a, and the first upper conductive pattern 375a may be formed of a refractory metal such as tantalum, or a metal nitride such as TiN.

Interlayer insulating patterns 366 interposed between the interconnection structures 384a may be formed. The interlayer insulating patterns 366 may include portions extending into the molding patterns 330 and 342. Recessed areas 362a and 362b may be formed on upper surfaces of the first and second molding patterns 330 and 342 which are facing each other among the molding patterns 330, 342, and 348. Lower ends of the interlayer insulating patterns 366 may fill the recessed areas 362a and 362b. Each of the interlayer insulating patterns 366 may have an upper width greater than a lower width. The interlayer insulating patterns 366 may have a width in a part located between the upper conductive patterns 381a greater than a width in a part located in the recessed areas 362a and 362b. Air gaps 364 may be formed in the interlayer insulating patterns 366.

An upper insulating layer 390 covering the interlayer insulating patterns 366 and the interconnection structures 384a may be formed.

Figure 21:
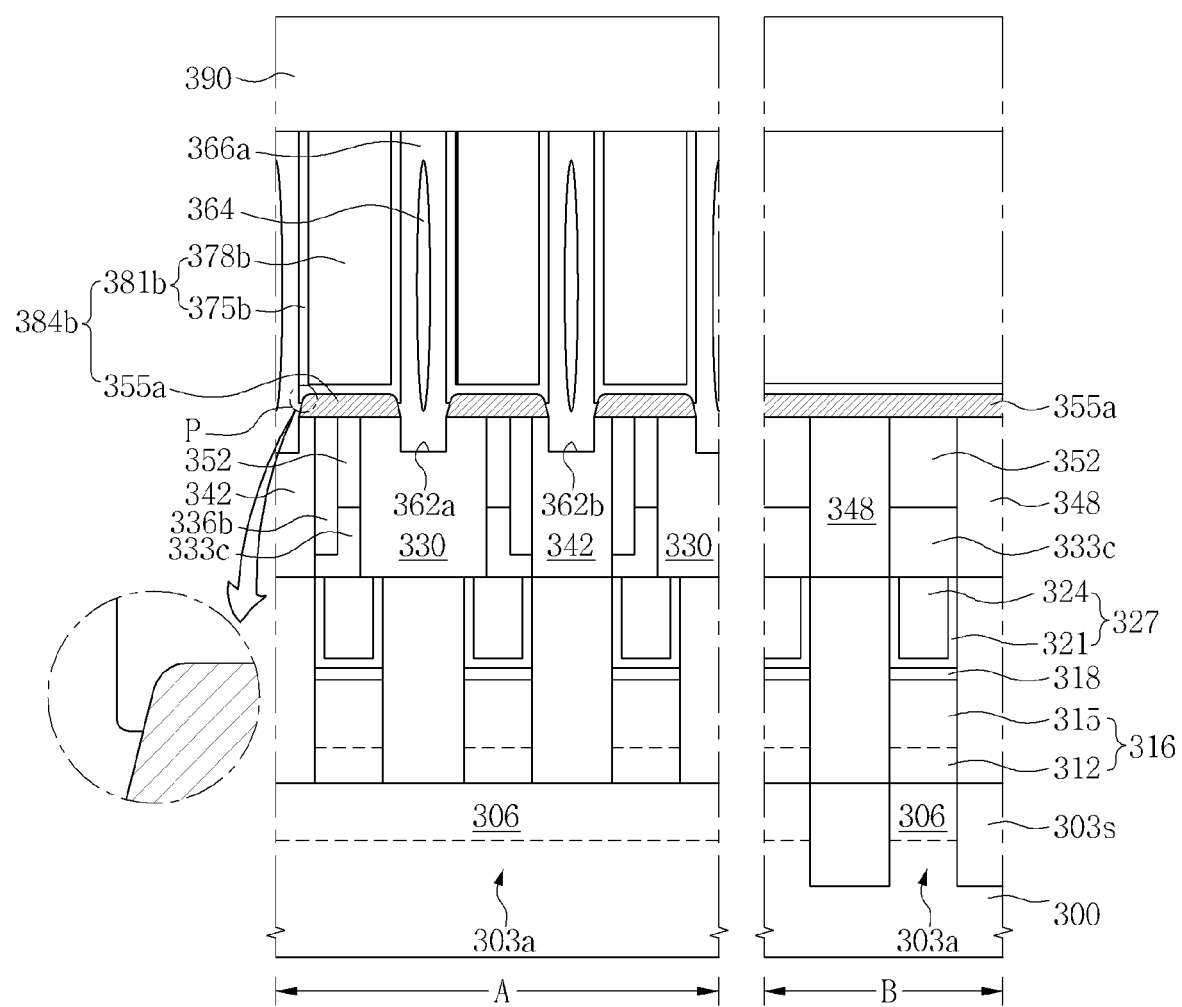
FIG. 21 is a cross-sectional view showing another example of a semiconductor device in accordance with the second embodiment of the inventive concept.

In another example shown in FIG. 21, upper conductive patterns 381b contacting upper surfaces and upper side surfaces of the lower conductive patterns 355a may be formed on the lower conductive patterns 355a. Each of the upper conductive patterns 381b may include a second upper conductive pattern 378b, and a first upper conductive pattern 375b covering side and bottom surfaces of the second upper conductive pattern 378b. Accordingly, interconnection structures 384b including the upper conductive patterns 381b and the lower conductive patterns 355a may be formed.

Figure 22:
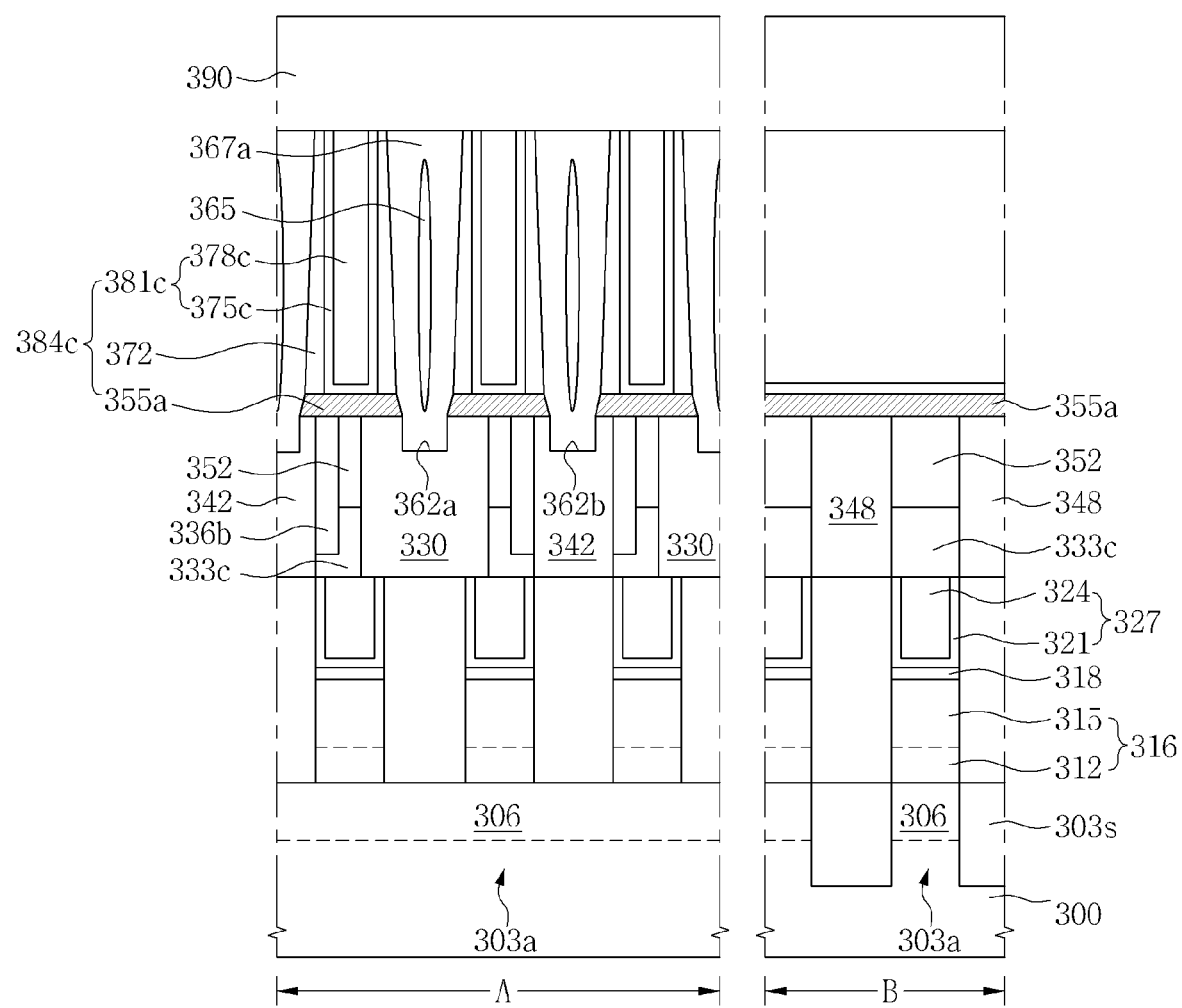
FIG. 22 is a cross-sectional view showing still another example of a semiconductor device in accordance with the second embodiment of the inventive concept.

In still another example as shown in FIG. 22, interconnection structures 384c including lower conductive patterns 355a, upper conductive patterns 381c which are formed on the lower conductive patterns 355a and have different upper and lower widths, and spacers 372 which are formed on the lower conductive patterns 355a and cover sides of the upper conductive patterns 381c, may be formed. Each of the interconnection structures 384c may have a lower width greater than an upper width in a part in which the upper conductive patterns 381c and the spacer 372 are located. Each of the interconnection structures 384c may have a width gradually increasing toward a lower surface from an upper surface in a part in which the spacer 372 is located. Each of the spacers 372 may have a width increasing toward a lower part from an upper part. Each of the upper conductive patterns 381c may include a second upper conductive pattern 378c, and a first upper conductive pattern 375c covering side and bottom surfaces of the second upper conductive pattern 378c. The spacers 372 may be formed of an insulating material such as silicon oxide, silicon nitride, or silicon oxynitride. Alternatively, the spacers 372 may be formed of a conductive material such as a metal or a metal nitride. Interlayer insulating patterns 367a may be formed between the modified interconnection structures 384c. Parts of the interlayer insulating patterns 367a located at the same level as the sacrificial mask patterns 358a may have sloped sides so that widths of the interlayer insulating patterns 367a become gradually smaller.

Next, a method of fabricating semiconductor devices of the second embodiment, in accordance with the inventive concept, will be described with reference to FIG. 19 and FIGS. 23A to 23M. In each of FIGS. 23A to 23M, the portion denoted by character A is taken in the same direction as line II-II' in FIG. 19, and the portion denoted by character B is taken in the same direction as line III-III' in FIG. 19.

Figure 23A:
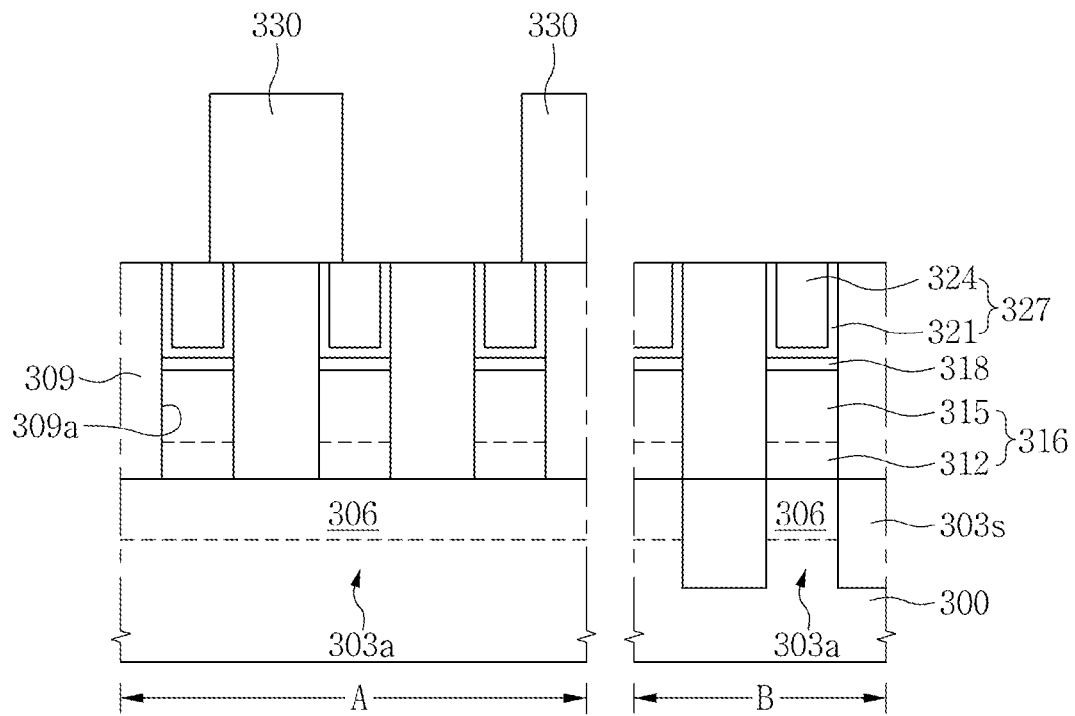
FIGS. 23A to 23M are cross-sectional views showing a second embodiment of a method of fabricating a semiconductor device in accordance with the inventive concept.

Referring to FIGS. 19 and 23A, a substrate 300 may be provided. The substrate 300 may be a semiconductor substrate. Device isolation regions 303s defining active regions 303a may be formed in the substrate 300. The active regions 303a may have line shapes in a plan view.

In the active regions 303a, lower impurity regions 306 having a different conductivity type from the active regions 303a may be formed. For example, the active regions 303a may have a p-type conductivity, and the lower impurity regions 306 may have an n-type conductivity. The lower impurity regions 306 may have line shapes in a plan view. The lower impurity regions 306 may serve as word lines of a memory device.

An interlayer insulating layer 309 may be formed on the substrate having the lower impurity regions 306. A plurality of holes 309a passing through the interlayer insulating layer 309 may be formed.

Semiconductor patterns 316 may be formed in the holes 309a. The semiconductor patterns 316 may be formed of crystalline silicon. Upper semiconductor regions 315 and lower semiconductor regions 312 may be formed in the semiconductor patterns 316. The upper and lower semiconductor regions 315 and 312 may be switching devices. For example, the upper and lower semiconductor regions 315 and 312 may be switching devices such as p-n diodes. For example, the upper semiconductor regions 315 may be p-type semiconductor regions, and the lower semiconductor regions 312 may be n-type semiconductor regions. The lower semiconductor regions 312 may form lower parts of the semiconductor patterns 316, and the upper semiconductor regions 315 may form upper parts of the semiconductor patterns 316.

Conductive contact structures 327 may be formed on the semiconductor patterns 316. The contact structures 327 may include contact patterns 324 and barrier layers 321 covering side and bottom surfaces of the contact patterns 324.

The semiconductor patterns 316 and the contact structures 327 may be sequentially stacked to fill the holes 309a.

A metal-semiconductor composite, for example, a metal silicide layer 318, may be formed between the contact structures 327 and the semiconductor patterns 316. For example, a metal silicide layer 318 may be formed on the semiconductor patterns 316, and then, the contact structures 327 may be formed.

First molding patterns 330 may be formed on the substrate having the contact structures 327. The first molding patterns 330 may have line shapes. Both sides of the first molding patterns 330 may be located on a pair of the contact structures 327 which are adjacent to each other. Some parts of the first molding patterns 330 may partially cover the pair of contact structures 327 which are adjacent to each other. Each of the first molding patterns 330 may have a width greater than a distance between the pair of contact structures 327 which are adjacent to each other.

The first molding patterns 330 may be formed of an insulating material. For example, the first molding patterns 330 may be formed of silicon oxide, silicon nitride, or silicon oxynitride.

Figure 23B:
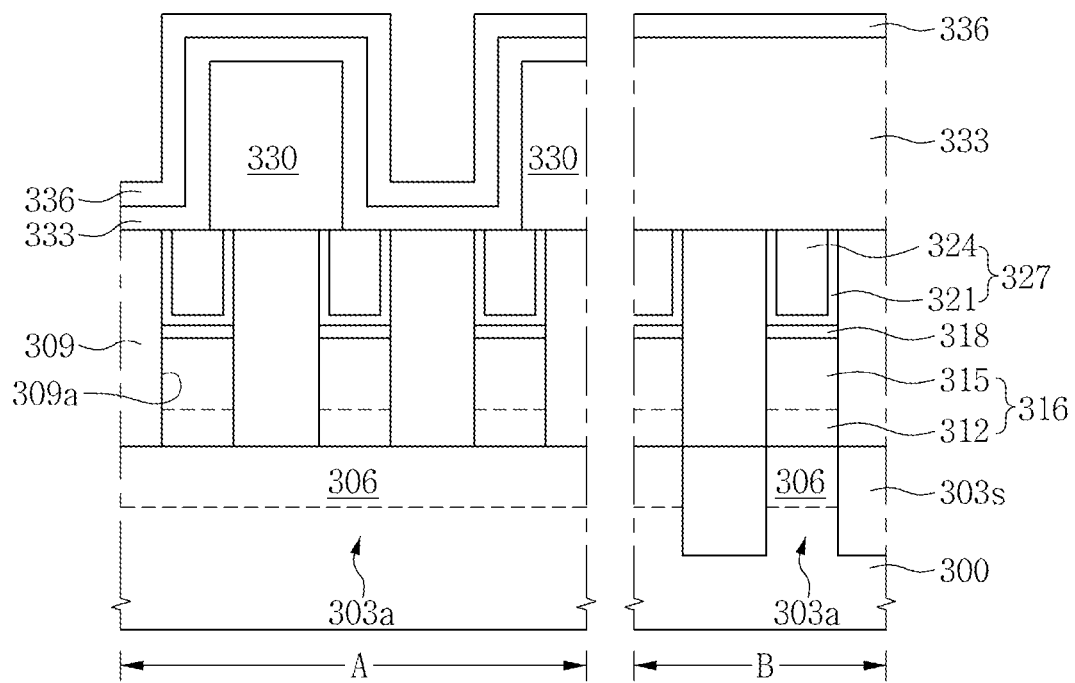

Referring to FIGS. 19 and 23B, a conductive layer 333 may be conformally formed on the substrate having the first molding patterns 330. An insulating layer 336 may be conformally formed on the conductive layer 333. The conductive layer 333 may include one of Ti, TiN, TiAlN, TiCN, TiSiN, TiON, Ta, TaN, TaAlN, TaCN, TaSiN, C, CN, CoSi, CoSiN, W, WN, WSi, WSiN, and Ni. The insulating layer 336 may be formed of silicon oxide, silicon nitride, or silicon oxynitride.

Figure 23C:
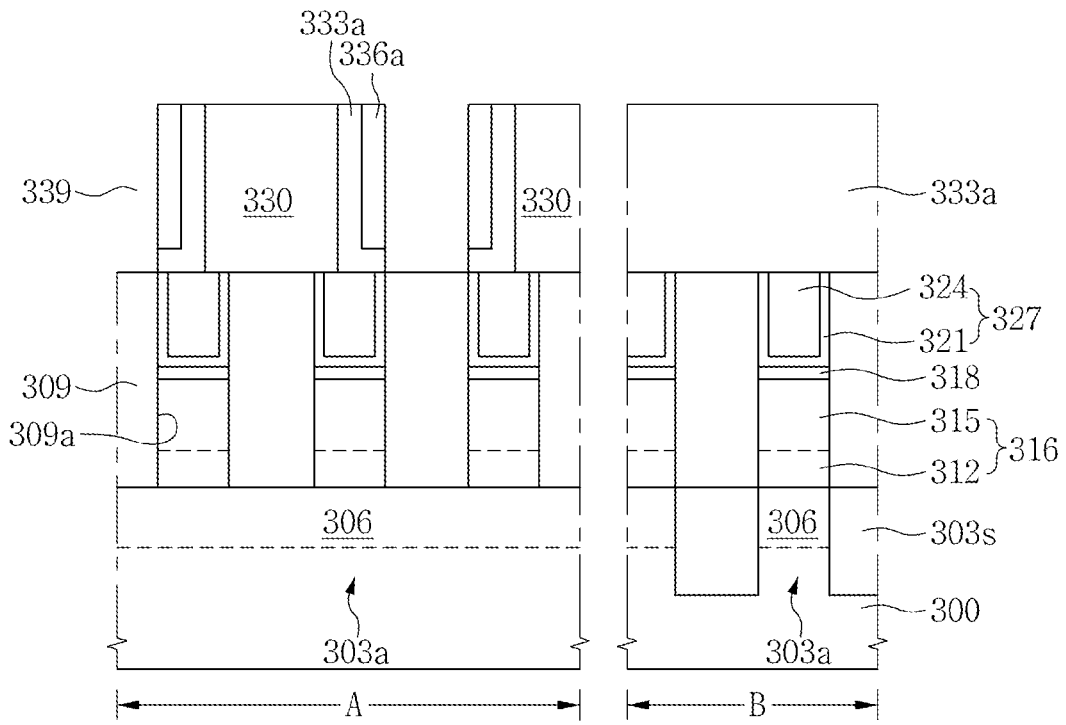

Referring to FIGS. 19 and 23C, a conductive pattern 333a and an insulating pattern 336a may be formed by isotropically etching the conductive layer 333 and the insulating layer 336.

Figure 23D:
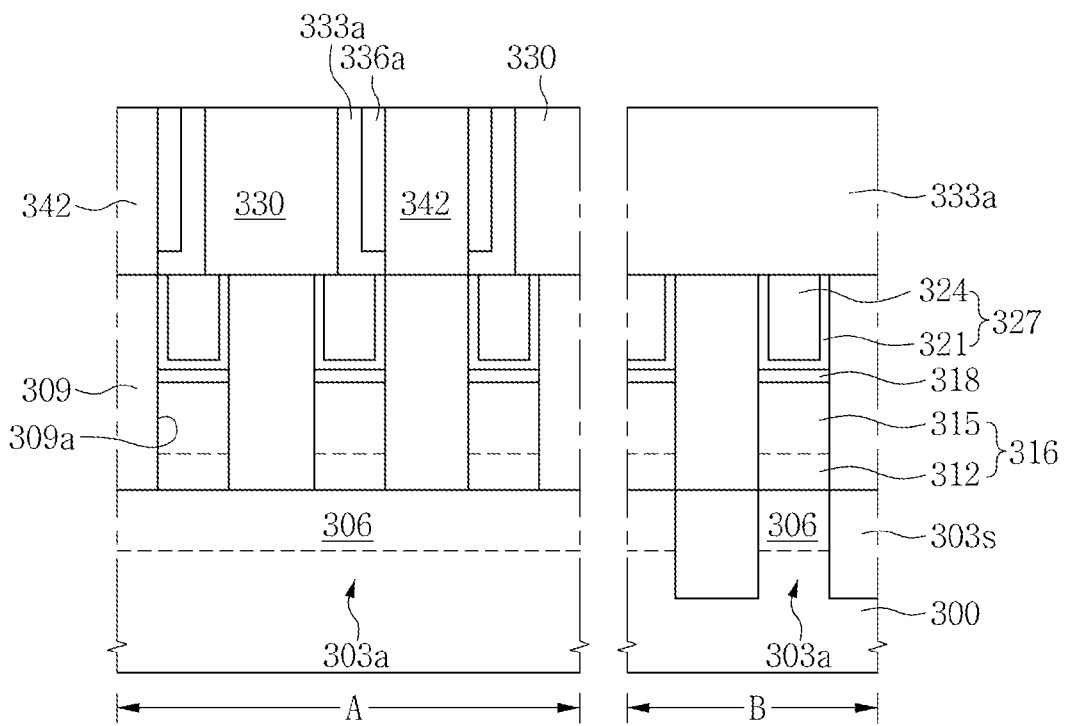

Referring to FIGS. 19 and 23D, a second molding layer may be formed on the substrate having the conductive pattern 333a and the insulating pattern 336a, and then, second molding patterns 342 may be formed by planarizing the second molding layer until the conductive pattern 333a and the insulating pattern 336a are exposed. The second molding patterns 342 may be formed between the first molding patterns 330. The conductive pattern 333a and the insulating pattern 336a may be interposed between the first molding patterns 330 and the second molding patterns 342. The second molding patterns 342 may be formed of an insulating material. For example, the second molding patterns 342 may be formed of silicon oxide, silicon nitride, or silicon oxynitride. The second molding patterns 342 may have line shapes.

The second molding patterns 342 may have a smaller width than the first molding patterns 330.

Figure 23E:
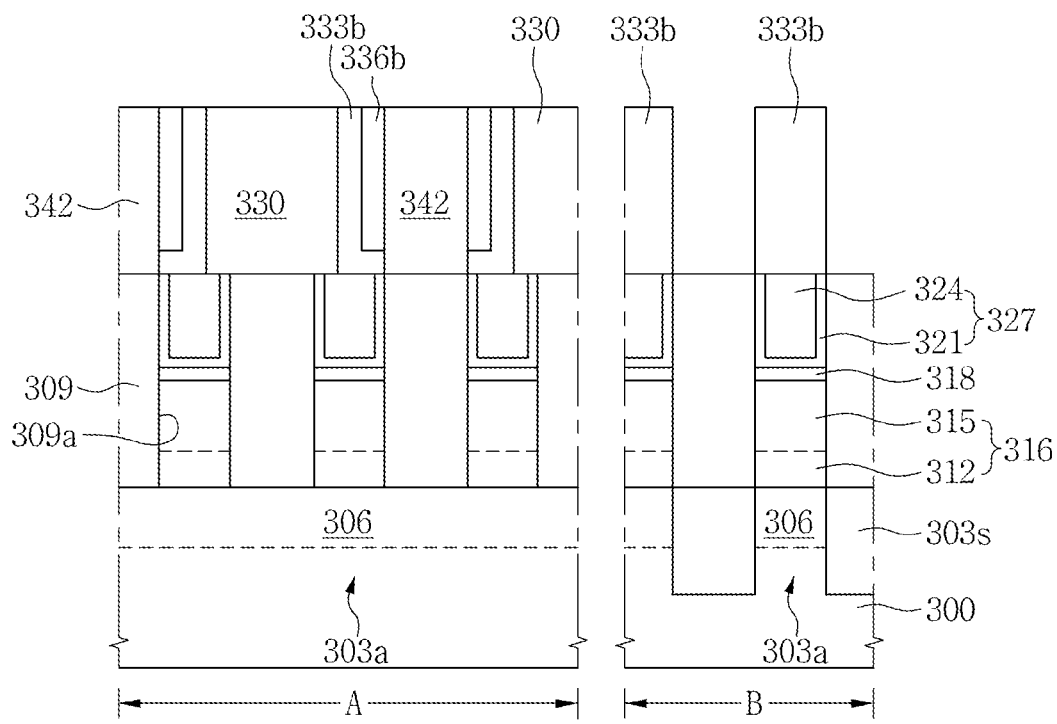

Referring to FIGS. 19 and 23E, electrode patterns 333b spaced apart from each other may be formed by patterning the conductive patterns 333a. The electrode patterns 333b may be electrically connected to the contact structures 327. The electrode patterns 333b may be electrically connected to the contact structures 327 in one-to-one correspondence.

Figure 23F:
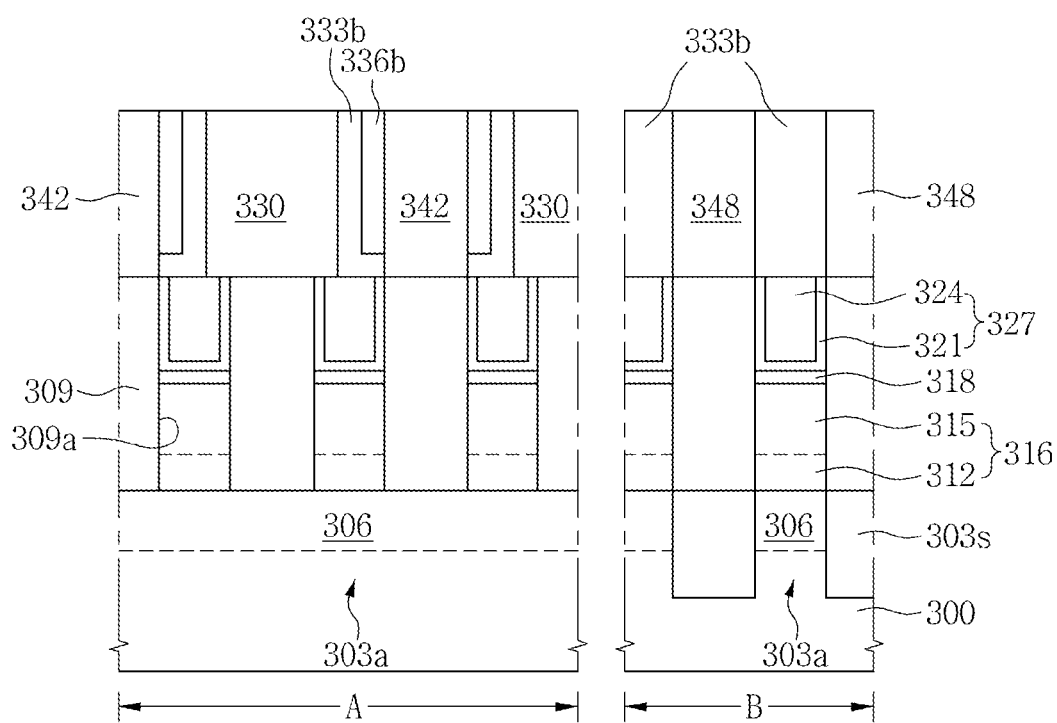

Referring to FIGS. 19 and 23F, third molding patterns 348 may be formed in spaces generated by patterning the conductive patterns 333. The third molding patterns 348 may be formed of an insulating material. For example, the third molding patterns 348 may be formed of silicon oxide, silicon nitride, or silicon oxynitride.

Figure 23G:
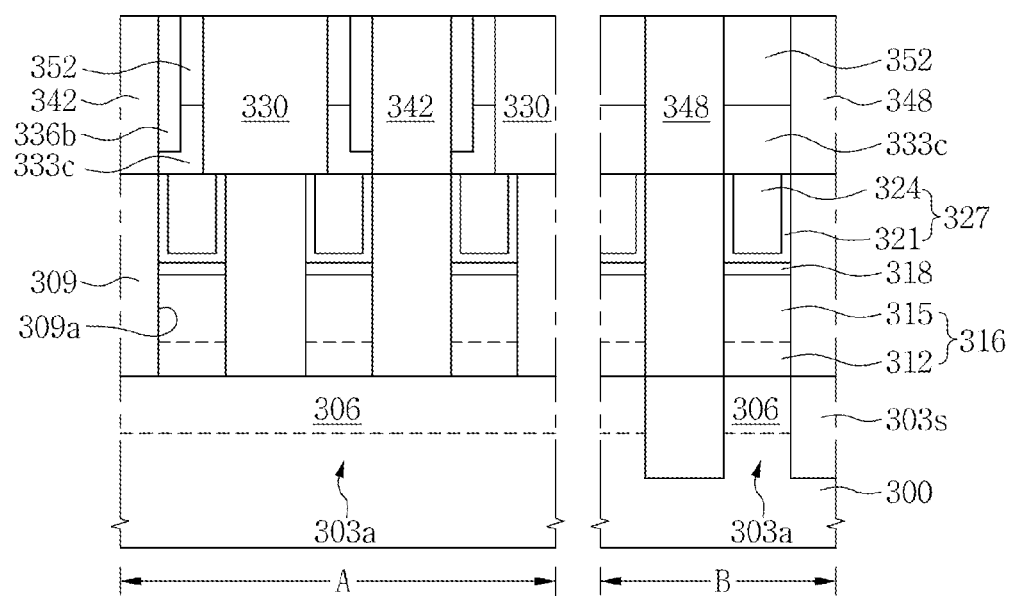

Referring to FIGS. 19 and 23G, lower electrodes 333c may be formed by partially etching the electrode patterns 333b. Next, information storage patterns 352 may be formed on the lower electrodes 333c. The information storage patterns 352 may be formed to fill spaces generated by partially etching and removing the electrode patterns 333b. The information storage patterns 352 may include a phase change material. For example, the information storage patterns 352 may include GeSbTe, GeTeAs, SnTeSn, GeTe, SbTe, SeTeSn, GeTeSe, SbSeBi, GeBiTe, GeTeTi, InSe, GaTeSe, or InSbTe. Alternatively, the information storage patterns 352 may include a layer of material selected from the group consisting of a GeSbTe layer, a GeTeAs layer, an SnTeSn layer, a GeTe layer, an SbTe layer, an SeTeSn layer, a GeTeSe layer, an SbSeBi layer, a GeBiTe layer, a GeTeTi layer, an InSe layer, a GaTeSe layer, and an InSbTe layer, and an element selected from a group consisting of C, N, Si, O, and N.

The electrode patterns 333b, the information storage patterns 352, the insulating patterns 336b, and the first, second, and third molding patterns 330, 342, and 348 may constitute a lower structure.

Figure 23H:
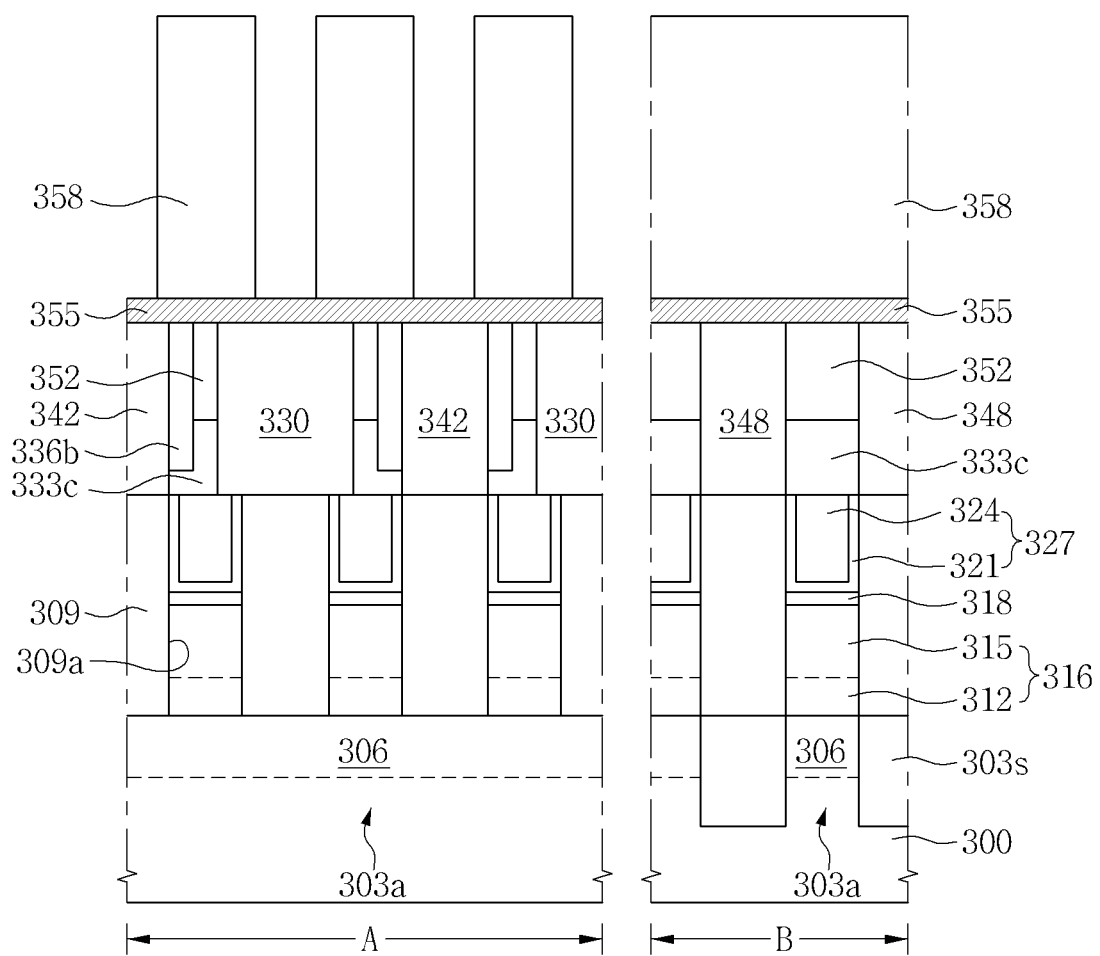

Referring to FIGS. 19 and 23H, a lower conductive layer 355 may be formed on the substrate having the lower structure. The lower conductive layer 355 may include one of Ti, TiN, TiAlN, TiCN, TiSiN, TiON, Ta, TaN, TaAlN, TaCN, TaSiN, C, CN, CoSi, CoSiN, W, WN, WSi, WSiN, and Ni.

Sacrificial mask patterns 358 may be formed on the lower conductive layer 355. The sacrificial mask patterns 358 may have a height or thickness greater than that of the lower conductive layer 355. The sacrificial mask patterns 358 may have line shapes in a direction intersecting the word lines 306. The sacrificial mask patterns 358 may be formed of silicon nitride.

Figure 23I:
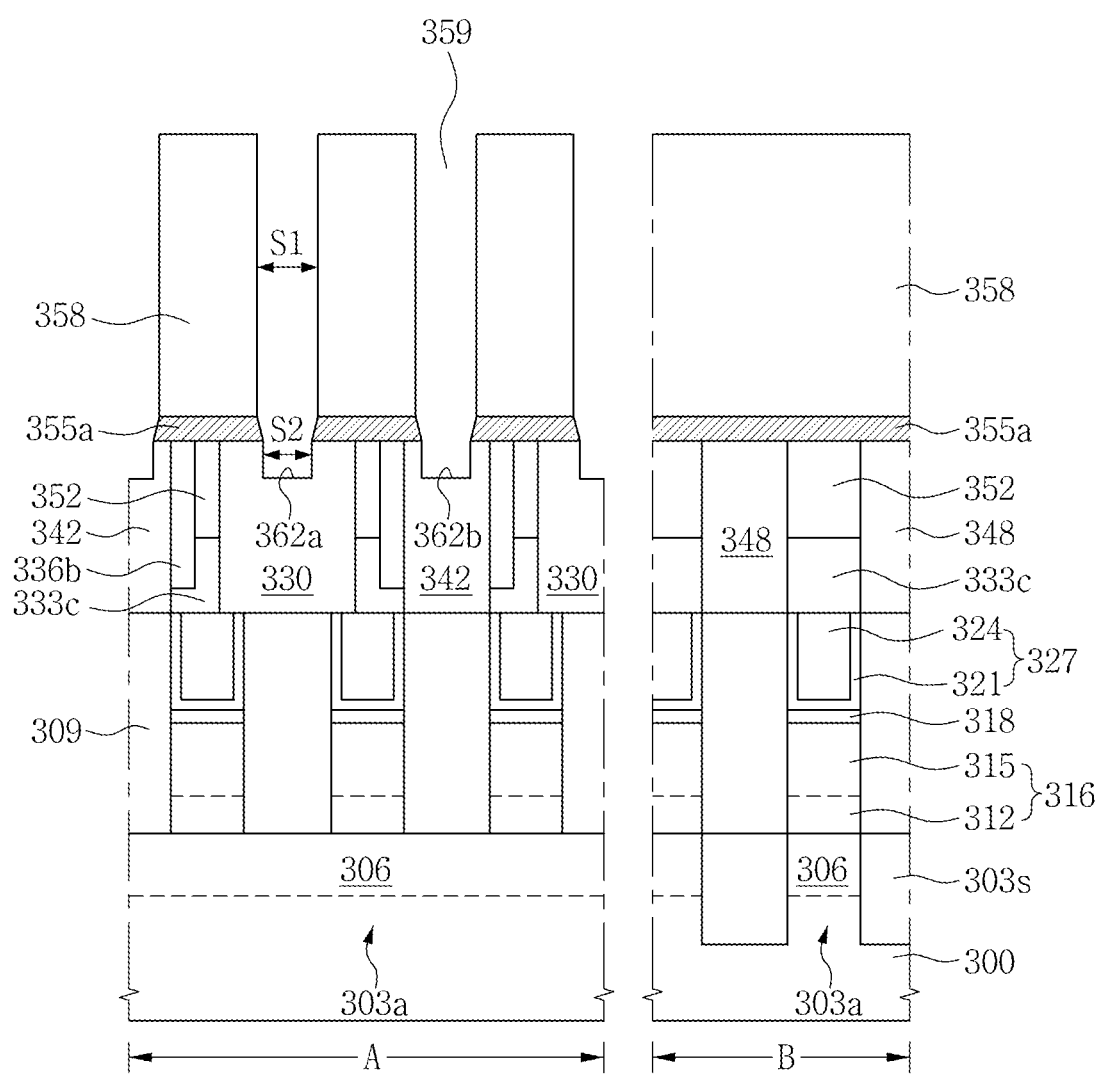
Figure 23J:
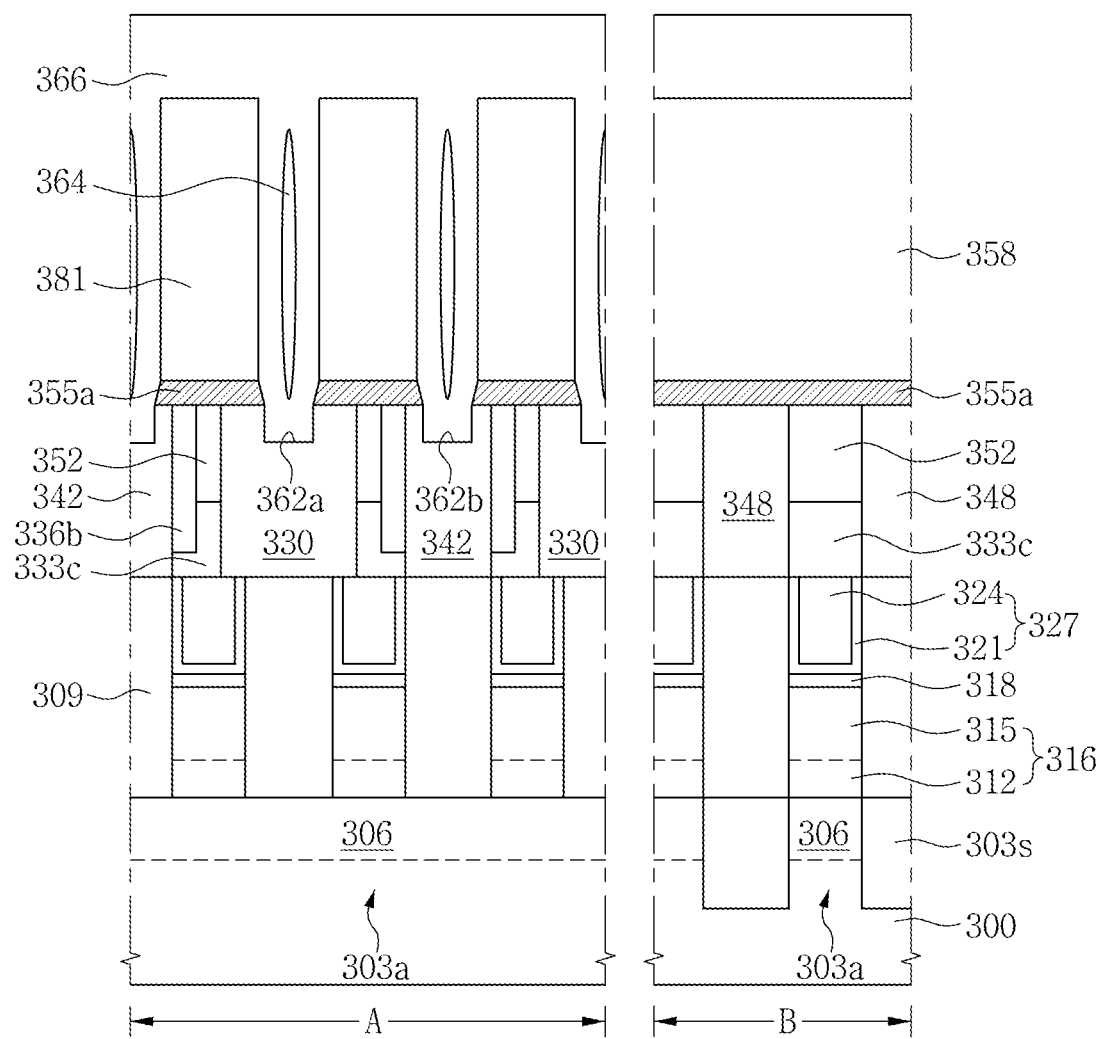

Referring to FIGS. 19 and 23I, lower conductive patterns 355a may be formed by etching the lower conductive layer 355 using the sacrificial mask patterns 358 as an etch mask. Furthermore, first and second recessed areas 362a and 362b may be formed in the first and second molding patterns 330 and 342, respectively, by partially etching the first and second molding patterns 330 and 342 disposed on both sides of the lower conductive patterns 355a using the sacrificial mask patterns 358 as an etch mask. Accordingly, grooves 359 which are located between the sacrificial mask patterns 358 and extend to the first and second recessed areas 362a and 362b, may be formed. The grooves 359 may have line shapes in a plan view.

A distance S1 between the sacrificial mask patterns 358 may be greater than a width S2 of each of the recessed areas 362a and 362b. Each of the grooves 359 may have a first width S1 in a part located between the sacrificial mask patterns 358, and a second width S2 smaller than the first width S1 in a part extending to the recessed areas 362a and 362b Referring to FIGS. 19 and 23J, an interlayer insulating layer 366 may be formed on the substrate having the grooves 359. The interlayer insulating layer 366 may be formed of silicon oxide or a low-k dielectric material. Air gaps 364 may be formed in the interlayer insulating layer 366 located in the grooves 359. The air gaps 364 may be located at a lower level than upper surfaces of the sacrificial mask patterns 358.

Figure 23K:
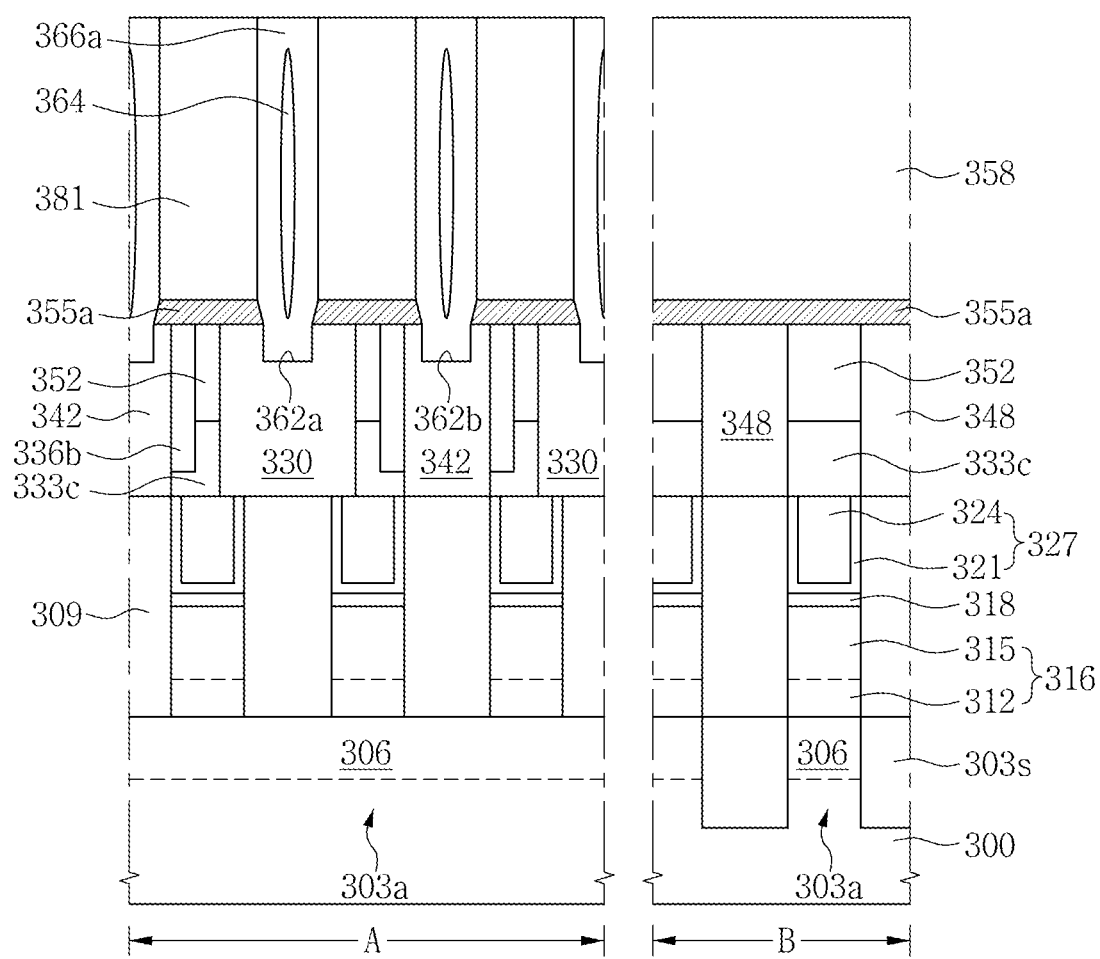

Referring to FIGS. 19 and 23K, interlayer insulating patterns 366a may be formed by planarizing the interlayer insulating layer 366 until the sacrificial mask patterns 358 are exposed. The air gaps 364 may remain in the interlayer insulating patterns 366a.

Figure 23L:
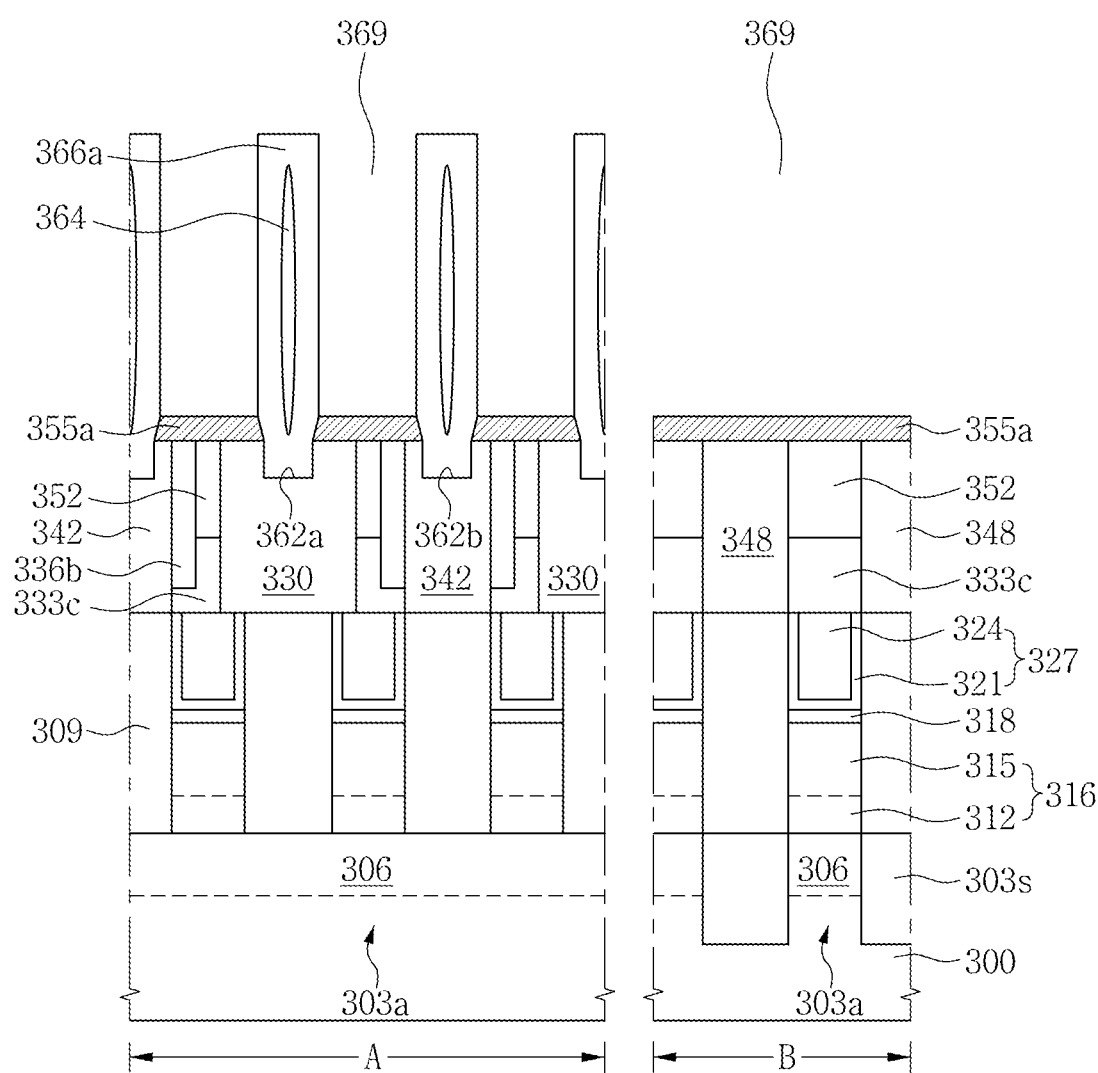

Referring to FIGS. 19 and 23L, openings 369 exposing the lower conductive patterns 355a may be formed by removing the exposed sacrificial mask patterns 358.

In another example, the interlayer insulating patterns 366a may be isotropically etched so as to increase widths of the openings 369. As a result, as shown in FIG. 21, enlarged openings 369a may be formed. The enlarged openings 369a may expose upper surfaces and upper side surfaces of the lower conductive patterns 355a.

Figure 23M:
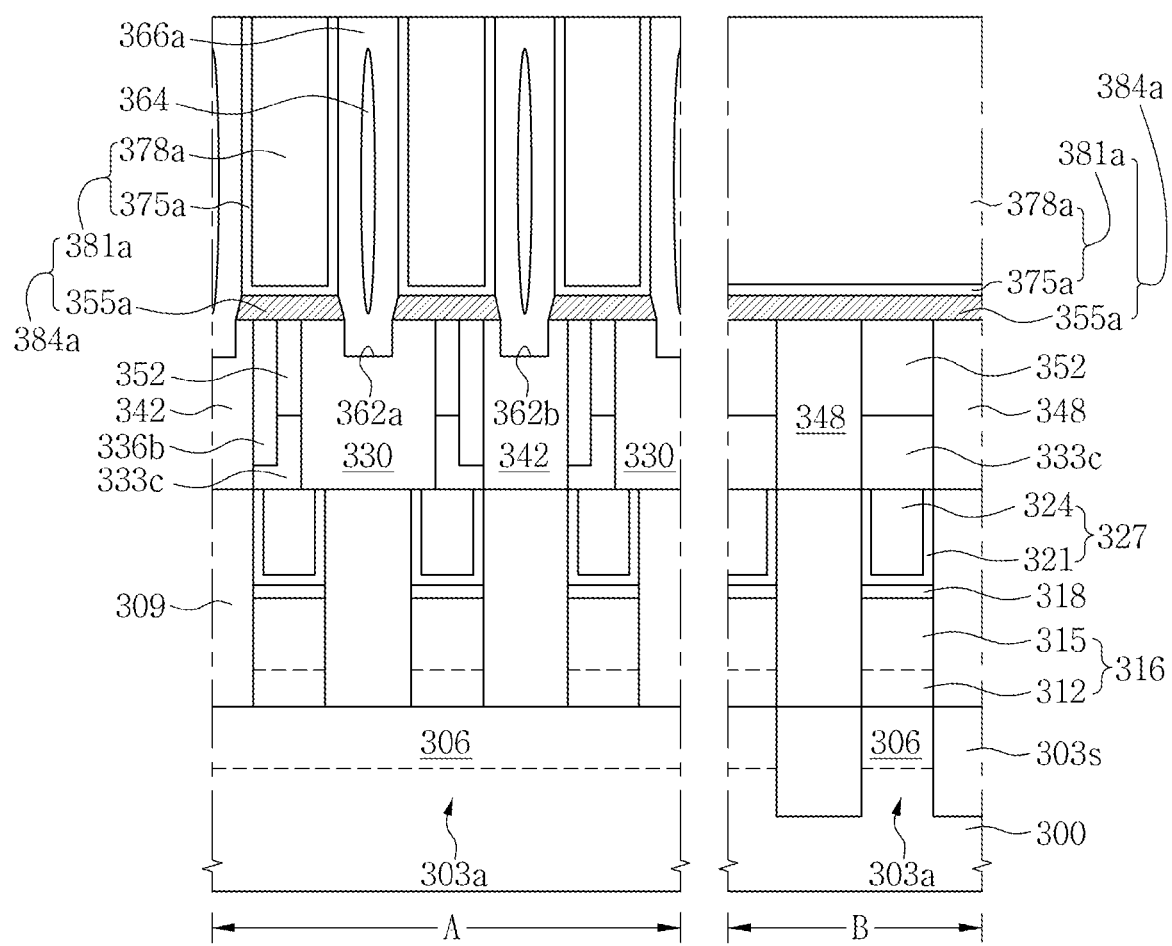

Referring to FIGS. 19 and 23M, an upper conductive layer may be formed on the substrate having the openings 369. The forming of the upper conductive layer may include conformally forming a first upper conductive layer, and forming a second conductive layer filling the openings 369 on the first upper conductive layer.

Then, upper conductive patterns 381a may be formed by planarizing the upper conductive layer until the interlayer insulating patterns 366a are exposed. The upper conductive patterns 381a may be formed without any photolithography process after the lower conductive patterns 355a have been formed. The upper conductive patterns 381a, as described above, may be formed without any photolithography process after the forming of the lower conductive patterns 355a, because the upper conductive patterns 381a are formed by a damascene process in which the openings 369 (in FIG. 23L) are formed using the sacrificial mask patterns 358 used for forming the lower conductive patterns 355a, and then, filled with the upper conductive layer.

The upper conductive patterns 381a may be formed to have a greater height/thickness than the lower conductive patterns 355a. The upper conductive patterns 381a may include a material having lower resistivity than the lower conductive patterns 355a. For example, the lower conductive patterns 355a may be formed of a metal nitride such as titanium nitride, and the upper conductive patterns 381a may be formed of a metal, such as copper, tungsten, or aluminum, which has lower resistivity than the lower conductive patterns 355a. The upper conductive patterns 381a may include first upper conductive patterns 375a covering surfaces delimiting the bottoms and sides of the openings 369, and second upper conductive patterns 378a which are formed on the first upper conductive patterns 375a and fill the openings 369. The lower and upper conductive patterns 355a and 381a may constitute interconnection structures 384a. The interconnection structures 384a may have a height/thickness greater than the distance between the interconnection structures 384a. The upper conductive patterns 381a may have a height/thickness greater than the distance between the interconnection structures 384a.

In the interconnection structures 384a, the lower conductive patterns 355a may be upper electrodes of a memory device. The upper conductive patterns 381a may be conductive lines. The upper conductive patterns 381a may be bit lines of a memory device. Accordingly, the word lines 306, the diodes 316 which are formed on the word lines 306 and function as a switching device, the contact structures 327 formed on the diodes 316, the lower electrodes 333c formed on the contact structures 327, the information storage patterns 352 formed on the lower electrodes 333c, the upper electrodes 355a formed on the information storage patterns 352, and the bit lines 381a formed on the upper electrodes 355a may be vertically aligned with each other and constitute a memory device. When the information storage patterns 352 are formed of a phase change material, the memory device may be a phase change memory device.

With regard to the lower electrodes 333c and the upper electrodes 355a, because the terms "lower" and "upper" are used for distinguishing relative positions of the electrodes 333c and 355a, the lower electrodes 333c may instead be referred to as first electrodes 333c, and the upper electrodes 355a may instead be referred to as second electrodes 355a.

In another example, referring to FIG. 21, an upper conductive layer may be formed on the substrate having enlarged openings 369a, and upper conductive patterns 384b having an increased width may be formed in the enlarged openings 369a by planarizing the upper conductive layers. The upper conductive patterns 384b may be formed in contact with and so as to be electrically connected to upper surfaces and upper side surfaces of the lower conductive patterns 355a. The upper conductive patterns 384b may include a first upper conductive pattern 375b covering bottoms and sidewalls of the enlarged openings 369a, and a second upper conductive pattern 378b formed on the first conductive patterns 375b and filling the openings 369a.

Referring again to FIG. 20, an upper insulating layer 390 may be formed on the substrate having the interconnection structures 384a. The upper insulating layer 390 may be formed of silicon oxide.

Next, another example of a method of fabricating a semiconductor device in accordance with the inventive concept will be described with reference to FIGS. 19, and 24A to 24E. In each of FIGS. 24A to 24E, the portion denoted by character A is taken in the direction of line II-II' in FIG. 19, and the portion denoted by character B is taken in the direction of line III-III' in FIG. 19.

Figure 24A:
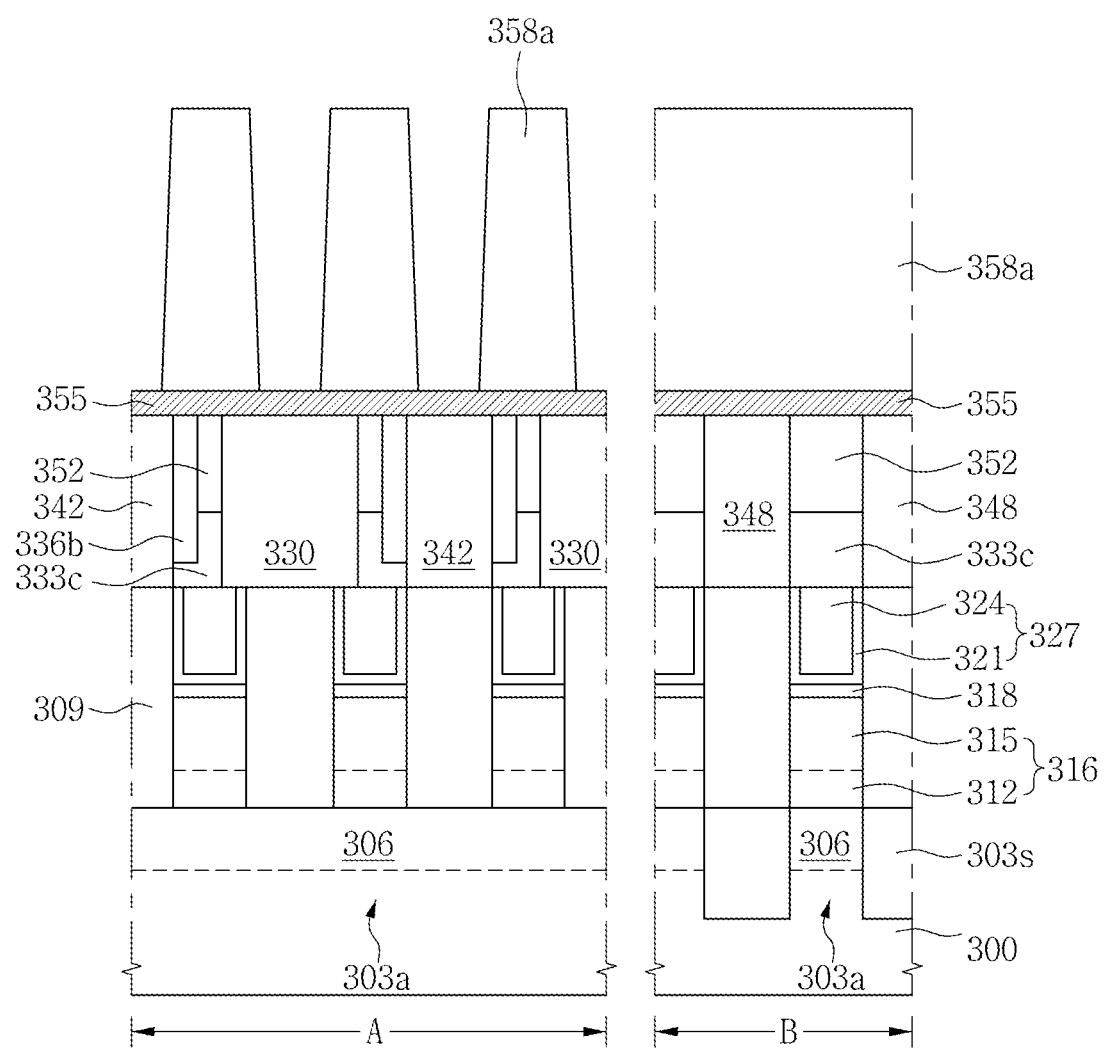
FIGS. 24A to 24E are cross-sectional views showing another example of the second embodiment of a method of fabricating a semiconductor device in accordance with the inventive concept.

Referring to FIGS. 19 and 24A, a substrate may be formed by substantially the same method as described with reference FIGS. 23A to 23G. For example, a substrate having the lower electrodes 333c and information storage patterns 352 described with reference to FIG. 23G may be provided. In addition, the substrate may include the first and second molding patterns 330 and 342 formed on sides of the lower electrodes 333c and information storage patterns 352.

As was shown in and described with reference to FIG. 23H, a lower conductive layer 355 may be formed on the substrate having the lower electrodes 333c and the information storage patterns 352.

Sacrificial mask patterns 358a having different upper and lower widths from each other may be formed on the lower conductive layer 355. The sacrificial mask patterns 358a may have the same shapes as the sacrificial mask patterns 120 shown in FIG. 15A. For example, the sacrificial mask patterns 358a may have widths increasing toward a lower surface from an upper surface.

Figure 24B:
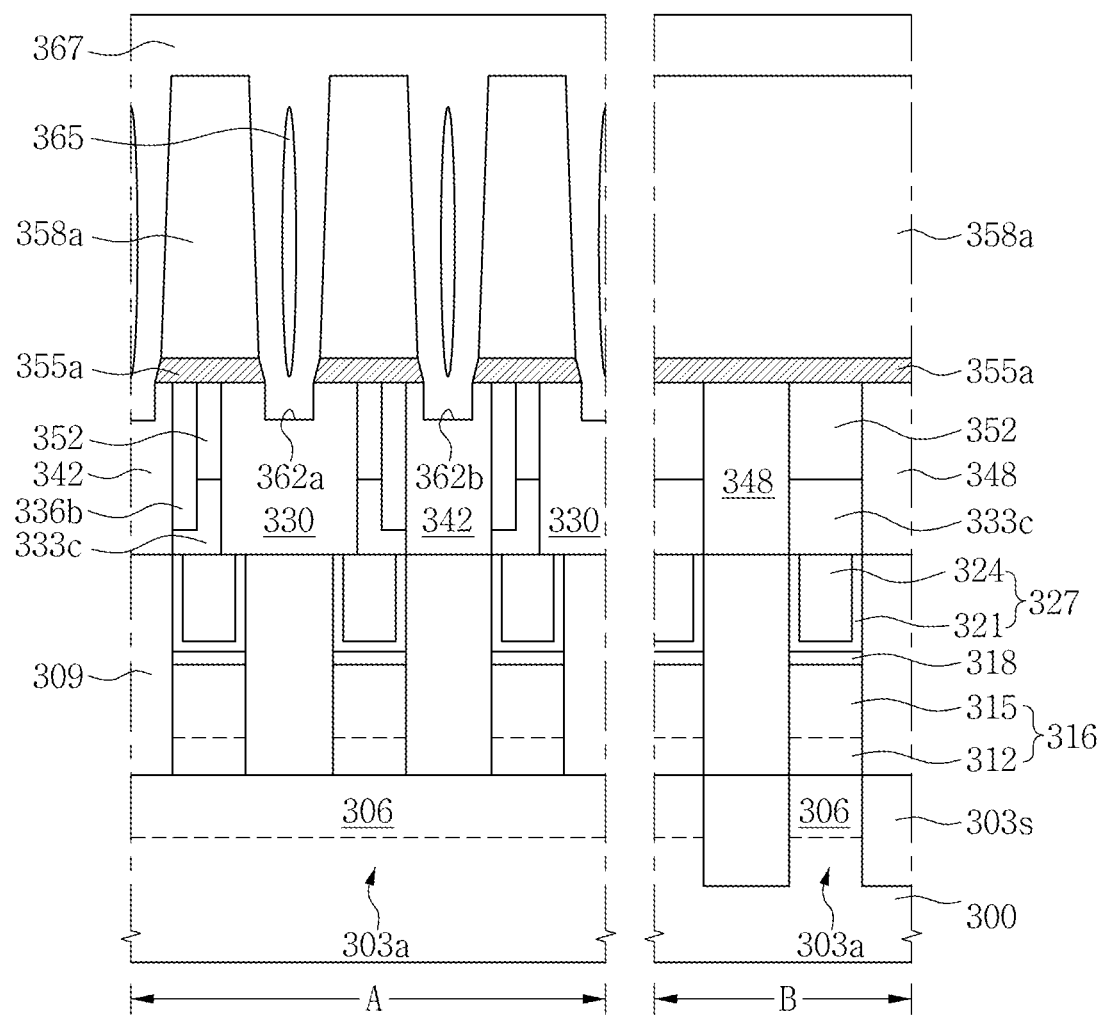

Referring to FIGS. 19 and 24B, lower conductive patterns 355a may be formed by etching the lower conductive layer 355 using the sacrificial mask patterns 358a as an etch mask. At the same time, first and second recessed areas 362a and 362b may be formed respectively in the first and second molding patterns 330 and 342 by partially etching the first and second molding patterns 330 and 342.

Next, an interlayer insulating layer 367 may be formed on the substrate having the lower conductive patterns 355a and the first and second recessed areas 362a and 362b. Air gaps 365 may be formed in the interlayer insulating layer 367. The air gaps 365 may be located at a lower level than upper surfaces of the sacrificial mask patterns 358a.

Figure 24C:
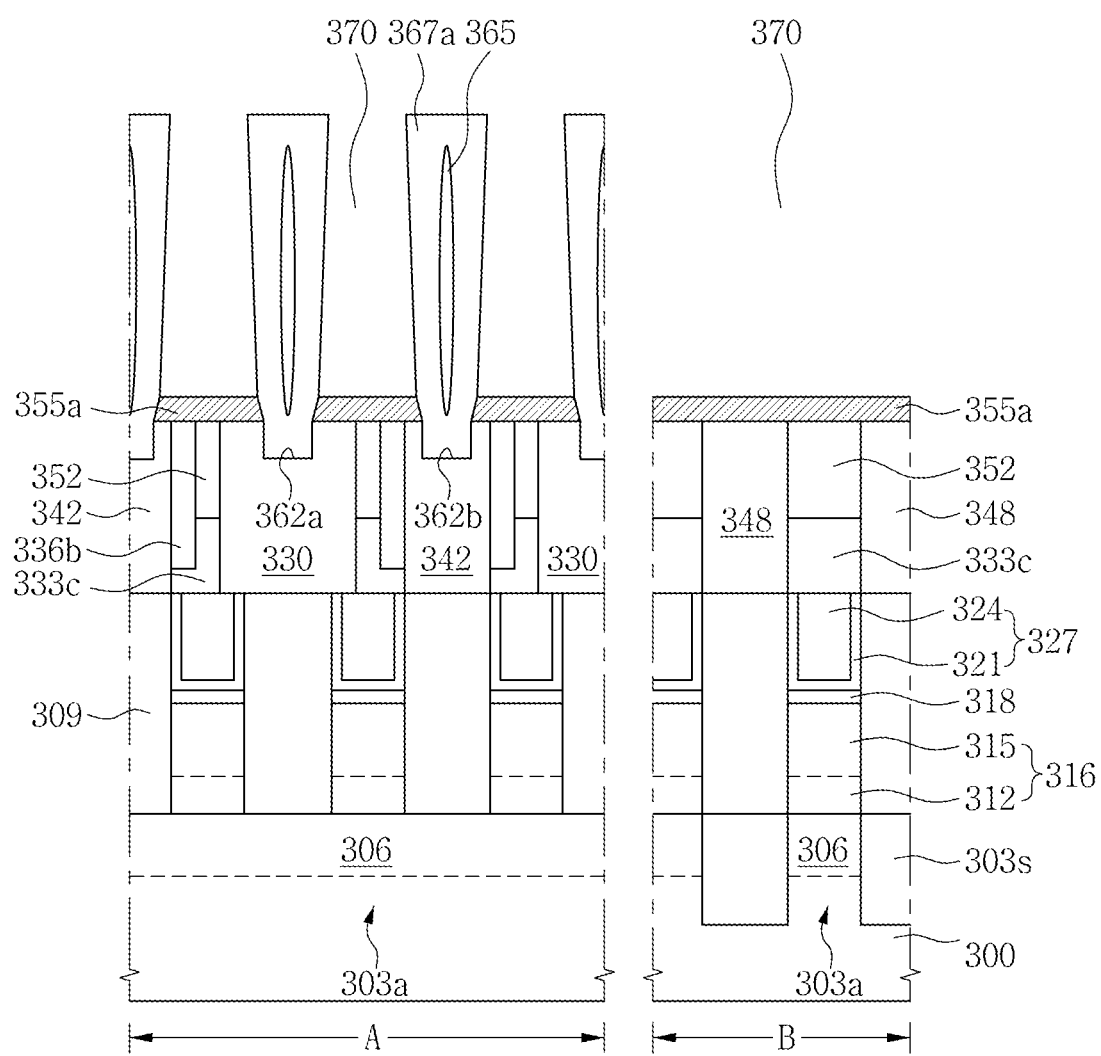

Referring to FIGS. 19 and 24C, the interlayer insulating layer 367 may be planarized until the sacrificial mask patterns 358a are exposed. The planarized interlayer insulating layers may be defined as interlayer insulating patterns 367a. Parts of the interlayer insulating patterns 367a located at the same level as the sacrificial mask patterns 358a may have sloped sides so that the interlayer insulating patterns 367a each have a width gradually decreasing toward a lower portion from an upper portion.

Next, openings 370 may be formed by removing the exposed sacrificial mask patterns 358a. The openings 370 may have substantially the same shape as the sacrificial mask patterns 358a. For example, each of the openings 370 may have a width gradually increasing toward a lower portion from an upper portion.

Figure 24D:
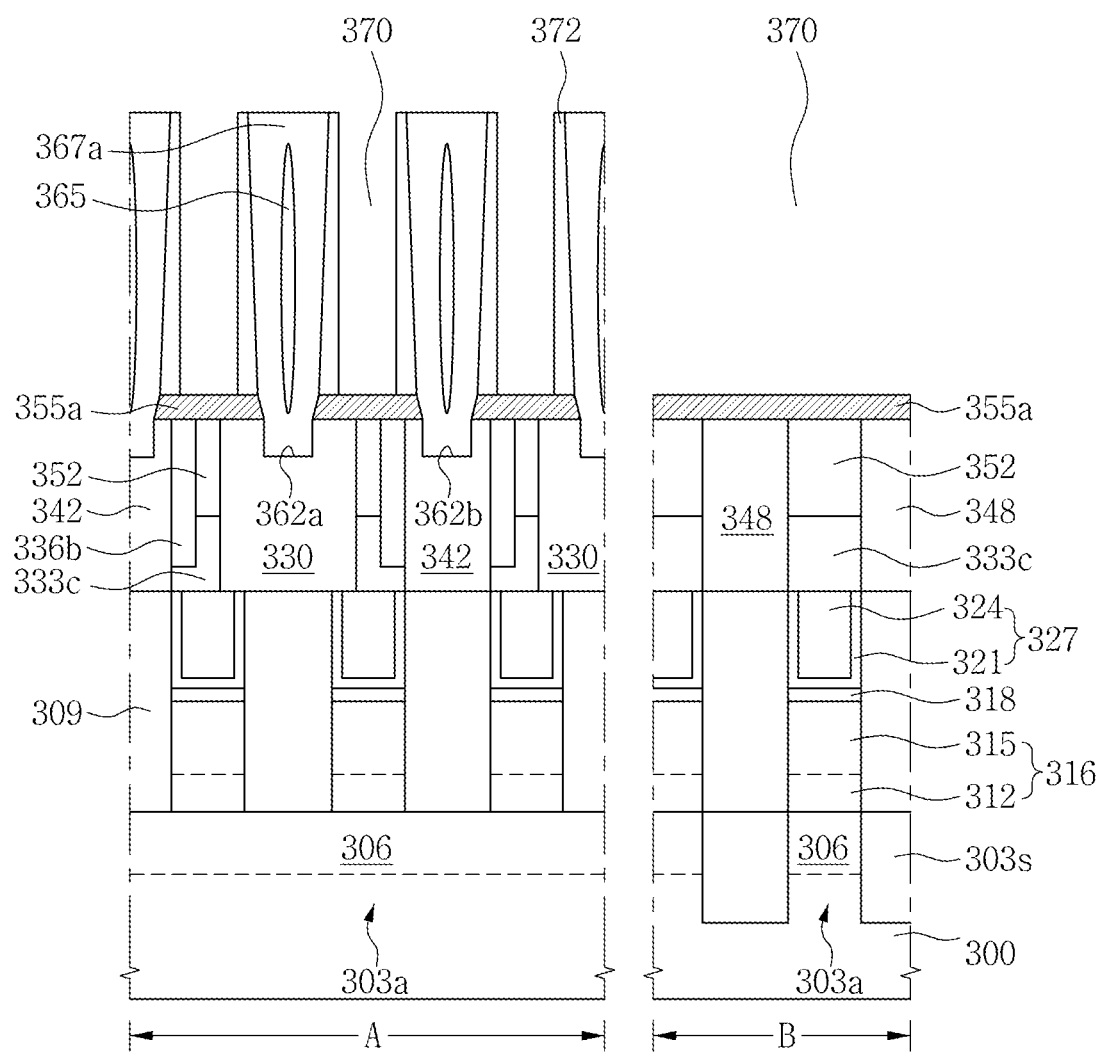

Referring to FIGS. 19 and 24D, spacers 372 may be formed on surfaces delimiting sides of the openings 370. Each of the spacers 372, as described in FIG. 15F, may have a lower end width greater than an upper end width. Each of the spacers 372 may have a width increasing toward a lower portion from an upper portion.

The spacers 372 may be formed of an insulating material. For example, the spacers 372 may be formed of silicon oxide, silicon nitride, and silicon oxynitride. Alternatively, the spacers 372 may be formed of a conductive material. For example, the spacers 372 may be formed of a metal or a metal nitride. For example, the spacers 372 may be formed of tantalum, titanium, tantalum nitride, or titanium nitride.

Figure 24E:
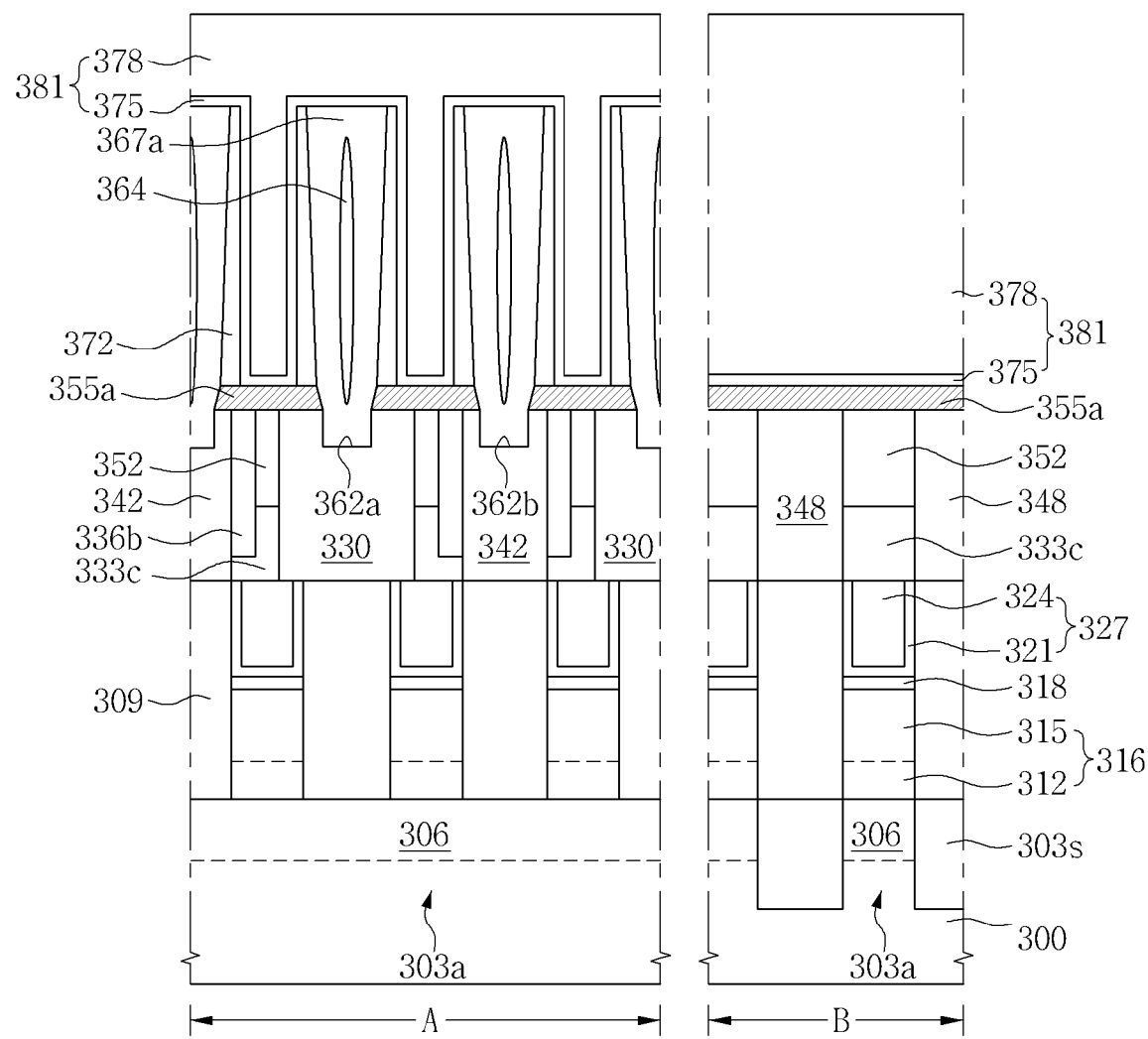

Referring to FIGS. 19 and 24E, an upper conductive layer 381 may be formed on the substrate having the spacers 372. The forming of the upper conductive layer 381 may include conformally forming a first upper conductive layer 375 on the substrate having the spacers 372, and forming a second upper conductive layer 378 filling the openings 370 on the first upper conductive layer 375.

Figure 25:
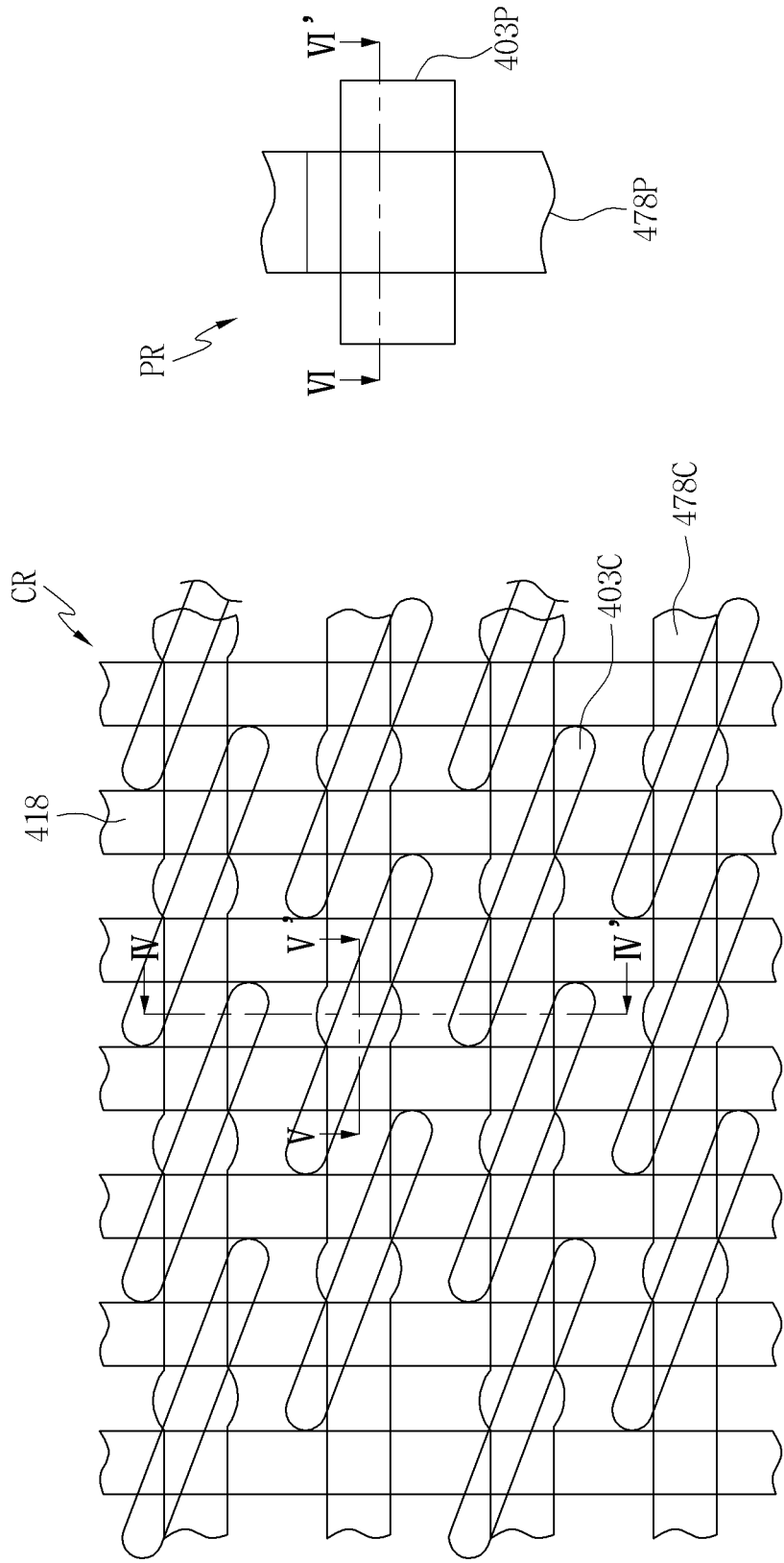
FIG. 25 is a plan view showing a third embodiment of a semiconductor device in accordance with the inventive concept.

Referring again to FIG. 22, upper conductive patterns 381c may be formed by planarizing the upper conductive layer 381 until the interlayer insulating patterns 367a are exposed. Each of the upper conductive patterns 381c may include a second upper conductive pattern 378c, and a first upper conductive pattern 375c covering lower surfaces and side surfaces of the second upper conductive patterns 378a. The upper conductive patterns 381c may be conductive lines Next, another embodiment of a semiconductor device in accordance with the inventive concept will be described with reference to FIGS. 25 and 26. In FIG. 25, the portion denoted by character CR is a cell array region, and the portion denoted by character PR is a peripheral circuit region. In addition, the portion denoted by character C in FIG. 26 is a cross section taken along line IV-IV' in FIG. 25, the portion denoted by character D is a cross section taken along line V-V' in FIG. 25, and the portion denoted by character E is a cross section taken along line VI-VI' in FIG. 25.

Figure 26:
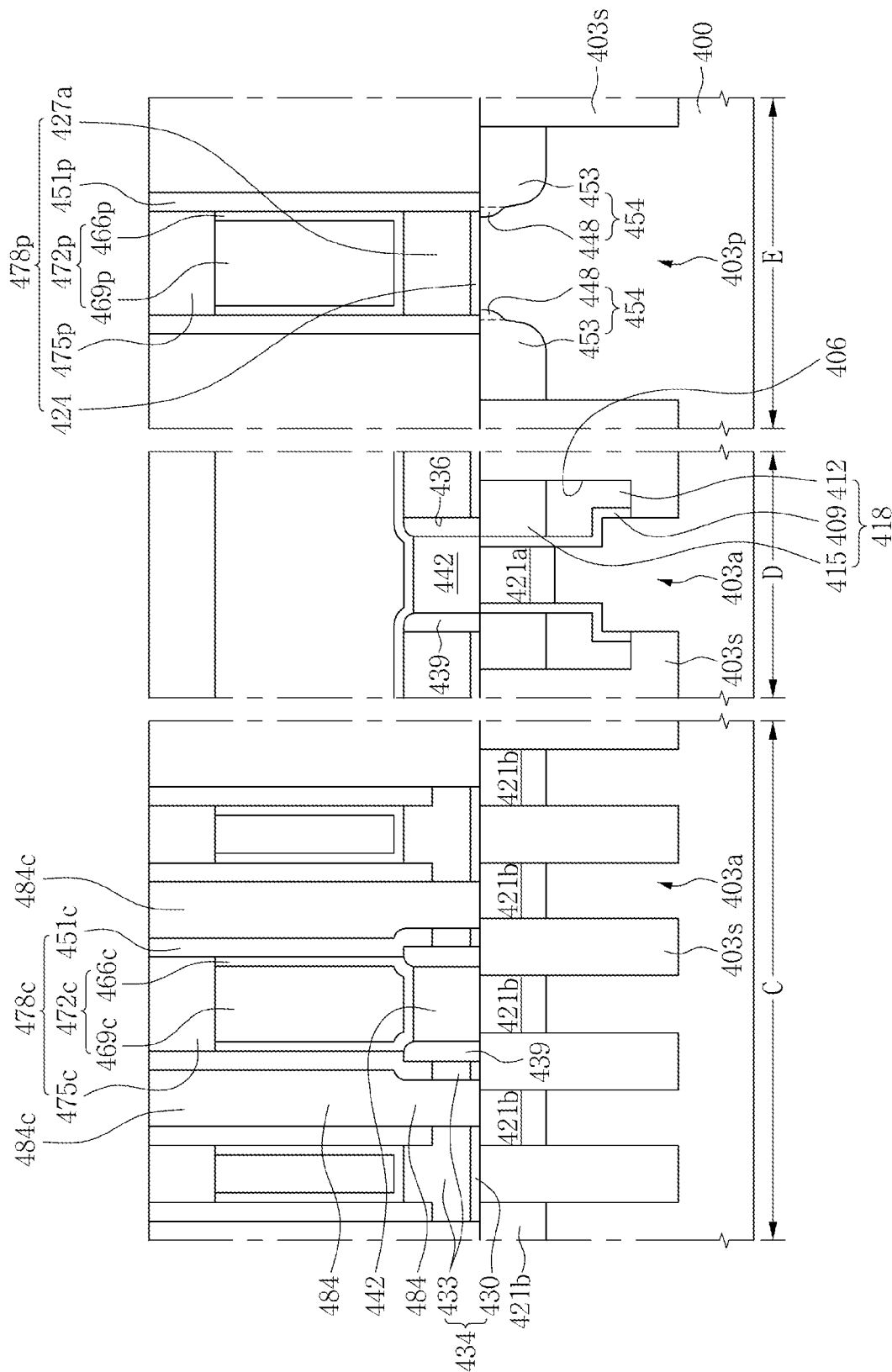
FIG. 26 is a series of cross-sectional views of the third embodiment of a semiconductor device in accordance with the inventive concept.

Referring to FIGS. 25 and 26, a substrate 400 may be provided. The substrate 400 may be a semiconductor substrate. Device isolation regions 403s defining cell active regions 403a and peripheral active regions 403p may be formed in the substrate 400. A first source/drain region 421a and a second source/drain region 421b may be formed in the cell active regions 403a.

A cell gate trench 406 may be formed across the cell active region 403a disposed between the first and second source/drain regions 421 and extending into the device isolation region 403s. A cell gate structure 418 may be formed in the cell gate trench 406. The cell gate structure 418 may include a cell gate electrode 412, a cell gate capping pattern 415 formed on the cell gate electrode 412, and a cell gate dielectric material 409 interposed between the cell gate electrode 412 and the cell active region 403a.

A lower insulating layer 434 may be formed in the cell array region CR of the substrate having the cell gate structure 418. The lower insulating layer 434 may include sequentially stacked first and second lower insulating layers 430 and 433.

Cell bit line structures 478c may be formed on the lower insulating layer 434. The cell bit line structures 478c may have line shapes spaced apart from each other. Each of the cell bit line structures 478c may include a cell upper conductive pattern 472c, a cell capping pattern 475c, and a cell spacer 451c. The cell upper conductive pattern 472c may be a bit line of a memory device.

The cell upper conductive pattern 472c and the cell capping pattern 475c may be sequentially stacked. The cell spacer 451c may cover sides of the cell upper conductive pattern 472c and cell capping pattern 475c. Furthermore, the cell spacer 451c may extend to an area located at a lower level than the cell upper conductive pattern 472c.

Contact patterns 442 passing through the lower insulating layer 434, interposed between the first source/drain areas 421a and the cell bit line structures 478c, and electrically connected to the first source/drain areas 421a and the cell bit line structures 478c, may be formed. Insulating contact spacers 439 may be formed between the contact patterns 442 and the lower insulating layer 434.

In the cell bit line structures 478c, lower ends of the cell spacers 451c may be located at a lower level than lower surfaces of the cell upper conductive patterns 472c and top surfaces of the contact patterns 442. In the cell bit line structures 478c, some parts of the cell spacers 451c may be located at the same level as some parts of the contact spacers 439. Each of the cell upper conductive patterns 472c may include a second cell upper conductive pattern 469c, and a first cell upper conductive pattern 466c covering side and bottom surfaces of the second cell upper conductive pattern 469c.

In the peripheral circuit region PR, a line-shaped peripheral gate structure 478p may be formed. The peripheral gate structure 478p may include a sequentially stacked peripheral lower gate electrode 427a, peripheral upper gate electrode 472p, and insulating peripheral gate capping pattern 475p. The peripheral gate structure 478p may include an insulating peripheral spacer 451p covering sides of the peripheral lower gate electrode 427a, peripheral upper gate electrode 472p, and peripheral gate capping pattern 451p. In addition, the peripheral gate structure 478p may include a peripheral gate dielectric material 424 interposed between the peripheral lower gate electrode 427a and the peripheral active region 403p. The peripheral upper conductive pattern 427p may include a second peripheral upper conductive pattern 469p, and a first peripheral upper conductive pattern 466p covering side and bottom surfaces of the second peripheral upper conductive pattern 469p.

The peripheral upper gate electrode 472p may be formed of the same material as the cell upper conductive pattern 472c. The peripheral upper gate electrode 472p may include a conductive material having lower resistivity than the peripheral lower gate electrode 427a. For example, the peripheral lower gate electrode 427a may be formed of polysilicon, and the cell upper conductive patterns 472c and the peripheral upper conductive pattern 427p may include tungsten or copper. For example, in the cell upper conductive patterns 472c and the peripheral upper conductive pattern 472p, the first cell and peripheral upper conductive patterns 466c and 466p may be formed of a refractory metal or a metal nitride, and the second cell and peripheral upper conductive patterns 469c and 469p may be formed of tungsten or copper.

Peripheral source/drain areas 454 may be disposed in the peripheral active region 403p at both sides of the peripheral gate structures 478p.

Interlayer insulating patterns 457 may be formed on sides of the cell bit line structures 478c and peripheral gate structure 478p.

Cell contact plugs 484c passing through the interlayer insulating patterns 457 and the lower insulating layer 434, and electrically connected to the second source/drain areas 421b, may be formed on the cell array region CR of the substrate. Cell capacitors 487 electrically connected to the cell contact plugs 484c may be formed on the cell contact plugs in the cell array region.

In the peripheral circuit region PR, peripheral contact plugs 484p passing through the interlayer insulating patterns 457 and electrically connected to the peripheral source/drain areas 454, may be formed.

Next, a method of fabricating the third embodiment of a semiconductor device, in accordance with the inventive concept, will be described with reference to FIG. 25 and FIGS. 27A to 27K. In each of FIGS. 27A to 27K, the portion denoted by character C is taken in the same direction as line IV-IV' in FIG. 25, the portion denoted by character D is taken in the same direction as line V-V' in FIG. 25, the portion part denoted by character E is taken in the same direction as line VI-VI' in FIG. 25.

Referring to FIGS. 25 and 27A, a substrate 400 may be provided. The substrate 400 may be a semiconductor substrate. Device isolation region 403s delimiting cell active regions 403a and a peripheral active region 403p may be formed in the substrate 400. The device isolation region 403s may be a trench isolation region.

First and second source/drain areas 421a and 421b may be formed in the cell active region 403a. A cell gate trench 406 crossing the cell active region 403a and extending into the device isolation region 403s may be formed. In a single cell active region 403a, the first source/drain area 421a and the second source/drain area 421b may be facing each other across the cell gate trench 406. The cell gate trench 406 may have a lower bottom at the device isolation region 403s than at the cell active region 403a. A cell gate structure 418 may be formed in the cell gate trench 406. The formatting of the cell gate structure 418 may include forming a cell gate dielectric material 409 on the cell active region 403a exposed by the cell gate trench 406, forming a cell gate electrode 412 partially filling the cell gate trench 406 on the cell gate dielectric material 409, and forming an insulating gate capping pattern 415 on the cell gate electrode 412. The cell gate electrode 412 may be a word line of a memory device.

Figure 27B:
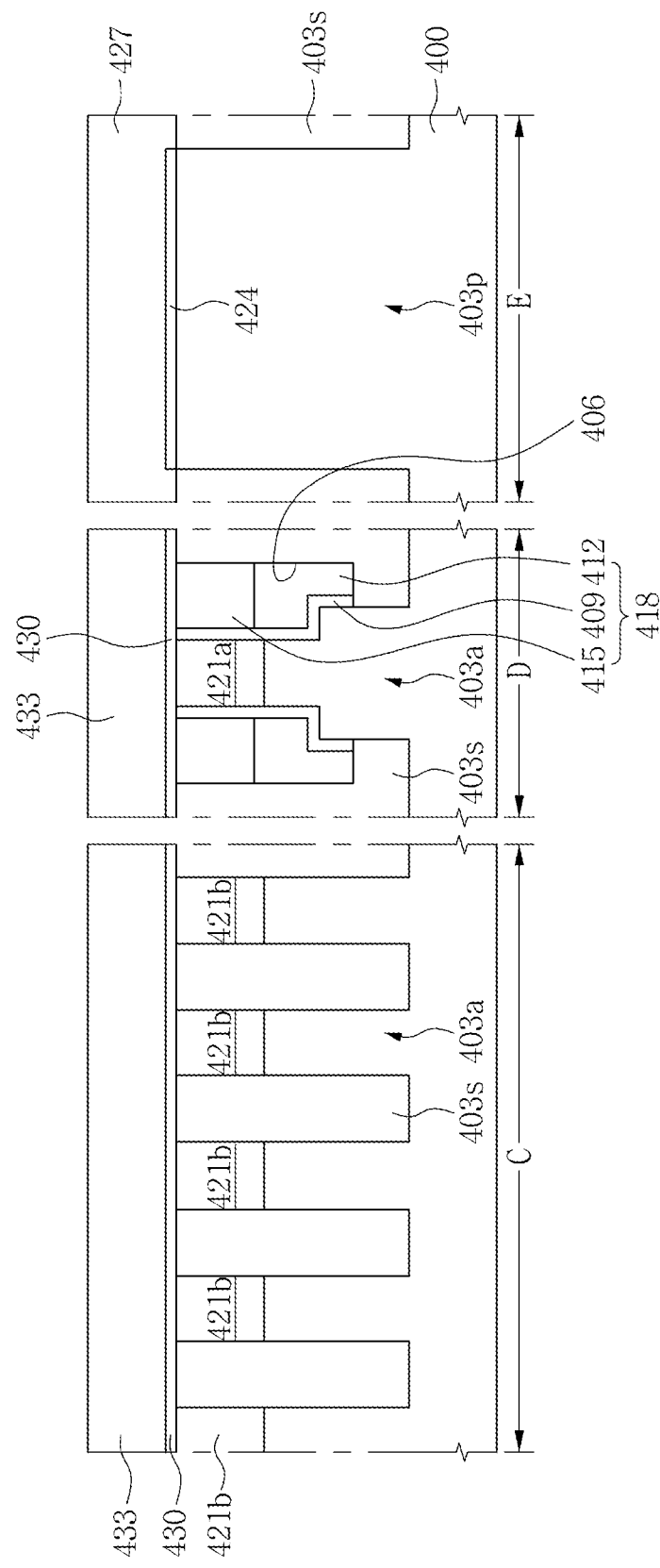

Referring to FIGS. 25 and 27B, a sequentially stacked first lower insulating layer 430 and second lower insulating layer 433 may be formed on the cell array region CR on the substrate having the cell gate structure 418. The first lower insulating layer 430 may be formed of silicon nitride or silicon oxynitride, and the second lower insulating layer 433 may be formed of silicon oxide.

A peripheral gate dielectric material 424 may be formed on the peripheral active region 403p of the peripheral circuit region PR of the substrate having the cell gate structure 418, and a lower peripheral gate conductive layer 427 covering the peripheral circuit region PR of the substrate may be formed on the peripheral gate dielectric material 424.

The peripheral gate conductive layer 427 may be formed after forming the second lower insulating layer 433. Alternatively, the second lower insulating layer 433 may be formed after forming the peripheral lower gate conductive layer 427.

Figure 27C:
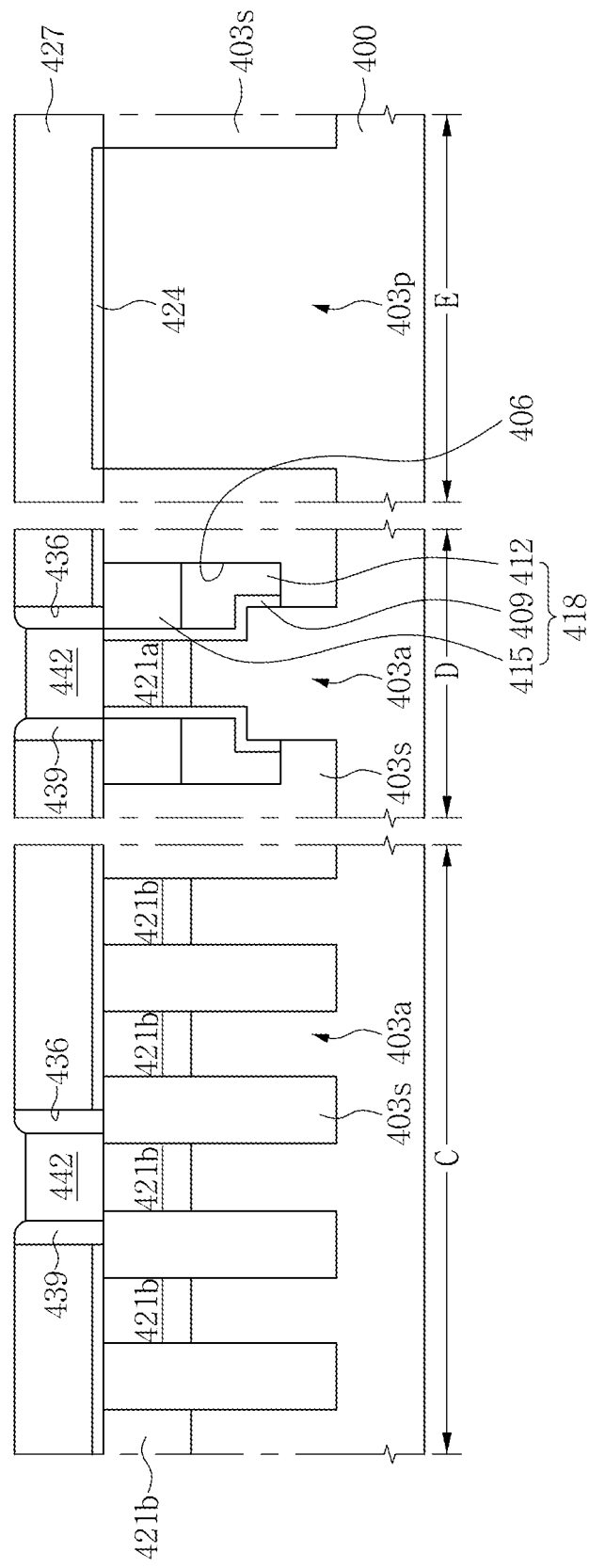

Referring to FIGS. 25 and 27C, contact holes 436 exposing a portion of the cell active region 403a, for example, the first source/drain areas 421a, may be formed by patterning the second lower insulating layer 433. Insulating contact spacers 439 may be formed on sidewalls of the contact holes 436. The contact spacers 439 may be formed of silicon oxide.

Contact patterns 442 filling the contact holes 436 may be formed. The contact patterns 442 may be formed of a conductive material such as polysilicon.

Figure 27D:
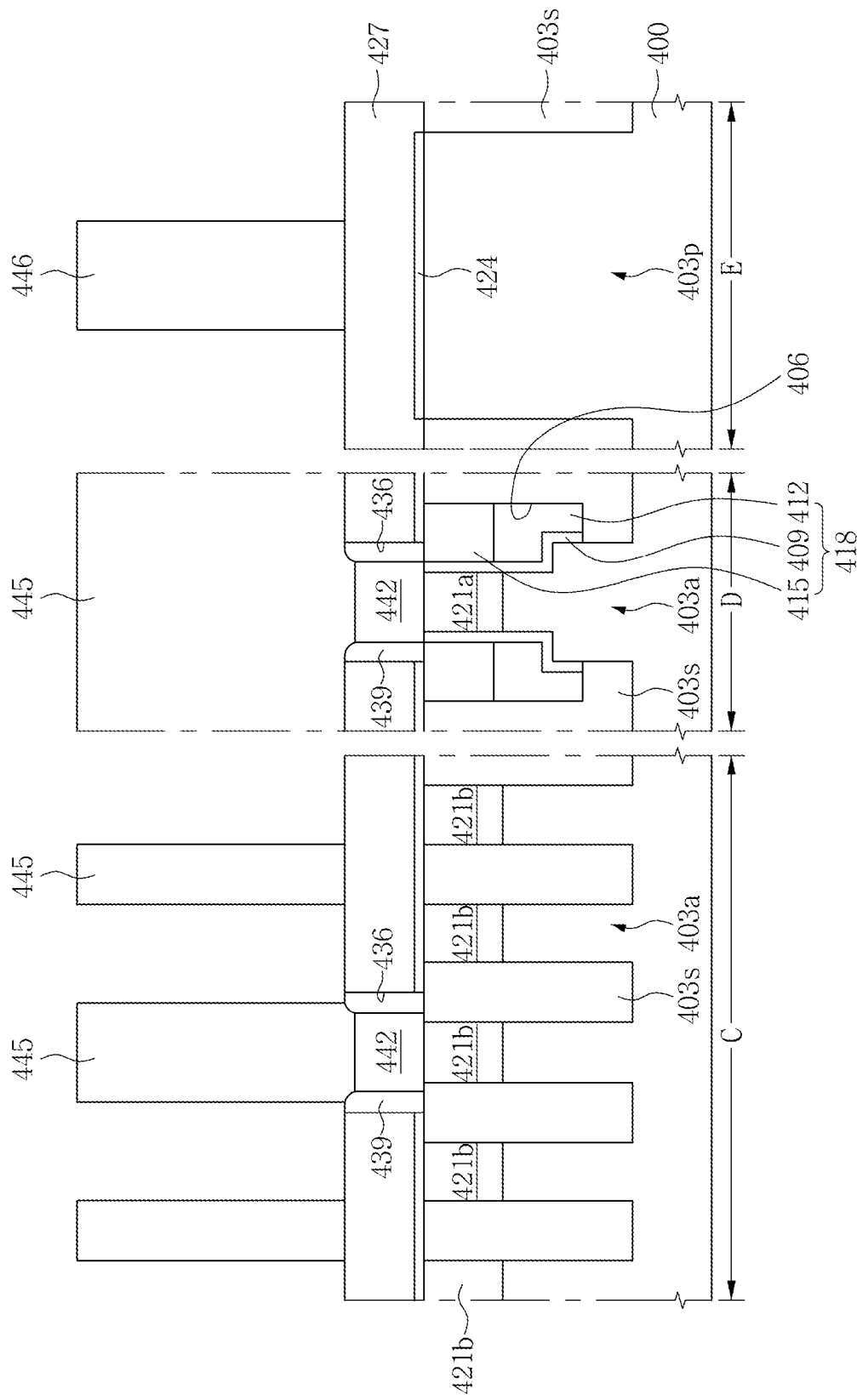

Referring to FIGS. 25 and 27D, cell sacrificial mask patterns 445 and a peripheral sacrificial mask pattern 446 may be formed on the substrate having the contact patterns 442. The cell sacrificial mask patterns 445 may be formed on the cell array region CR of the substrate, and the peripheral sacrificial mask pattern 446 may be formed on the peripheral circuit region PR of the substrate. The cell sacrificial mask patterns 445 and the peripheral sacrificial mask pattern 446 may have line shapes. The cell sacrificial mask patterns 445 may be formed to cover the contact patterns 442.

The cell and peripheral sacrificial mask patterns 445 and 446 may be formed of a material having etch selectivity with respect to the second lower insulating layer 433 and peripheral lower gate conductive layer 427, for example, an amorphous carbon layer.

Figure 27E:
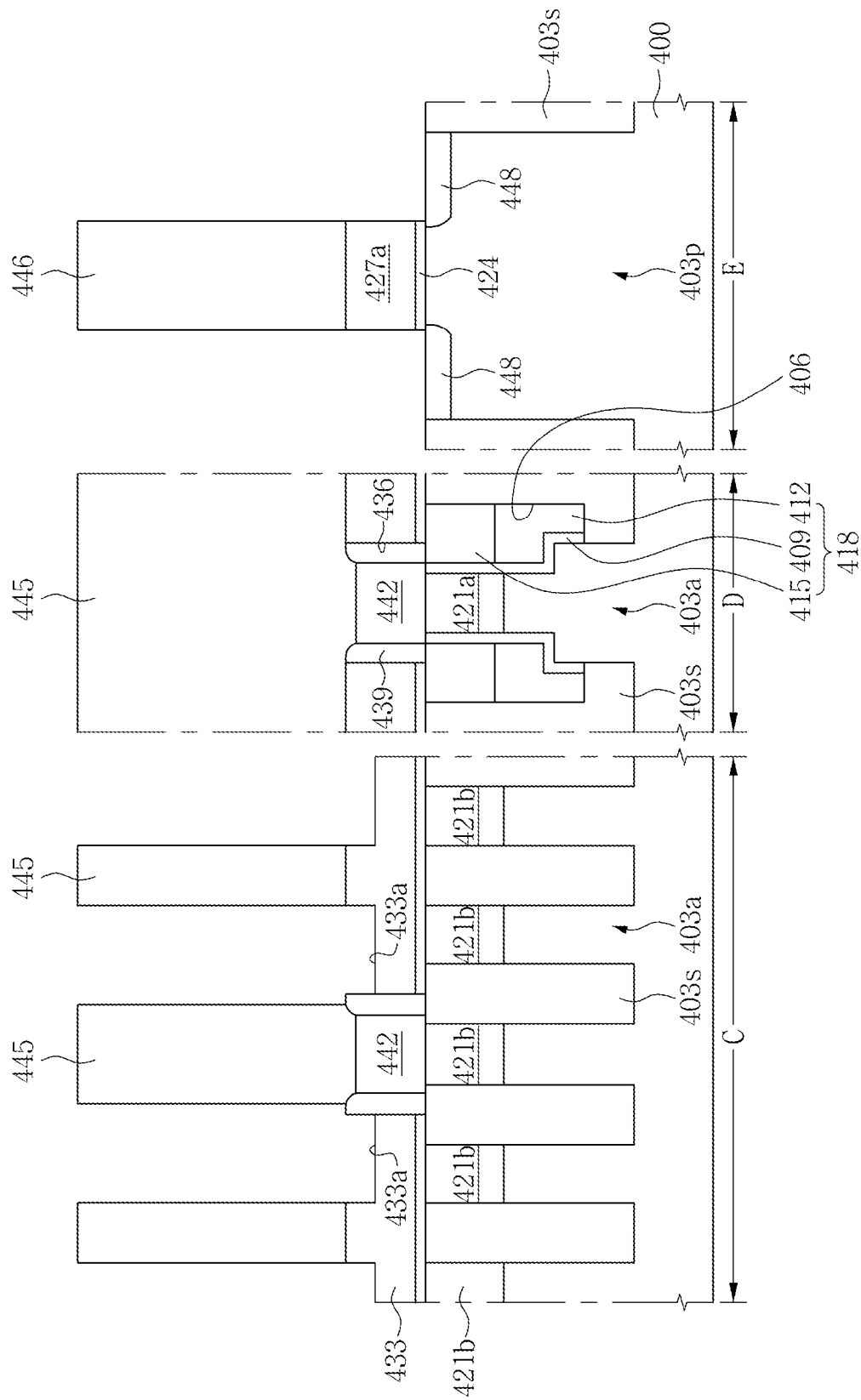

Referring to FIGS. 25 and 27E, the second lower insulating layer 433 of the cell array region CR may be etched or partially etched, and the peripheral lower gate conductive layer 427 of the peripheral circuit region PR may be etched, using the cell and peripheral sacrificial mask patterns 445 and 446 as an etch mask. As a result, recessed areas 433a may be formed in the second lower insulating layer 433 disposed at both sides of the cell sacrificial mask patterns 455, and a peripheral lower gate electrode 427a may be formed on the peripheral circuit region PR.

A low concentration peripheral source/drain area 448 may be formed by implanting impurities into the peripheral active region 403p located at both sides of the peripheral lower gate electrode 427a.

Figure 27F:
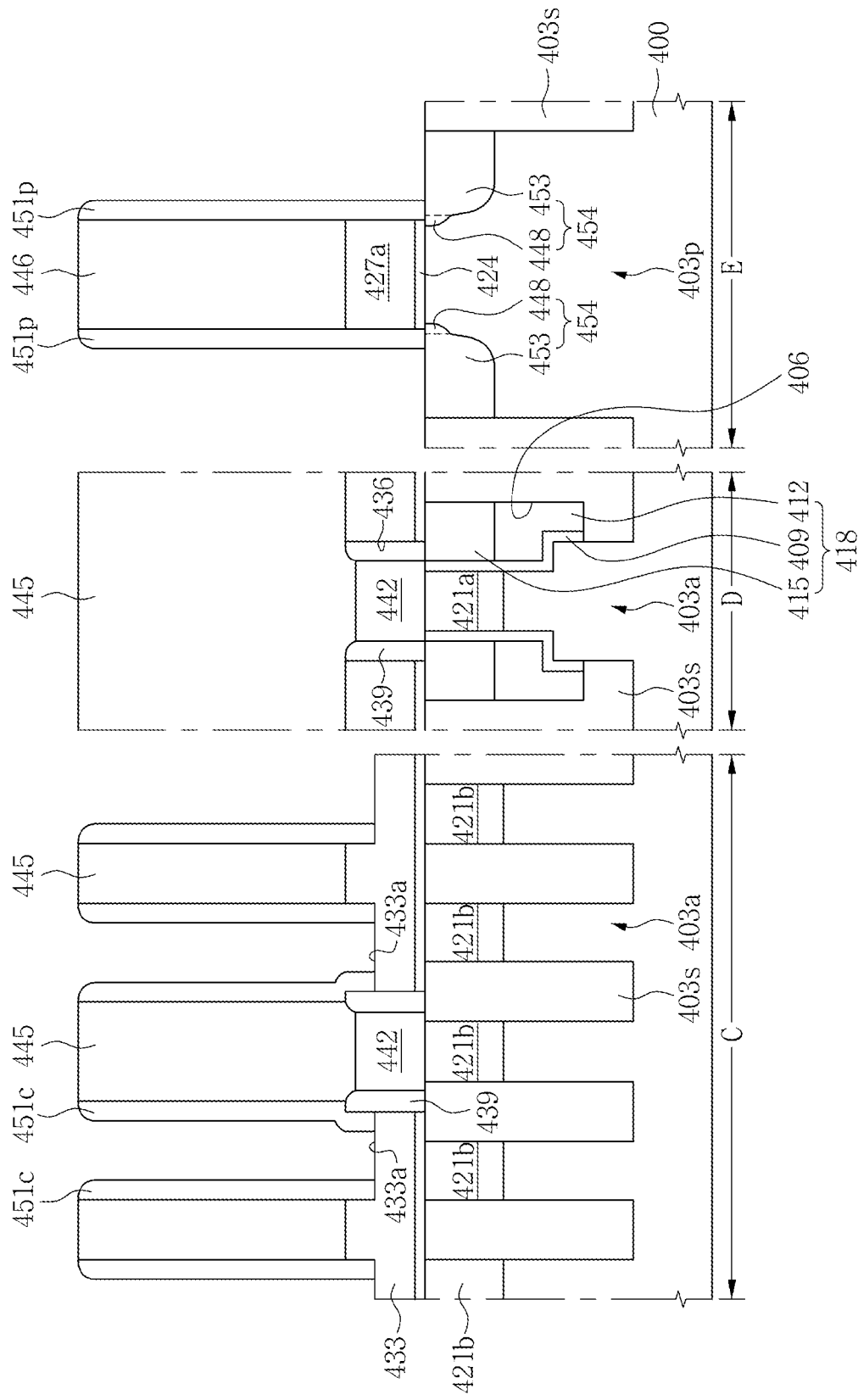

Referring to FIGS. 25 and 27F, an insulating spacer layer may be formed on the substrate having the peripheral lower gate electrode 427a and the recessed areas 433a. By isotropically etching the spacer layer, cell spacers 451c covering sides of the cell sacrificial mask patterns 445 and extending onto sidewalls of the recessed areas 433a may be formed, and peripheral spacers 451p covering sides of the peripheral sacrificial mask pattern 446 and peripheral lower gate electrode 427a may be formed.

The cell and peripheral spacers 451c and 451p may be formed of a material such as silicon nitride, having etch selectivity with respect to the cell and peripheral sacrificial mask patterns 445 and 446.

A high concentration peripheral source/drain area 453 may be formed by implanting impurities into the peripheral active region 403p located at both sides of the peripheral lower gate electrode 427a, using the peripheral sacrificial mask pattern 446 and the peripheral spacer 451p as an ion implantation mask. Accordingly, a lightly doped drain (LDD) structured peripheral source/drain area may be formed in the peripheral active region 403p located at both sides of the peripheral lower gate electrode 427a.

Figure 27G:
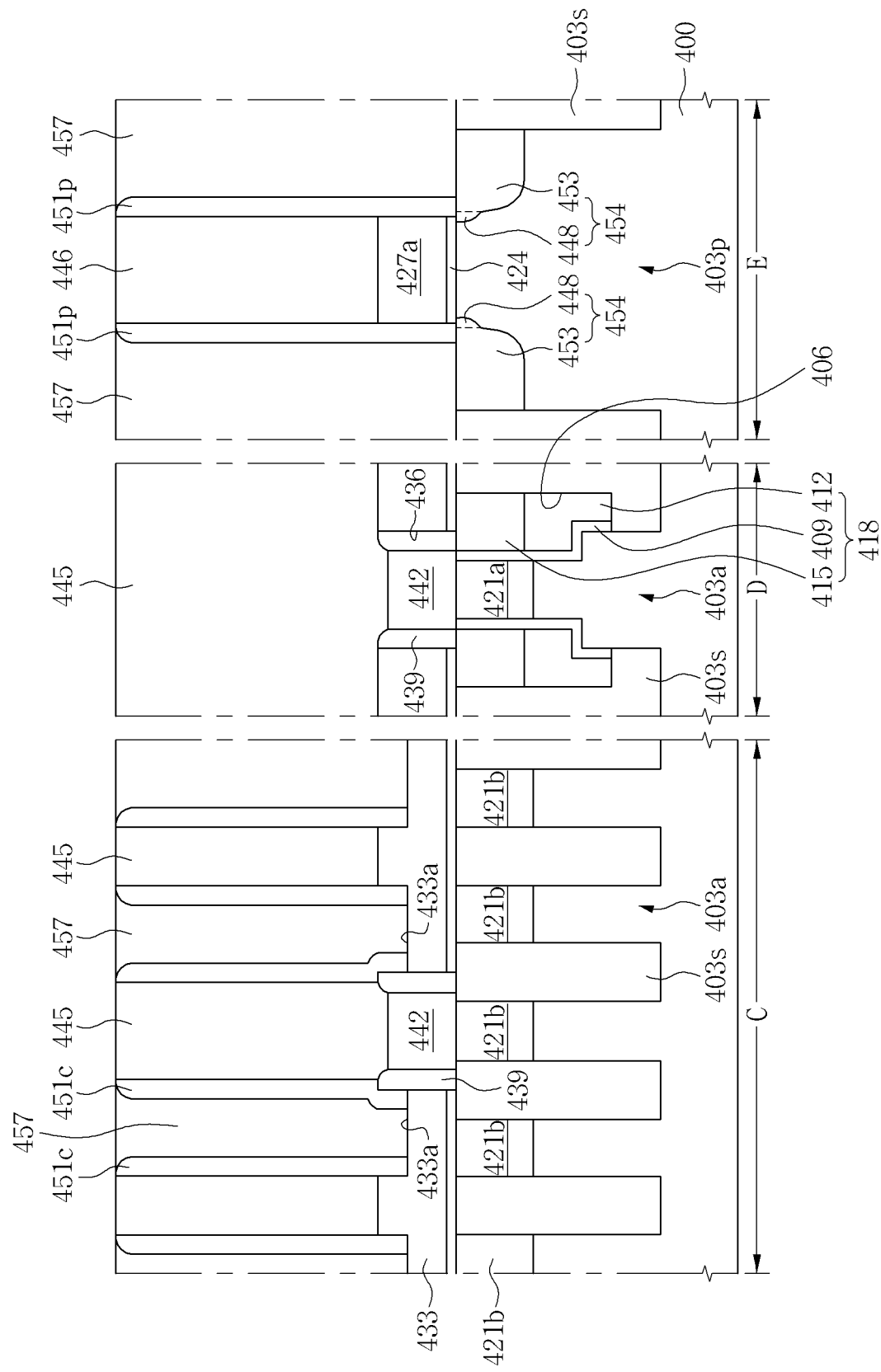

Referring to FIGS. 25 and 27G, an interlayer insulating layer may be formed on the substrate having the cell and peripheral spacers 451c and 451p. Then, the interlayer insulating layer may be planarized to expose the cell and peripheral sacrificial mask patterns 445 and 446. The planarized interlayer insulating layer may be referred to as interlayer insulating patterns 457. The interlayer insulating patterns 457 may be formed of silicon oxide or a low-k dielectric material.

Figure 27H:
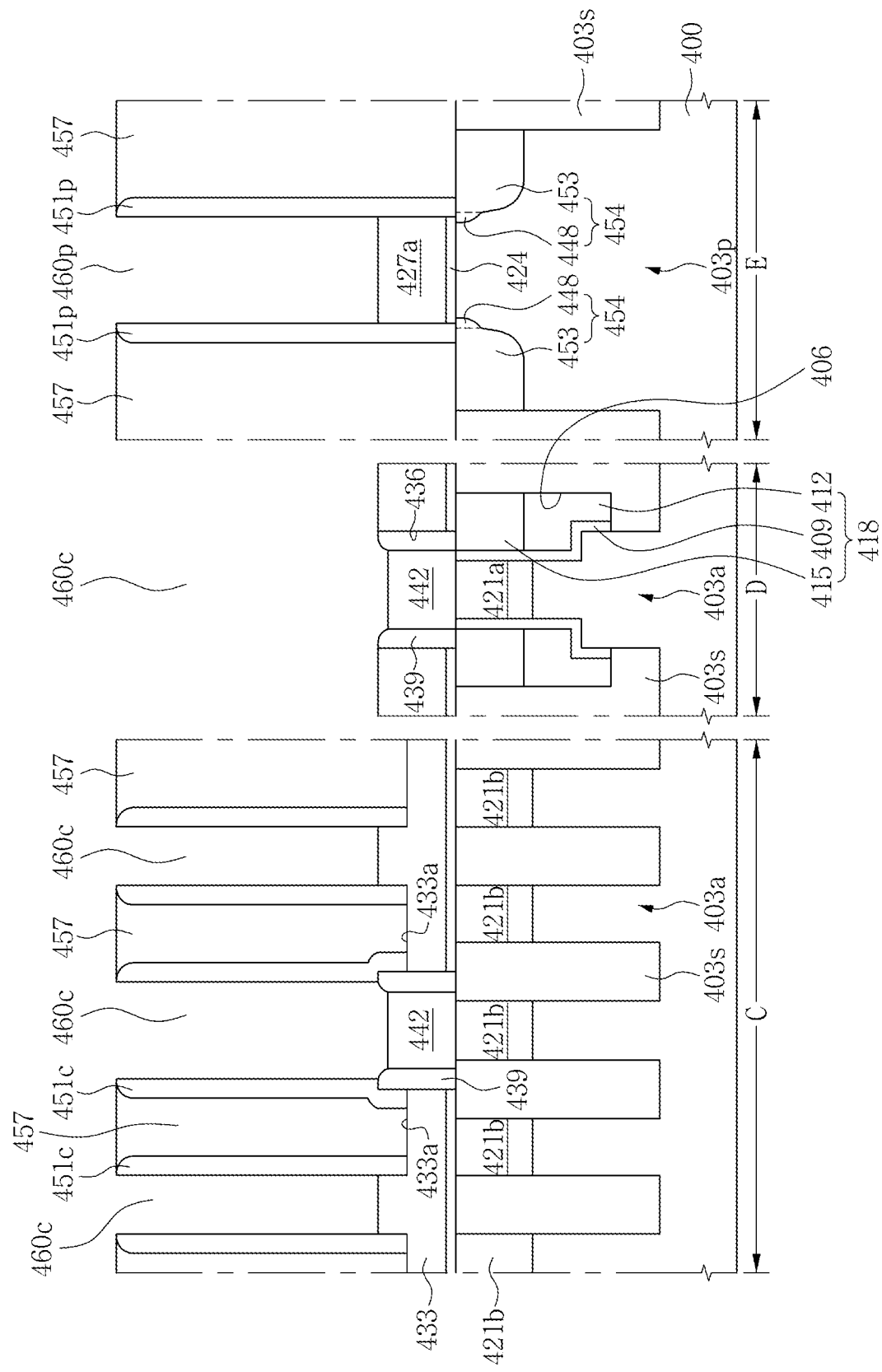

Referring to FIGS. 25 and 27H, the cell sacrificial mask patterns 445 may be removed to form cell openings 460c, and the peripheral sacrificial mask pattern 446 may be removed to form a peripheral cell opening 460p. The cell and peripheral sacrificial mask patterns 445 and 446 may be removed at the same time.

Figure 27I:
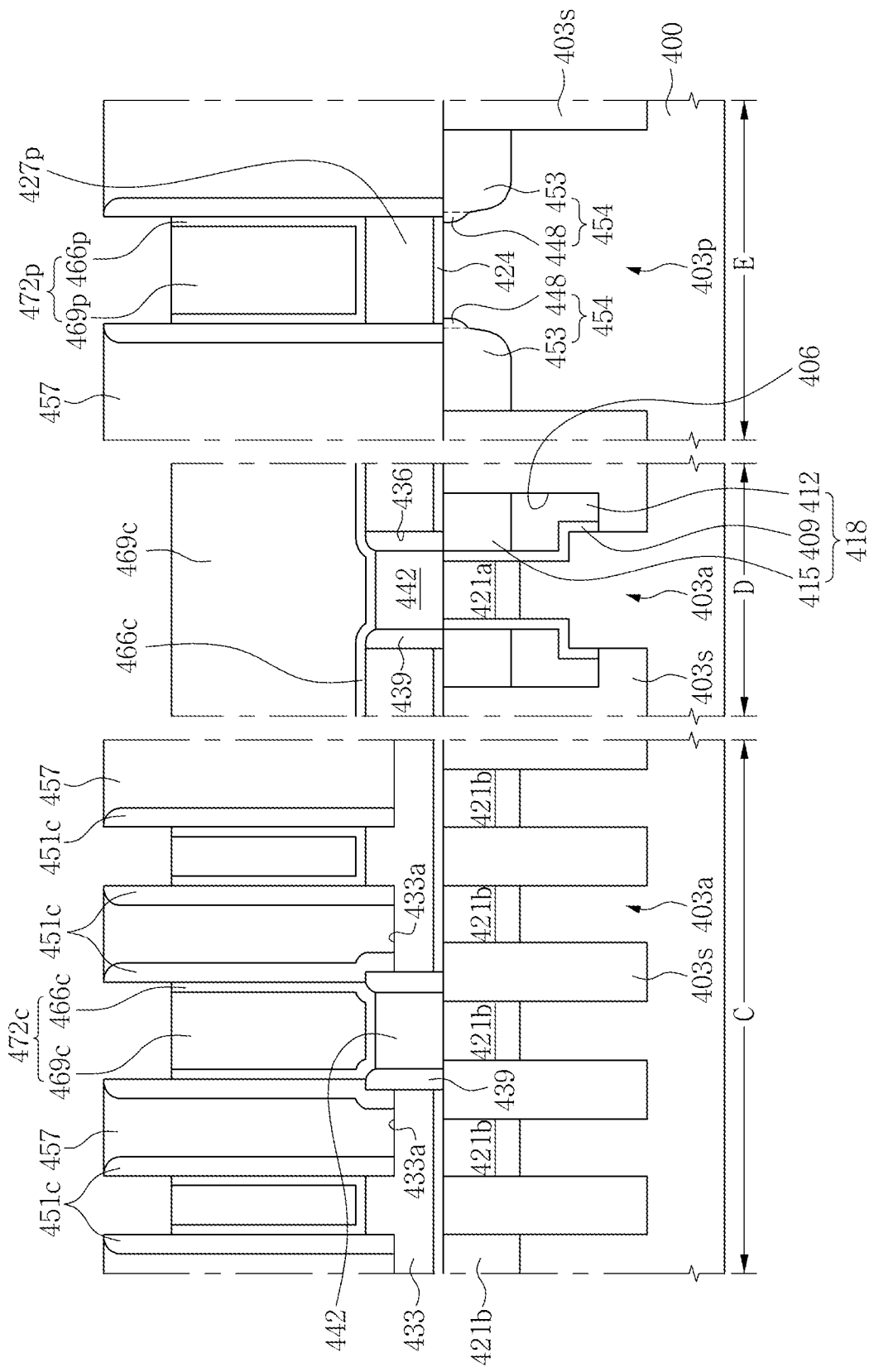

Referring to FIGS. 25 and 27I, an upper conductive layer may be formed on the substrate having the cell and peripheral openings 460c and 460p. Then, the upper conductive layer may be planarized until the interlayer insulating patterns 457 are exposed. The planarized upper conductive layer may be partially etched. As a result, cell upper conductive patterns 472c partially filling the cell openings 460c may be formed, and a peripheral upper conductive pattern 472p partially filling the peripheral opening 460p may be formed.

Each of the cell upper conductive patterns 472c may include a second cell upper conductive pattern 469c, and a first cell upper conductive pattern 466c covering side and bottom surfaces of the second cell upper conductive pattern 469c, and the peripheral upper conductive pattern 472p may include a second peripheral upper conductive pattern 469p, and a first peripheral upper conductive pattern 466p covering side and bottom surfaces of the second peripheral upper conductive pattern 469p.

The cell and peripheral upper conductive patterns 472c and 472p may be formed of the same material. The cell and peripheral upper conductive patterns 472c and 472p may be formed of a conductive material having lower resistivity than the peripheral lower gate electrode 427a. For example, the peripheral lower gate electrode 427a may be formed of polysilicon, and the cell and peripheral upper conductive patterns 472c and 472p may include tungsten or copper. For example, in the cell and peripheral upper conductive patterns 472c and 472p, the first cell and peripheral upper conductive patterns 466c and 466p may be formed of a refractory metal or a metal nitride, and the second cell and peripheral upper conductive patterns 469c and 469p may be formed of tungsten or copper.

Figure 27J:
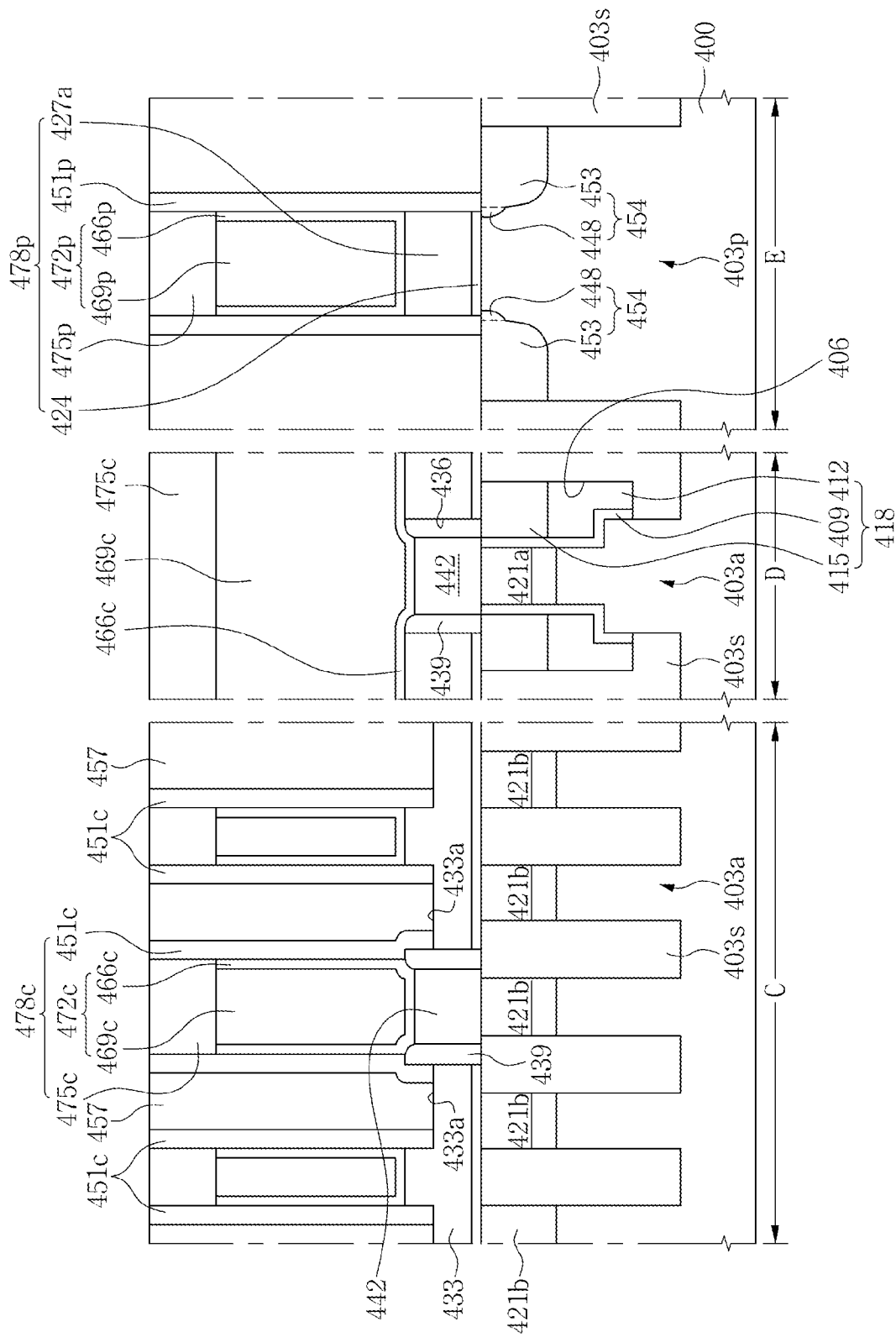

Referring to FIGS. 25 and 27J, a capping insulating layer may be formed on the substrate having the cell and peripheral upper conductive patterns 472c and 4'72p. The capping insulating layer may be planarized until the interlayer insulating patterns 457 are exposed, to form cell capping patterns 475c on the cell upper conductive patterns 472c, and a peripheral gate capping pattern 475p on the peripheral upper conductive pattern 472p.

The cell capping patterns 475c and the peripheral gate capping pattern 475p may be formed of a material having etch selectivity with respect to the interlayer insulating patterns 457. For example, the interlayer insulating patterns 457 may be formed of silicon oxide or a low-k dielectric material, and the cell capping patterns 475c and peripheral gate capping pattern 475p may be formed of silicon nitride.

In the cell array region CR, the cell upper conductive patterns 472c, the cell capping patterns 475c, and the cell spacers 451c may constitute bit line structures 478c. The cell upper conductive patterns 472c may be bit lines of a memory device.

In the peripheral circuit region PR, the peripheral lower gate electrode 427a, the peripheral upper conductive pattern 472p, the peripheral gate capping pattern 475p, and the peripheral spacer 451p may constitute a peripheral gate structure 478p.

Figure 27K:
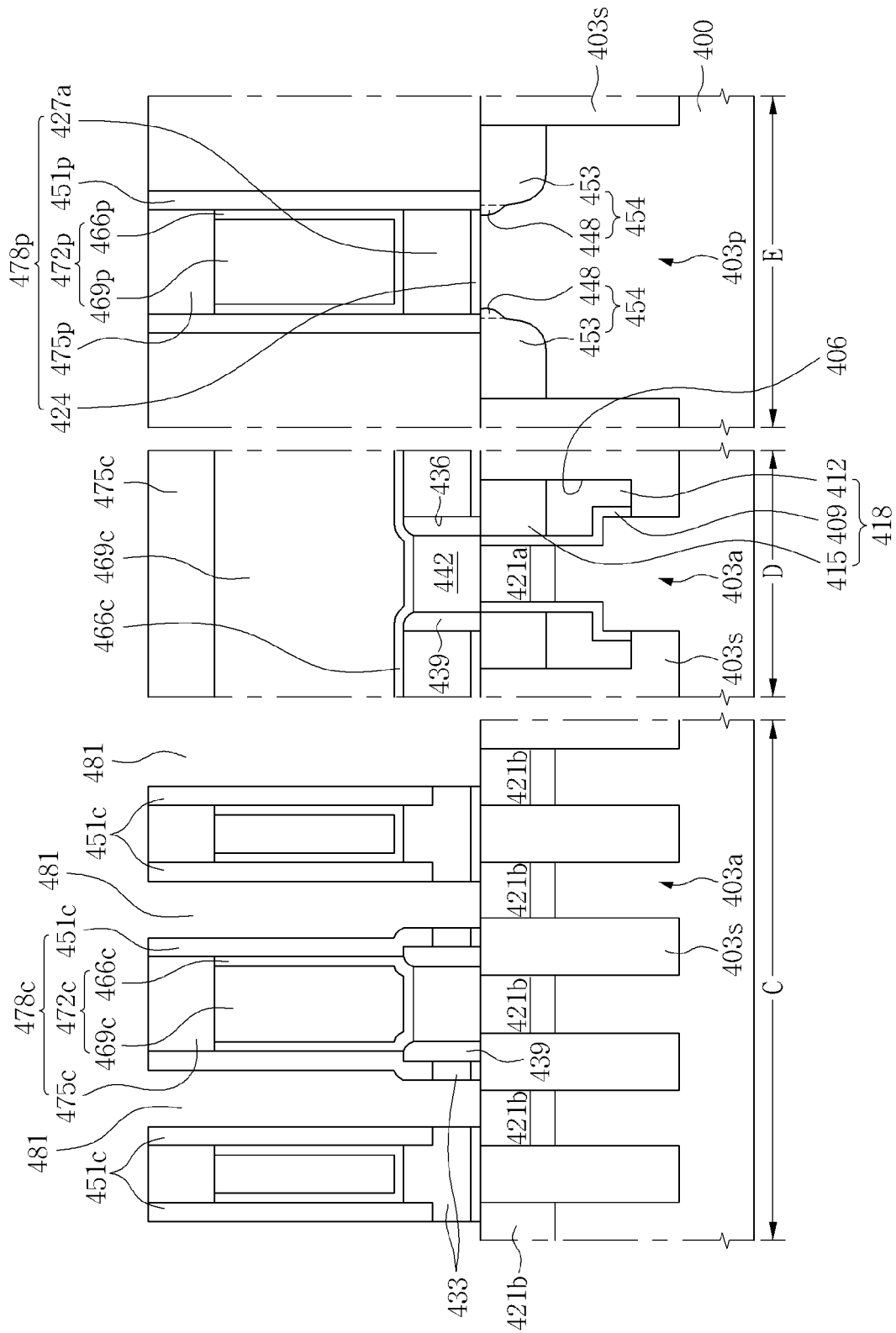

Referring to FIGS. 25 and 27K, by patterning the interlayer insulating patterns 457, cell contact holes 481c which sequentially pass through the interlayer insulating patterns 457, the second lower insulating layer 433, and the first lower insulating layer 430, and expose the second source/drain areas 421b, may be formed in the cell array region CR, and peripheral contact holes 481p which pass through the interlayer insulating patterns 457 and expose the peripheral source/drain areas 454, may be formed in the peripheral circuit region PR.

Referring again to FIG. 26, cell contact plugs 484c filling the cell contact holes 481c may be formed, and peripheral contact plugs 484p filling the peripheral contact plugs 481p may be formed.

According to aspects of the inventive concept as described in detail above, a semiconductor device including interconnection structures having a high aspect ratio and low interconnection resistance, and a method of fabricating the semiconductor device, are provided. The interconnection structures may include sequentially stacked lower and upper conductive patterns. The lower and upper conductive patterns may be formed by different semiconductor processes. The lower conductive pattern may be formed by a photolithography and etch process, and the upper conductive pattern may be formed by a damascene process. The upper conductive pattern may be formed by a damascene process in which a mask pattern for forming the lower conductive pattern is used without any additional photolithography process. The lower conductive pattern may be formed by selecting a material that is easy to etch, and the upper conductive pattern may be formed by selecting a material having low resistivity. Accordingly, interconnection structures having a high aspect ratio and low interconnection resistance may be formed.

According to other aspects of the inventive concept as also described in detail above, interconnection structures having a lower conductive pattern and an upper conductive pattern which is formed on the lower conductive pattern and has a greater width than the lower conductive pattern, a semiconductor device having the interconnection structures, and methods of fabricating the semiconductor device, are provided. The lower conductive pattern may be formed by a photolithography and etch process, and the upper conductive pattern may be formed by a damascene process in which a mask pattern for forming the lower conductive pattern is used without any additional photolithography process. The upper conductive pattern may be formed to have a greater width than the lower conductive pattern. Because the entire volume of the interconnection structures increases by forming the upper conductive pattern having a large width, resistance of the interconnection structures may decrease.

According to still other aspects of the inventive concept as described in detail above, a semiconductor device including interlayer insulating patterns having air gaps located between the interconnection structures and a method of fabricating the semiconductor device are provided. The interlayer insulating patterns having the air gaps may reduce parasitic capacitance between the interconnection structures. Accordingly, signal transmission speed of the interconnection structures may be improved due to the interlayer insulating patterns having the air gaps.

According to still other aspects of the inventive concept as described in detail above, a memory device including an upper electrode and a self-aligned bit line on the upper electrode, and a method of fabricating the memory device are provided. The upper electrode and the bit line may be formed by the lower conductive pattern and the upper conductive pattern of the interconnection structures, respectively.

Figure 28:
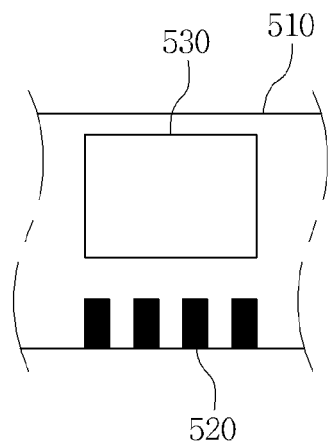
FIG. 28 is a schematic diagram showing a memory card to which the inventive concept may be applied.

FIG. 28 shows a memory card that may be embodied with a semiconductor device in accordance with the inventive concept.

Referring to FIG. 28, the memory card 500 may include a card substrate 510, one or more semiconductor devices 530 disposed on the card substrate 510, and contact terminals 520 which are formed side by side at an edge of the card substrate 510 and electrically connected to the semiconductor devices 530. Here, the semiconductor device 530 may be a memory chip or semiconductor package including a semiconductor device in accordance with one of the embodiments described above. The memory card 500 may be a memory card to be used for an electronic apparatus such as a digital camera, a computer, a portable storage device, or the like.

The card substrate 510 may be a printed circuit board (PCB). Both sides of the card substrate 510 may be used. In other words, the semiconductor device 530 may be disposed on both front and back surfaces of the card substrate 510. The semiconductor device 530 may be electrically and mechanically connected to the card substrate 510 on front and/or back surfaces of the card substrate 510.

The contact terminals 520 may be formed of a metal and have oxidation resistance. The contact terminals 520 may be variously set depending on the type and standard of the memory card 500. Therefore, the number of contact terminals 520 illustrated in FIG. 28 is not limiting.

Figure 29:
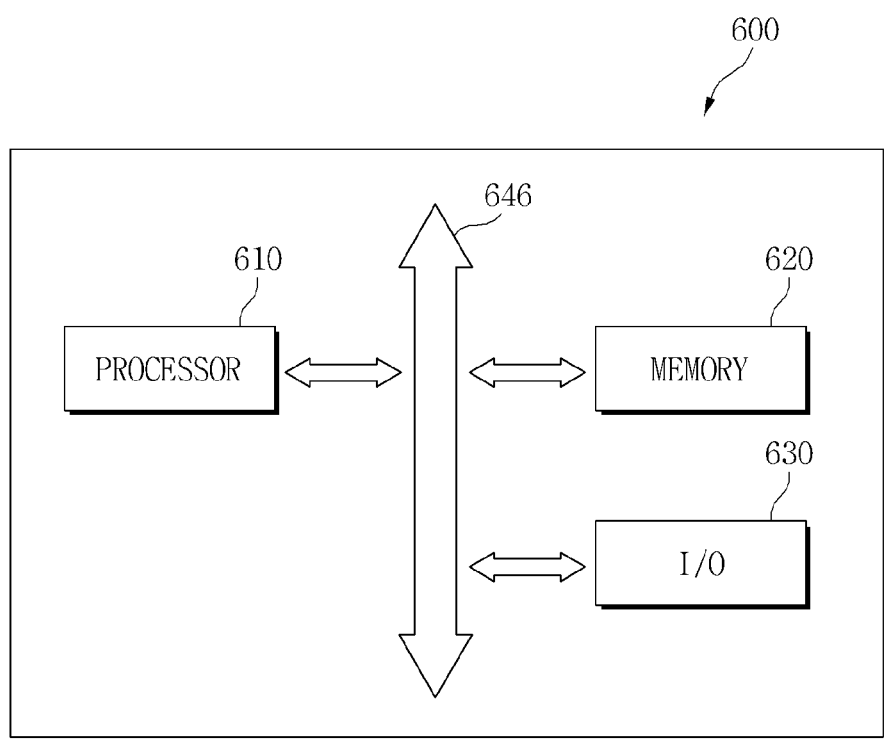
FIG. 29 is a block diagram showing an electronic system to which the inventive concept may be applied.

FIG. 29 is a block diagram of an electronic system that may be embodied with a semiconductor device in accordance with the inventive concept.

Referring to FIG. 29, an electronic apparatus 600 may be provided. The electronic apparatus 600 may include a processor 610, a memory 620, and an input/output (I/O) device 630. The processor 610, the memory 620, and the I/O device 630 may be connected to each other through a bus 646.

The memory 620 may receive a control signal such as RAS*, WE*, and CAS* from the processor 610. The memory 620 may store a code and data for operating the processor 610. The memory 620 may be used to store data accessed through the bus 646.

One of the memory 620 and processor 610 may include one of the embodiments of a semiconductor device in accordance with the inventive concept. For a specific implementation, additional circuit and control signals may be provided.

The electronic apparatus 600 may constitute any of various electronic control apparatuses which require the memory 620. For example, the electronic apparatus 600 may be used in a computer system, a wireless communication apparatus such as a PDA, laptop computer, web tablet, wireless phone, mobile phone, a digital music player, an MP3 player, a navigation system, a solid state disk (SSD), a household appliance, or any device for that matter capable of transmitting information in a wireless environment.

A more specific example of the electronic apparatus 600 will be described with reference to FIGS. 30 and 31.

Figure 30:
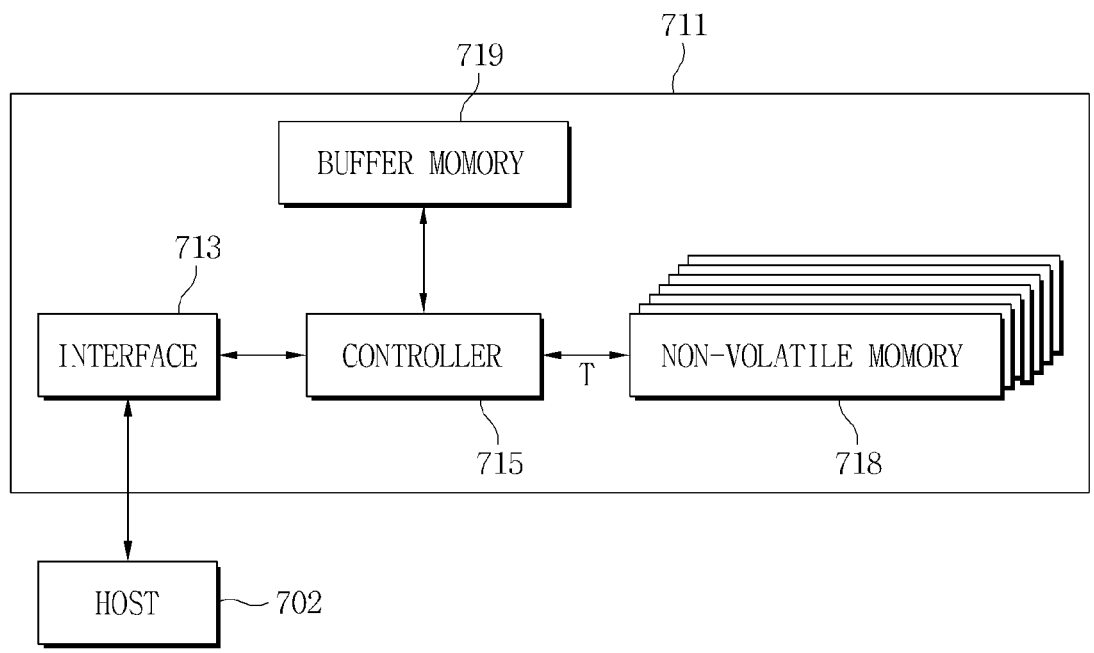
FIG. 30 is a block diagram showing a data storage apparatus to which the inventive concept may be applied.

FIG. 30 is a block diagram showing a data storage apparatus having an embodiment of a semiconductor device in accordance with the inventive concept.

Referring to FIG. 30, the electronic apparatus may be a data storage apparatus such as an SSD 711. The SSD 711 may include an interface 713, a controller 715, a non-volatile memory 718, and a buffer memory 719. One of the controller 715, the non-volatile memory 718, and the buffer memory 719 may include one of the embodiments of a semiconductor device in accordance with the inventive concept.

The SSD 711 is an apparatus which stores information using a semiconductor device. The SSD 711 is faster, has a lower mechanical delay or failure rate, and generates less heat and noise than a hard disk drive (HDD). Further, the SSD 711 may be smaller and lighter than the HDD. The SSD 711 may be used in a laptop computer, a netbook, a desktop PC, an MP3 player, or a portable storage device.

The controller 715 may be formed close to the interface 713 and electrically connected thereto. The controller 715 may be a microprocessor including a memory controller and a buffer controller. The non-volatile memory 718 may be formed close to the controller 715 and electrically connected thereto via a connection terminal T. Data storage capacity of the SSD 711 may correspond to a capacity of the non-volatile memory 718. The buffer memory 719 may be formed close to the controller 715 and electrically connected thereto.

The interface 713 may be connected to a host 2702, and may send and receive electrical signals such as data. For example, the interface 713 may be a device using a standard such as a Serial Advanced Technology Attachment (SATA), an Integrated Drive Electronics (IDE), a Small Computer System Interface (SCSI), and/or a combination thereof. The non-volatile memory 718 may be connected to the interface 713 via the controller 715.

The non-volatile memory 718 may function to store data received through the interface 713. Even when power supplied to the SSD 711 is interrupted, the data stored in the non-volatile memory 718 may be retained. The buffer memory 719 may include a volatile memory. The volatile memory may be a Dynamic Random Access Memory (DRAM) and/or a Static Random Access Memory (SRAM). The buffer memory 719 has a faster operating speed than the non-volatile memory 718

Data processing speed of the interface 713 may be faster than the operating speed of the non-volatile memory 718. Here, the buffer memory 719 may function to temporarily store data. The data received through the interface 713 may be temporarily stored in the buffer memory 719 via the controller 715, and then permanently stored in the non-volatile memory 718 according to the data write speed of the non-volatile memory 718. Furthermore, frequently-used data stored in the non-volatile memory 718 may be pre-read and temporarily stored in the buffer memory 719. That is, the buffer memory 719 may function to increase effective operating speed of the SSD 711, and reduce error rate.

Figure 31:
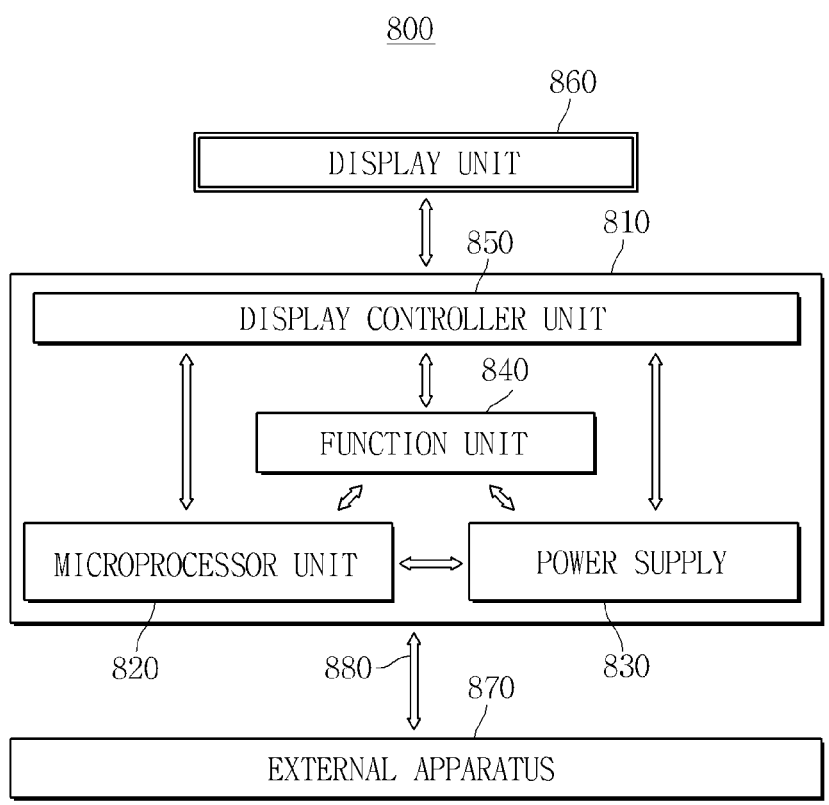
FIG. 31 is a block diagram showing an electronic apparatus to which the inventive concept may be applied.

FIG. 31 is a system block diagram showing an electronic apparatus that may be embodied with a semiconductor device in accordance with the inventive concept.

Referring to FIG. 31, a semiconductor device in accordance with the inventive concept may be employed by an electronic system 800. The electronic system 800 may include a body 810, a microprocessor unit 820, a power supply 830, a function unit 840, and a display controller unit 850. The body 810 may be a mother board formed of a PCB. The microprocessor unit 820, the power supply 830, the function unit 840, and the display controller unit 850 may be installed in the body 810. A display unit 860 may be installed inside or outside of the body 810. For example, the display unit 860 may be disposed on a surface of the body 810 to display an image processed by the display controller unit 850.

The power supply 830 may function to receive a constant voltage from a battery, or other power source, divide the voltage into required levels, and supply those voltages to the microprocessor unit 820, the function unit 840, and the display controller unit 850. The microprocessor unit 820 may receive the voltage from the power supply 830 to control the function unit 840 and the display unit 860. The function unit 840 may perform functions depending on the type of electronic system 800 in which it is employed. For example, if the electronic system 800 is a mobile phone, the function unit 840 may have several components which can perform functions of a mobile phone such as dialing, video output to the display unit 860 through communication with an external apparatus 870, and sound output to a speaker, and if a camera is installed, the function unit 840 may function as a camera image processor.

When the electronic system 800 is connected to a memory card or the like. In order to expand its capacity, the function unit 840 may be a memory card controller. The function unit 840 may exchange signals with the external apparatus 870 through a wired or wireless communication unit 880. Furthermore, when the electronic system 800 needs a universal serial bus (USB) in order to expand functionality, the function unit 840 may function as an interface controller. A semiconductor device in accordance with the inventive concept may be employed by at least one of the microprocessor unit 820 and the function unit 840.

Finally, embodiments of the inventive concept and examples and applications thereof have been described above in detail. The inventive concept may, however, be embodied and employed in many different forms and should not be construed as being limited to the embodiments and applications described above. Rather, these embodiments and applications were described so that this disclosure is thorough and complete, and fully conveys the inventive concept to those skilled in the art. Thus, the true spirit and scope of the inventive concept is not limited by the embodiment and examples and possible applications described above but by the following claims.

What is claimed is:

1. A method of fabricating a semiconductor device, comprising:
    forming switching devices on a substrate;
    forming a lower structure on the substrate having the switching devices;
    forming a lower conductive layer on the lower structure;
    forming sacrificial mask patterns on the lower conductive layer;
    forming lower conductive patterns by etching the lower conductive layer using the sacrificial mask patterns as an etch mask;
    forming an interlayer insulating layer on the substrate having the lower conductive patterns;
    forming interlayer insulating patterns by planarizing the interlayer insulating layer until the sacrificial mask patterns are exposed;
    forming openings exposing the lower conductive patterns by removing the exposed sacrificial mask patterns; and
    forming upper conductive patterns self-aligned with the lower conductive patterns in the openings.

2. The method according to claim 1, wherein the forming of the interlayer insulating layer comprises forming a layer of insulating material having air spaces therein each located between adjacent ones of the sacrificial mask patterns, and spaced apart from the sacrificial mask patterns.

3. The method according to claim 1, wherein the upper conductive patterns are formed of conductive material having lower resistivity than the lower conductive patterns and to a greater thickness than the lower conductive patterns.

4. The method according to claim 1, wherein the forming of the lower structure comprises forming electrodes, information storage patterns on the electrodes, and an insulating molding pattern surrounding sides of the electrodes and information storage patterns.

5. The method according to claim 4, further comprising forming recesses in an upper surface of the molding pattern by etching the insulating molding pattern using the sacrificial mask patterns as an etch mask, wherein part of the interlayer insulating layer is formed in the recesses.

6. A method of fabricating a semiconductor device, comprising:
   forming a lower insulating layer on a substrate;
   forming a lower conductive structure form on the lower insulating layer;
   forming, on the lower conductive structure, sacrificial mask patterns having a thickness greater than the thickness of the lower conductive structure;
   forming lower conductive patterns by etching the lower conductive structure using the sacrificial mask patterns as an etch mask;
   forming an interlayer insulating layer on the substrate having the lower conductive patterns;
   forming interlayer insulating patterns by planarizing the interlayer insulating layer to such an extent that upper parts of the sacrificial mask patterns are exposed;
   forming openings by removing the exposed sacrificial mask patterns; and
   forming upper conductive patterns in the openings such that the upper conductive patterns are formed as stacked on the lower conductive patterns, respectively, each of the lower conductive patterns and the upper conductive pattern stacked thereon constituting a respective interconnection structure, and
   wherein the interconnection structures are formed to have a thickness greater than the distance between adjacent ones of the interconnection structures.

7. The method according to claim 6, wherein the upper conductive patterns are formed to a thickness greater than the distance between adjacent ones of the interconnection structures.

8. The method according to claim 6, wherein the forming of the interlayer insulating layer comprises forming a layer of insulating material having air spaces therein each located between adjacent ones of the sacrificial mask patterns, and spaced apart from the sacrificial mask patterns.

9. The method according to claim 6, wherein the formation of the upper conductive patterns comprises:
   forming a first upper conductive layer covering surfaces delimiting bottoms and sides of the openings;
   forming, on the first upper conductive layer, a second upper conductive layer which fills the remainder of the openings and has lower resistivity than the lower conductive patterns; and
   planarizing the second upper conductive layer and the first upper conductive layer until upper portions of the interlayer insulating patterns are exposed.

10. The method according to claim 6, further comprising:
    forming spacers on surfaces delimiting the sides of the openings.

11. The method according to claim 10, wherein each of the spacers is formed to have an upper portion, and a lower portion whose width is greater than that of the upper portion.

12. The method according to claim 10, wherein each of the sacrificial mask patterns is formed to have an upper portion, and a lower portion whose width is greater than that of the upper portion.

13. The method according to claim 6, further comprising:
    forming enlarged openings exposing upper sides of the lower conductive patterns by isotropically etching the interlayer insulating patterns after the sacrificial mask patterns have been removed.

14. The method according to claim 6, further comprising:
    forming insulating spacers on sides of the sacrificial mask patterns and lower conductive patterns, after forming the lower conductive patterns.

15. The method according to claim 14, further comprising:
    forming capping patterns on the upper conductive patterns,
    wherein the upper conductive patterns are formed to fill parts of the openings, respectively, and the capping patterns are formed in what remains of the openings.

16. A method of fabricating a semiconductor device, comprising:
    forming a lower conductive structure of at least one layer of material on a substrate;
    forming a sacrificial layer on the lower conductive structure, and patterning the sacrificial layer to form lines of sacrificial mask patterns on the lower conductive structure;
    etching the at least one layer of material using the sacrificial mask patterns as an etch mask to form lower conductive patterns each having the shape of a line;
    forming an interlayer insulating layer on the substrate having the lower conductive patterns;
    planarizing the interlayer insulating layer to such an extent that upper parts of the sacrificial mask patterns are exposed and thereby forming interlayer insulating patterns each having the shape of a line from the interlayer insulating layer; and
    forming upper conductive patterns as stacked on the lower conductive patterns, respectively, using a damascene process that comprises forming openings having the shapes of lines by removing the exposed sacrificial mask patterns and forming conductive material in the openings, such that each of the lower conductive patterns and the upper conductive pattern stacked thereon constitute a respective interconnection structure having the shape of a line, and
    wherein the upper conductive patterns are formed to have a resistivity lower than that of the lower conductive patterns.

17. The method according to claim 16, wherein the interconnection structures are formed to have a thickness greater than the distance between adjacent ones of the interconnection structures.

18. The method according to claim 16, wherein the forming of the upper conductive patterns comprises forming a layer of copper or aluminum in the openings.

19. The method according to claim 16, wherein the forming of the interlayer insulating layer comprises forming a layer of insulating material having air spaces therein each located between adjacent ones of the sacrificial mask patterns, and spaced apart from the sacrificial mask patterns.

20. The method according to claim 16, wherein the upper conductive patterns are formed to each have a width greater than that of the lower conductive pattern on which it is formed.

* * * * *